(12) United States Patent
Sakayori

(10) Patent No.: US 7,410,746 B2
(45) Date of Patent: Aug. 12, 2008

(54) PHOTORADICAL POLYMERIZATION INITIATOR, RADICAL GENERATOR, PHOTOSENSITIVE COMPOUND AND PHOTOSENSITIVE RESIN COMPOSITION CONTAINING THESE MATERIALS AND PRODUCT OR ITS ACCESSORY PORTIONS USING THE COMPOSITION

(75) Inventor: Katsuya Sakayori, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 2 days.

(21) Appl. No.: 10/396,206

(22) Filed: Mar. 25, 2003

(65) Prior Publication Data
US 2004/0023159 A1 Feb. 5, 2004

(30) Foreign Application Priority Data

| Mar. 29, 2002 | (JP) | ............................. 2002-097956 |
| Mar. 29, 2002 | (JP) | ............................. 2002-098006 |
| Sep. 6, 2002 | (JP) | ............................. 2002-262015 |
| Sep. 30, 2002 | (JP) | ............................. 2002-288065 |
| Sep. 30, 2002 | (JP) | ............................. 2002-288068 |

(51) Int. Cl.
G03F 7/004 (2006.01)
G03F 7/30 (2006.01)
C07D 221/14 (2006.01)

(52) U.S. Cl. ............. 430/270.1; 430/281.1; 430/288.1; 430/325; 430/330; 546/98

(58) Field of Classification Search ................... 546/98; 430/281.1, 288.1, 270.1, 325, 330
See application file for complete search history.

(56) References Cited

U.S. PATENT DOCUMENTS 4,258,121 A * 3/1981 Kojima ..................... 430/281.1
4,425,424 A * 1/1984 Altland et al. ............. 430/270.1
4,508,805 A * 4/1985 Kawamura et al. ............. 430/72
4,533,613 A * 8/1985 Kawamura et al. ............. 430/78
4,557,988 A    12/1985 Horie et al.
4,629,672 A * 12/1986 Makino et al. ................. 430/76
4,919,848 A    4/1990 Harnisch
5,002,853 A    3/1991 Aoai et al.

FOREIGN PATENT DOCUMENTS

| JP | 58192042 | 11/1983 |
| JP | 58194035 | 11/1983 |
| JP | 59042352 | 9/1984 |
| JP | 62089665 | 4/1987 |

* cited by examiner

*Primary Examiner*—John S. Chu
(74) *Attorney, Agent, or Firm*—Ladas & Parry LLP

(57) ABSTRACT

The present invention provides a radical generator having a naphthalimide structure or a crosslinking agent and a photosensitive compound having a function as a radical generator. A photoradical polymerization initiator of the present invention comprises a compound (a) having only one naphthalimide structure-containing group in one molecule. The radial generator of the present invention comprises a compound (c) having two or more naphthalimide structure-containing groups in one molecule and also functions as a crosslinking agent. A first photosensitive compound of the present invention comprises a compound (d) having a naphthalimide structure-containing group and an ethylenic unsaturated group in one molecule. A second photosensitive compound of the present invention comprises a polymer (e) of one or more radical polymerizable compounds containing the compound (d). A photosensitive resin composition according to the present invention contains, as an essential component, the above compound (a), compound (c), compound (d) or polymer (e).

13 Claims, 6 Drawing Sheets

PHOTORADICAL POLYMERIZATION INITIATOR, RADICAL GENERATOR, PHOTOSENSITIVE COMPOUND AND PHOTOSENSITIVE RESIN COMPOSITION CONTAINING THESE MATERIALS AND PRODUCT OR ITS ACCESSORY PORTIONS USING THE COMPOSITION

BACKGROUND OF THE INVENTION

1. Field of the Invention

The present invention relates to a photoradical polymerization initiator, a radical generator, a photosensitive compound and a photosensitive resin composition containing any of these materials and a product or accessory portions of the product produced using the photosensitive resin composition.

The invention relates, particularly, to a photoradical polymerization initiator, a radical generator and a phostosensitive compound which have high heat resistance, do not remain as an independent component in a cured product and have a radical-generating part which can be synthesized in a mild condition, also relates to a photosensitive resin composition containing any of these materials and also to any product among color filters, electronic parts, layer insulation films, wire coating layers, optical materials, optical circuits, optical circuit parts, antireflecting films, holograms and building materials or to an accessory portion of these products, at least a part of which is formed of a cured product of the photosensitive resin composition.

2. Description of the Related Art

Photosensitive resins which are cured or changed in solubility by irradiation of radial rays such as ultraviolet rays are generally classified into two categories including a type (positive type) in which an exposed portion is highly soluble and a type (negative type) in which an unexposed portion is highly soluble. In the case of the negative type, the photosensitive resin remains on a substrate and often becomes a part of a product as a functional layer because the photosensitive resin itself is cured and becomes insoluble by exposure. Although the negative type photosensitive resin has been used for, for example, paints, printing inks, adhesives and printing master plates or the like, it has been recently used in wide applications ranging to products such as solder resists for wire protection in print boards, layer insulation films and resists for forming pixels in color filters.

As one of the negative type photosensitive resins which are frequently used in general, there is resin compositions containing a compound having one or more ethylenic unsaturated bonds, a photoradical initiator generating a radical by irradiation with light and, as required, a high molecular compound providing developing ability and softness to a coating layer, an inorganic filler, pigments or the like. When radial rays are applied to this composition, the compounds having an ethylenic unsaturated bond are bonded to each other by a radical reaction and cured as a macromolecule. In this curing reaction, a three-dimensional network structure is developed by across linking reaction, improving the hardness, strength, adhesiveness, resistance to solvent and heat resistance of the resulting cured product.

The photoradical polymerization initiators are roughly classified into a self cleavage type and a hydrogen-drawing type. In the case of the former type, it absorbs light (electromagnetic wave or radial rays) having a specific wavelength, the bond at a part corresponding to that wavelength is cut, radicals are generated in each part cut at this time and a radical reaction starts from these parts. In the case of the latter type, when it absorbs an electromagnetic wave having a specific wave length and put into an excited state, it draws hydrogen from surrounding hydrogen donors. At this time, radicals are generated from each of the drawing one and the drawn one.

Generally, the self-cleavage type has good sensitivity and high radical-generating efficiency, but is unstable to heat, giving rise to the problems concerning the heat resistance, stability and preserving stability of a photosensitive resin composition containing this self-cleavage type. In the case of the hydrogen-drawing type, on the other hand, the hydrogen donor must exist in the vicinity of the excited initiator and the radical-generating efficiency is decided by the magnitude of an energy barrier when drawing hydrogen. Therefore, this type has relatively low sensitivity, but a resin composition containing this type exhibits high stability and preserving stability because no radical is generated unless it is put in an excited state and draws hydrogen.

In the solder resist used for surface coating in a print board, an organic pigment and a filler are compounded to provide thermal resistance and flame resistance. Also, in a resist used for forming pixels of a color filter, a pigment for color indication is compounded. Because these pigments are components absorbing light, a self-cleavage type photoradical initiator is principally used to raise the sensitivity of a photosensitive resin and also the photoradical initiator is compounded in a large amount allowing for a portion which will not fully used in a radical reaction. Here, the portion which is not fully used in a radical reaction includes an unreacted initiator which has not been cleft even by irradiation with light and an initiator whose activity is lost by prohibiting its access to material to be caused reaction because of a reaction in a solid phase even if it is radicalized by cleavage.

A large amount of residues originated from an initiator exists in the cured product after exposure. Among these residues, a photoradical generator which has not been cleft still keeps reactivity even after exposure and therefore denatures a product. Also, a photoradical initiator which has not been cleft and a decomposed material which has been cleft but not consumed in a radical reaction and deactivated is not bonded to a crosslinking structure of a matrix and exists as an independent component in a product, which impairs the quality of a layer. For this, if a decomposed material originated from an initiator is left as it is, there is the problem that it causes deteriorated light resistance, coloring and fading, peeling of a coating layer and the occurrence of cracks or the like, which is a cause of a reduction in the reliability of a final product such as a layer insulation film and solder resist in electronic parts and a resist used for forming pixels in a color filter.

The self-cleavage type photoradical initiator has a strong sublimation tendency and is decomposed by heat. It can be therefore removed from a product by post-baking after exposure and developing at a temperature higher than hundred and several tense degree. However, a large amount of a sublimated material originated from an initiator adheres to the inside of a heater and falls on a product obtained by curing during post-baking, causing product defects, posing a serious problem. Also, a decomposed material of an initiator is involved in the atmosphere around a heater, posing a problem from the viewpoint of operational safety.

It is possible to remove many more residues originated from a radical initiator by changing a post-baking condition to a condition of a higher-temperature and longer-operation time. However, it is difficult to remove the residues completely because of volatilization from a solid. If the condition is made more strict to remove many more impurities originated from a radical initiator, this condition rather causes product defects.

In the meantime, the same curing system using radial rays is applied to a resist for processing electronic parts to be used as a peelable layer and a dry film resist. The processing resist is finally peeled off and is not therefore left in a product. However, the processing step such as formation of copper wirings or the like involves with such a problem that a residue originated from an initiator is eluted in a chemical solution such as ferric chloride and cupric chloride used for the processing from the resist film, so that the life of the chemical solution is shortened.

Moreover, when a photosensitive resin is used as a paint for a protective layer protecting the surface of wall paper and a wall used for buildings, there is a demand for decreasing solvent components and odorous components emitting from whole building material with the view of dealing with sick house syndrome. There is the problem that the use of a highly volatile initiator causes the occurrence of odors even after curing.

From these problems, it has been desired to develop a radical generator and a resin composition which are not volatilized during post-baking and after photo-curing and are substantially freed of components which are originated from a radical generator and remain independently in a coating layer.

As measures to solve these problems, ESACURE KIP 150 (trademark) (manufactured by Nihon Siber Hegner CO., LTD.) and or like introduces a photoradical-generating part into the side chain of a polymer skeleton. This measures ensures that a photoradical generator has plural radical-generating parts in one molecule. Therefore, if any one part in the molecule is radicalized and bonded to a matrix of the coating layer, an unreacted radical-generating part in the same molecule is bonded to the matrix through the polymer skeleton. For this, the photoradical generator is not volatilized during post-baking and does not move in the coating layer, and deterioration of the reliability of a final product is a little.

In this case, however, the photoradical-generating part introduced into the side chain is a self-cleavage type and is easily decomposed by heating to produce a radical, still posing the same problems concerning, for example, the thermal resistance, stability and preserving ability of a photosensitive resin composition containing this product. Although, among the radical-generating parts, the part left on the polymer skeleton after cleavage is bonded to the matrix structure, a part of the decomposed material cleft from the polymer skeleton by a photoradical reaction and post-baking is not consumed by a radical reaction, deactivated and remains independently in the matrix. Therefore, if the decomposed material is left as it is, it adversely affects the qualities of a coating layer, and it is also difficult to remove the decomposed material perfectly by sublimation even if post-baking is carried out.

There is a proposal as to the use of (metha)acrylates having a maleimide group in each publication of International Patent Application Laid-Open WO98/58912 and Japanese patent application Laid-Open No. 2002-3559. These (metha)acrylates as an electron acceptor react with a vinyl ether to generate a radical, because maleimide absorbs electromagnetic waves. Also, these (metha)acrylates draw hydrogen, whereby a radical can also be generated (RADICAL POLYMERIZATION HANDBOOK, NTS Co., Ltd., 1999, page 312). However, maleimide has an ethylenic double bond. If a monomer having both a maleimide group and a (metha)acryl group is radical-polymerized, a crosslinking reaction proceeds and the resulting polymer is gelled. For this, according to each publication of International Patent Application Laid-Open WO98/58912 and Japanese patent application Laid-Open No. 2002-3559, a substituent such as a cyclohexyl group is introduced into a maleimide group to lower the reactivity of the maleimide group by steric hindrance, whereby the above problem is overcome. However, since the reactivity of the maleimide is lowered on the contrary, there is the problem that the efficiency of initiation of a radical reaction is dropped. Also, because the reaction for forming a maleimide group by reacting an acid anhydride with an amine is carried out by a dehydration reaction, a temperature as high as 100° C. or more is required to react highly efficiently without using a catalyst. If it is intended to introduce an ethylenic unsaturated bond directly when forming the maleimide group, there is a synthesis problem that polymerization of the ethylenic unsaturated bond is caused. Also, although a dehydrating catalyst such as acetic acid anhydride may be used to carry out a dehydration reaction. However, this causes a cost increase and also the subsequent refining process is complicated, giving rise to a synthesis problem in any case.

Also, S. Jonsson, et al. propose a photo-reactive crosslinking agent consisting a compound having maleimide groups at both terminals in Proc. Rad Tech 96 (North America Nashville, page 377, 1996). Although this agent reacts rapidly with a vinyl ether, there is the aforementioned synthesis problem because this agent has a maleimide group.

Furthermore, the UV absorption spectrum of a compound having a maleimide part is described in "Industrial Material", the July issue, 2002, P. 107 to P. 111. According to this spectrum, an unsubstituted maleimide compound has no absorption in wavelengths of 350 nm or more. Therefore, this maleimide compound has no absorption in wavelengths of 365 nm, 405 nm and 436 nm which are major emitting wavelengths of a high pressure mercury lamp as a light source commonly used and therefore, the maleimide group is not expected to be changed at all by these lights.

Because the maleimide group is not sensitive to the above wavelengths, use of maleimide for photocuring is involved with the problem that it is necessary to carry out exposure by using a light source having light emission at a wavelength of 350 nm or less. Although a high pressure mercury lamp also emits light having a wavelength less than 365 nm, these wavelengths fall in the usual range cut by a filter. Even if not cut by a filter, light emission intensity is weak, giving rise to the problem that exposure time is made very longer than that required by a radical generator having absorption in a wavelength of 365 nm in the case of using the same lamp.

In the meantime, Kubo et al. report that when N-methyl-1,8-naphthalimide and an aromatic compound such as p-xylene are irradiated with ultraviolet rays in the presence of methanol in an acetonitrile solution, a reaction product of naphthalimide and the aromatic compound is obtained in a high yield (Chemistry Letters, 1999, page 175). There is the description in this report that as its reaction mechanism, naphthalimide which is singlet-excited by ultraviolet rays forms an exciplex with the aromatic compound and then the exciplex generates a radical by drawing hydrogen to form a bond between the naphthalimide and the aromatic compound. However, in this document, there is only a description of a reaction in a solution between naphtalimide and low molecular aromatic compounds in a partial scope.

Also, compounds having two naphthalimide parts are disclosed for phamaceutical use in the publication of WO9402466, for use as electron transfer materials of an electrophotographic photosensitive element in the Japanese patent application Laid-open No. 7-160020 and No. 2001-117247. However, in the former use, these compounds are used as pharmaceuticals. In the latter use, although the invention is directed to a photosensitive material, the naphthalimide compound functions strictly as an electron transfer material, a compound generating a charge by irradiation with light is compounded separately and there is nothing described concerning the function of the naphthalimide compound as a photoradical initiator and concerning a crosslinking reaction.

Also, compounds having a naphthalimide part and an ethylenic unsaturated bond are disclosed in Japanese patent application Laid-open Nos. 62-205108 and 63-218970. However, these compounds are utilized for electrophotographic toners and these documents do not refer to the function of a naphthalimide group as a photoradical generator, the thermal resistance of the naphthalimide and easiness of the synthesis of the naphthalimide.

SUMMARY OF THE INVENTION

The present invention has been attained as a result of earnest studies made by the inventors of the present invention concerning the radical reactivity of a naphthalimide structure in view of the above situation.

A first object of the present invention is to provide a photoradical polymerization initiator and a radical generator which produce no decomposed product during or after a radical curing reaction such as radical polymerization, do not remain independently in a coating layer, exist in a chemically stable state in a cured coating layer, have high thermal resistance, stability and preserving ability, can be synthesized in a relatively mild condition and are highly productive.

A second object of the present invention is to provide a photosensitive compound which combines a function as a radical generator and a function as a curable reactive compound, has high stability and preserving ability, does not leave a radical generator independently in a cured product after curing, has high thermal resistance, can be synthesized in a relatively mild condition and is highly productive.

A third object of the present invention is to provide a photosensitive compound which combines a function as a radical generator and a function as a crosslinking agent and further preferably a function as a binder component, has high stability and preserving ability, does not leave a radical generator independently in a cured product after curing, has high thermal resistance, can be synthesized in a relatively mild condition and is highly productive.

A fourth object of the present invention is to provide a photosensitive resin composition which uses the aforementioned photoradical polymerization initiator, radical generator or photosensitive compound according to the present invention, do not leave a radical generator or its decomposition product independently in a coating layer after curing, has high thermal resistance, has high sensitivity to a practical wavelength, is free from the generation of any odor during exposing, possesses high stability and preserving ability and is advantageous in synthesis.

A fifth object of the present invention is to provide a product at least a part of which is formed of a cured product of the photosensitive resin composition according to the present invention and which has high thermal resistance and stability.

The present invention is to solve at least one of these objects.

(1) First Aspect of the Present Invention

According to a first aspect of the present invention capable of solving the above problem, there is provided a photoradical polymerization initiator containing a naphthalimide structure, the photoradical polymerization initiator consisting a compound (a) having only one naphthalimide structure-containing group represented by the following formula (1) in one molecule:

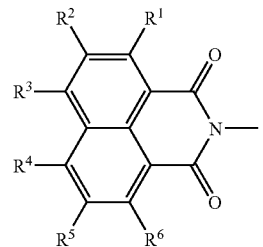

Formula (1)

wherein $R^1$, $R^2$, $R^3$, $R^4$, $R^5$ and $R^6$ respectively represent a hydrogen atom or a substituent and may be bonded to each other to form a cyclic structure.

As to a radical generating mechanism by a naphthalimide structure-containing group, it is estimated that the naphthalimide structure absorbs light such as electromagnetic waves and radial rays to thereby generate a radical.

The photoradical polymerization initiator according to the present invention can cause a radical reaction when excited by applying light because the naphthalimide structure-containing group functions as a hydrogen-drawing type radical-generating part. The naphthalimide structure-containing group is a hydrogen-drawing type more stable than a self-cleavage type and also has a naphthalene skeleton having high thermal resistance. Therefore, a photoradical polymerization initiator having high stability and preserving stability can be obtained.

Further, many π-bonds are connected, so that the absorption wavelength is longer than that of maleimide. Therefore, it tends to have an absorption in a wavelength of 365 nm which is the major emitting wavelength of a high pressure mercury lamp and therefore has good sensitivity.

Also, the compound (a) can react not only with an ethylenic unsaturated bond but also with various compounds such as aromatic rings or the like and can crosslink polymers or can initiate radical polymerization even in the case of resin compositions having no ethylenic unsaturated bond. Therefore, the photoradical polymerization initiator according to the present invention is used as an usual photoradical polymerization initiator and also as a crosslinking agent for a resin composition containing, for example, an aromatic polymer, whereby a resistance to solvents after curing can be improved.

The above compound (a) is a hydrogen-drawing type and is bonded to a reaction product such as a polymer generated by a radical reaction to constitute a part of the chemical structure of the reaction product. For this, when the compound (a) is used as a photoradical polymerization initiator, no decomposed material is left in a free state after a radical reaction and it is therefore unnecessary to carry out volatilization during post-baking unlike the case of using a self-cleavage type initiator. Also, even if the compound (a) is left unreacted, a volatile decomposed product is not produced because the radical-generating part has a naphthalimide structure with high thermal resistance.

Therefore, a problem concerning operational safety, problems concerning a decline in the reliability of a final product such as deteriorated light resistance, coloring, fading and peeling and cracks of a coating layer, a problem as to short life of a chemical solution and a problem concerning the generation of an odor can be all solved.

Furthermore, a reaction for forming a maleimide structure does not proceed without a dehydration condensation reaction, for example, by heating or by using a catalyst. For this, there are various synthesis problems. In the reaction for forming a naphthalimide structure, a dehydration condensation reaction easily proceeds and therefore the synthesis of the naphthalimide structure is very simpler than that of a maleimide structure. Because the solubility in a solvent is also good, which is advantageous from the viewpoint of synthesis. Productivity including yield, reaction rate, control aspect and cost aspect is raised.

In the formula (1), $R^1$, $R^2$, $R^3$, $R^4$, $R^5$ and $R^6$ are respectively preferably a hydrogen atom, a halogen atom, a hydroxyl group, a mercapto group, an amino group, a cyano group, a silyl group, a silanol group, an alkoxy group, a nitro group, a carboxyl group, an acetyl group, an acetoxy group, a sulfone group or an organic group which may have a substituent or may be bonded to each other to form a cyclic structure from the viewpoint of easiness in the procurement of raw materials and synthetic simplicity.

In order to obtain practical sensitivity, the molar extinction coefficient of the above compound (a) in any of the emitting wavelengths of an exposure light source is preferably 0.1 or more.

Also, the maximum molar extinction coefficient ε of the compound (a) is preferably 2000 or more. In the mechanism of the generation of a radical in the naphthalimide part, it is predicted that the π-π* transition is important. Generally, when the maximum molar extinction coefficient $\epsilon_{max}$ is 2000 or more, the π-π* transition takes place in many cases.

The compound (a) preferably has an absorption in at least one of wavelengths among 157 nm, 193 nm, 248 nm, 365 nm, 405 nm and 436 nm because these wavelengths overlap on the emitting wavelengths of a light source to be applied, which is convenient to utilize the emitting wavelength as an exposure wavelength.

The 90% heat decomposition temperature of the compound (a) is preferably 50° C. or more from the viewpoint of the preserving stability of the resin composition.

The solubility of the compound (a) in methylacrylate at 20° C. is preferably 0.01 mol/L or more because the higher the solubility of the compound (a) in a polymerization component such as a monomer is, the more greatly the function of the compound (a) as an initiator is improved and the higher the sensitivity is made.

The photosensitive resin composition according to the first aspect comprises the compound (a) and a compound (b) having an ethylenic unsaturated bond.

In this photosensitive resin composition, the naphthalimide structure-containing group of the photoradical polymerization initiator comprising the compound (a) functions as a hydrogen-drawing type radical-generating part and radicalized when excited by irradiating light to cause a radical reaction in a resin composition. The compound (b) having an ethylenic unsaturated bond in the resin composition causes radical polymerization thereby curing the resin composition and changing solubility.

It is preferable that a hydrogen donor be further compounded in the resin composition to improve radical-generating efficiency thereby raising sensitivity.

The amount of the compound (a) is preferably 0.1% by weight or more of the whole solid content of the photosensitive resin composition from the viewpoint of preventing the curing speed of the resin composition by irradiation with light from being retarded and preventing a reduction in the strength of coating layer and a drop in the glass transition temperature of the coating layer due to reduced crosslinking density because of a small amount of a radical to be generated.

Components other than the compound (a) among components contained in the photosensitive resin composition preferably have a transmittance of 20% or more in a wavelength range where the emitting wavelength of an irradiation light source is overlapped on the absorption wavelength of the compound (a) from the viewpoint of making radial rays reach the compound (a) sufficiently to thereby raise sensitivity.

(2) Second Aspect of the Present Invention

According to a second aspect the present invention capable of solving the above problem, there is provided a radical generator containing a naphthalimide structure, the radical generator comprising a compound (c) having two or more naphthalimide structure-containing groups represented by the following formula (3) in one molecule:

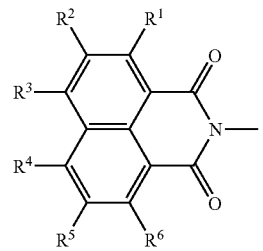

Formula (3)

wherein $R^1$, $R^2$, $R^3$, $R^4$, $R^5$ and $R^6$ respectively represent a hydrogen atom or a substituent and may be bonded to each other to form a cyclic structure.

The radical generator according to the present invention can cause a radical reaction, initiate radical polymerization or crosslink a polymer when excited by applying light because the naphthalimide structure-containing group functions as a hydrogen-drawing type radical-generating part. The naphthalimide structure-containing group is a hydrogen-drawing type more stable than a self-cleavage type and also has a naphthalene skeleton having high thermal resistance. Therefore, a radical generator having high stability and preserving stability can be obtained.

Further, many π-bonds are connected, so that the absorption wavelength is longer than that of maleimide. Therefore, it tends to have an absorption in a wavelength of 365 nm which is the major emitting wavelength of a high pressure mercury lamp and therefore has good sensitivity.

Also, the radical generator according to the present invention can react not only with an ethylenic unsaturated bond but also with various compounds such as aromatic rings and can crosslink polymers or can initiate radical reaction even in the case of resin compositions having no ethylenic unsaturated bond. Therefore, the radical generator according to the present invention is used as an usual photoradical polymerization initiator and also as a crosslinking agent for a resin composition containing, for example, an aromatic polymer, whereby a resistance to solvents after curing can be improved.

The radical generator according to the present invention has two or more naphthalimide structure-containing groups, which function as a radical-generating part, in one molecule. If any one among the plural naphthalimide structure-containing groups contained in one molecule generates a radical and forms a bond with a reaction product such as a polymer, all of the unreacted radical-generating parts contained in the molecule constitute a part of the chemical structure of a reaction product such as a polymer. Since the radical generator constitutes a part of the chemical structure of a reaction product such as a polymer, individual unreacted parts do not remain in a free state in the reaction product such as a polymer even if the unreacted part remains in the molecule of the radical generator, so that the radical generator does not volatilize during post-baking. Also, even if the compound (c) remains unreacted, a volatile decomposed material is not generated because the radical-generating part has a naphthalimide structure having high thermal resistance.

Therefore, a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, a reaction for forming a maleimide structure does not proceed without a dehydration condensation reaction, for example, by heating or by using a catalyst. For this, there are various synthesis problems. In the reaction for forming a naphthalimide structure, a dehydration condensation reaction easily proceeds and therefore the synthesis of the naphthalimide structure is very simpler than that of a maleimide structure. Because the solubility in a solvent is also good, which is advantageous from the viewpoint of synthesis. Productivity including yield, reaction rate, control aspect and cost aspect is raised.

In the formula (3), $R^1$, $R^2$, $R^3$, $R^4$, $R^5$ and $R^6$ are respectively preferably a hydrogen atom, a halogen atom, a hydroxyl group, a mercapto group, an amino group, a cyano group, a silyl group, a silanol group, an alkoxy group, a nitro group, a carboxyl group, an acetyl group, an acetoxy group, a sulfone group or an organic group which may have a substituent or may be bonded to each other to form a cyclic structure from the viewpoint of easiness in the procurement of raw materials and synthetic simplicity.

In order to obtain practical sensitivity, the molar extinction coefficient of the above compound (c) in any of the emitting wavelengths of an exposure light source is preferably 0.1 or more.

Also, the maximum molar extinction coefficient $\epsilon_{max}$ of the compound (c) is preferably 2000 or more. In the mechanism of the generation of a radical in the naphthalimide part, it is predicted that the $\pi$-$\pi^*$ transition is important. Generally, when the maximum molar extinction coefficient $\epsilon_{max}$ is 2000 or more, the $\pi$-$\pi^*$ transition takes place in many cases.

The compound (c) preferably has an absorption for at least one wavelengths among 157 nm, 193 nm, 248 nm, 365 nm, 405 nm and 436 nm because these wavelengths overlap on the emitting wavelengths of a light source to be applied, which is convenient to utilize the emitting wavelength as an exposure wavelength.

The 90% heat decomposition temperature of the compound (c) is preferably 50° C. or more from the viewpoint of the preserving stability of the resin composition.

The solubility of the compound (c) for methylacrylate at 20° C. is preferably 0.01 mol/L or more because the higher the solubility of the compound (c) in a polymerization component such as a monomer is, the more greatly the function of the compound (c) as an initiator is improved and the higher the sensitivity is made.

The photosensitive resin composition according to the second aspect comprises the compound (c) having two or more naphthalimide structure-containing groups represented by the above described formula (3) as an essential component.

This photosensitive resin composition comprises the above described radical generator according to the present invention. The naphthalimide structure-containing group of the compound (c) functions as a hydrogen-drawing type radical-generating part and radicalized when excited by applying light to cause a radical reaction in the photosensitive resin composition. The radical reactive compound in the photosensitive resin composition causes various radical reactions such as radical polymerization, a radical dimerization reaction with the compound (c) which is a radical generator and a radical crosslinking reaction according to the type of compound to thereby cure the photosensitive resin composition and change solubility.

In this photosensitive resin composition, a radical produced by the naphthalimide structure-containing group is capable of reacting not only with an ethylenic unsaturated bond but also with various compounds such as aromatic rings. Therefore, even in the case of a photosensitive resin composition having no ethylenic unsaturated bond, the radicals enables a polymer to be crosslinked and a radical reaction to proceed. If the compound (c) which is an essential component is contained, it can cause curing and/or a change in solubility even in the case of a photosensitive resin composition having no ethylenic unsaturated bond. Also, a radical generated at any one place among two or more naphthalimide structure-containing groups is bonded to the photosensitive resin composition to thereby constitute a part of the chemical structure of the photosensitive resin composition. Therefore, the radical generator is never left in a free state in the photosensitive resin composition. As a result, a problem concerning deteriorated reliability of a final product is solved.

Furthermore, the compound (c) which functions as a radical generator is synthesized very simpler than a maleimide structure, which is advantageous in synthesis, and therefore productivity including yield, reaction rate, control aspect and cost aspect is raised.

This photosensitive resin composition may contain a compound (b) having an ethylenic unsaturated bond as a curable reactive compound. The compound (b) has been widely used as a curable reactive compound capable of being radically polymerized and has a wide range of applications.

It is preferable that a hydrogen donor be further compounded in the resin composition of the present invention to improve radical-generating efficiency thereby raising sensitivity.

When the compound (b) having an ethylenic unsaturated bond is compounded in this photosensitive resin composition, the amount of the compound (c) is preferably 0.1% by weight or more based on the whole solid content of the photosensitive resin composition from the viewpoint of preventing the curing speed of the resin composition by irradiation with light from being retarded and preventing a reduction in the strength of coating layer and a drop in the glass transition temperature of the coating layer due to reduced crosslinking density because of a small amount of a radical to be generated.

Components other than the compound (c) among components contained in the photosensitive resin composition preferably have a transmittance of 20% or more in a wavelength range where the emitting wavelength of an irradiation light source is overlapped on the absorption wavelength of the compound (c) from the viewpoint of making enough radial rays reach the compound (c) to thereby raise sensitivity.

(3) Third Aspect of the Present Invention

According to a third aspect capable of solving the above problem, there is provided a photosensitive compound containing a naphthalimide structure, the photosensitive compound comprising a compound (d) having a naphthalimide structure-containing group and an ethylenic unsaturated group in one molecule and represented by the following formula (5):

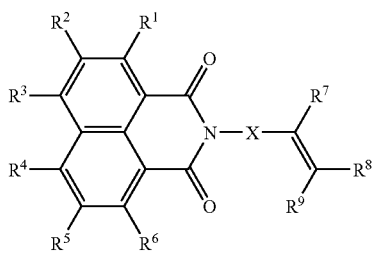

Formula (5)

wherein $R^1$, $R^2$, $R^3$, $R^4$, $R^5$ and $R^6$ respectively represent a hydrogen atom or a substituent and may be bonded to each other to form a cyclic structure, $R^7$, $R^8$ and $R^9$ respectively represents a hydrogen atom or a monovalent organic group and X represents a divalent group.

The photosensitive compound comprising the above described compound (d) can cause a radical reaction, initiate radical polymerization or can crosslink a polymer in the case where the photosensitive compound has two or more naphthalimide structure-containing groups in one molecule, when excited by applying light because the naphthalimide structure-containing group functions as a hydrogen-drawing type radical-generating part. The naphthalimide structure-containing group is a hydrogen-drawing type more stable than a self-cleavage type and also has a naphthalene skeleton having high thermal resistance. Therefore, the photosensitive compound of the present invention has high thermal resistance, high stability and preserving stability.

Further, many π-bonds are connected, so that the absorption wavelength is longer than that of maleimide. Therefore, it tends to have an absorption in a wavelength of 365 nm which is the major emitting wavelength of a high pressure mercury lamp and therefore has good sensitivity.

Also, the photosensitive compound according to the present invention can react not only with an ethylenic unsaturated bond but also with various compounds such as aromatic rings and can crosslink polymers or can initiate radical reaction even in the case of resin compositions having no ethylenic unsaturated bond. Therefore, the photosensitive compound according to the present invention is used as an usual photoradical polymerization initiator and also as a crosslinking agent for a resin composition containing, for example, an aromatic polymer, whereby a resistance to solvents after curing can be improved.

Particularly, the compound (d) has an ethylenic unsaturated group as a radical polymerizable part together with a naphthalimide structure-containing group, so that it combines a function as a photoradical generator and a function as a radical polymerizable component and is therefore preferably used as a curable reactive component of the photosensitive resin composition. Also, the compound (d) is used also as a raw monomer of the polymer (e) which will be described later.

Also, in the case of the photosensitive compound comprising the compound (d), the naphthalimide structure-containing group generates a radical and is bonded directly to a reaction product such as a polymer or the ethylenic unsaturated group present in the same molecule is bonded to a reaction product such as a polymer by a radical reaction even if the naphthalimide structure-containing group is not radicalized and remains unreacted, whereby the unreacted naphthalimide structure-containing group also constitutes a part of the chemical structure of a reaction product such as a polymer.

For this, the photosensitive compound comprising the compound (d) is not left in a free state in a reaction product such as a polymer, so that it is not volatilized during post-baking even if the radical-generating part is left unreacted. Also, even if the radical-generating part is left unreacted, a volatile decomposed material is not generated since the radical-generating part has the naphthalimide structure having high thermal resistance.

As aforementioned, the radical-generating part of the photosensitive compound of the present invention is bonded to a matrix in the cured coating layer of the photosensitive resin composition when it is radicalized and constitutes a part of a chemical structure of the matrix in the cured coating layer even if it is left unreacted. In both cases, the radical-generating part exists in the cured coating layer in a chemically stable state.

Therefore, a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, a reaction for forming a maleimide structure does not proceed without a dehydration condensation reaction, for example, by heating or by using a catalyst. For this, there are various synthesis problems. In the reaction for forming a naphthalimide structure, a dehydration condensation reaction easily proceeds and therefore the synthesis of the naphthalimide structure is very simpler than that of a maleimide structure. Because the solubility in a solvent is also good, which is advantageous from the viewpoint of synthesis. Productivity including yield, reaction rate, control aspect and cost aspect is therefore raised.

A photosensitive compound of another embodiment according to the third aspect comprises a polymer (e) of one or more radical polymerizable compounds including at least the compound (d) represented by the above described formula (5).

The photosensitive compound comprising the polymer (e) can also cause a radical reaction or initiate radical polymerization when excited by applying light because the naphthalimide structure-containing group functions as a hydrogen-drawing type radical-generating part. When the polymer (e) has two or more naphthalimide structure-containing groups in one molecule, the polymer (e) combines a function as a radical generator and a function as a crosslinking agent. Also, it is possible to provide a function as a binder polymer by controlling the molecular weight of the polymer (e) and to provide abilities such as alkali developing ability and water-solubility or the like by selecting a copolymer component.

Also, in the case of the photosensitive compound comprising the polymer (e), if any one among the plural naphthalimide structure-containing groups (radical-generating part) contained in one molecule of the photosensitive compound generates a radical and forms a bond with a reaction product such as a polymer, all of the unreacted radical-generating parts contained in themolecule constitute a part of the chemical structure of a reaction product such as a polymer. Therefore, the photosensitive compound containing the polymer (e) is not volatilized during post-baking like the case of the compound (d) and scarcely causes the coating layer to be denatured. As aforementioned, the radical-generating part of the photosensitive compound of the present invention is bonded to a matrix in the cured coating layer of the photosensitive resin composition when it is radicalized and constitutes a part of a chemical structure of the matrix in the cured coating layer even if it is left unreacted. In both cases, the radical-generating part exists in the cured coating layer in a chemically stable state, thus not deteriorating thermal resistance, weather resistance and stability.

As a consequence, a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, the synthesis is very simpler than that of a maleimide structure, which is advantageous in synthesis. For this, productivity including yield, reaction rate, control aspect and cost aspect is raised.

The photosensitive resin composition according to the third aspect comprises, as its essential component, at least one photosensitive compound selected from the group consisting of the compound (d) and the polymer (e) described above.

In the photosensitive resin composition according to the third aspect, the naphthalimide structure-containing group of the compound (d) or polymer (e) functions as a hydrogen-drawing type radical-generating part and is radicalized by irradiating it with light to excite it, causing a radical reaction in the photosensitive resin composition. The radical reactive compound in the photosensitive resin composition causes various radical reactions such as radical polymerization, radical dimerization reaction with the compound (d) or polymer (e) which are photosensitive compounds and a radical crosslinking reaction, to thereby cure the photosensitive resin composition and to change solubility.

This photosensitive resin composition contains a hydrogen-drawing type radical-generating group and therefore has high thermal resistance, preserving ability and stability. Also, this photosensitive resin composition can crosslink polymers or promote a radical reaction even if the photosensitive resin composition has no ethylenic unsaturated bond and therefore cause curing and/or a change in solubility because the radical generated by the naphthalimide structure-containing group can react not only with an ethylenic unsaturated bond but also with various compounds such as aromatic rings.

Furthermore, the naphthalimide structure-containing group of the above described photosensitive compound generates a radical and is then bonded to the matrix structure to constitute a part of the chemical structure of the resin composition. Also, even if the naphthalimide structure-containing group of the photosensitive compound remains unreacted, the ethylenic unsaturated group in the same molecule is bonded to the matrix structure in the case of the compound (d) whereas other naphthalimide structure-containing groups in the same molecule is radicalized and bonded to the matrix structure in the case of the polymer (e), to constitute a part of the chemical structure of the resin composition. Therefore, unlike conventional types, the radical generator is not left in a free state in the resin composition. As a result, the problem concerning a reduction in the reliability of a final product is solved.

It is preferable to further formulate a compound (b) having an ethylenic unsaturated bond in the photosensitive resin composition with the view of improving the physical properties of the coating layer such as thermal resistance and hardness. The photosensitive resin composition may be compounded with a macro molecular binder component to control the film forming property of the composition put in an uncured state and the physical properties of the coating layer after cured.

The photosensitive resin composition according to the first, second or third aspect is suitable as pattern-forming materials (resists), paints or printing inks and formation materials for color filters, electronic parts, layer insulation films, wire cover films, optical materials, optical circuits, optical circuit parts, antireflection films, holograms or building materials and is desirable from the viewpoint of high thermal resistance and stability of products and films. Also, because these photosensitive resin composition is free from the generation of odors, the operational environment is bettered.

A printed product, a color filter, electronic parts, a layer insulation film, a wire cover film, an optical material, an optical circuit, optical circuit parts, an antireflection film, a hologram or a building material according to the present invention to solve the aforementioned problem is characterized in that at least a part thereof is formed of a cured product of the aforementioned photosensitive resin composition.

The printed product, color filter, electronic parts, layer insulation film, wire cover film, optical material, optical circuit, optical circuit parts, antireflection film, hologram or building material according to the present invention has such a merit that high thermal resistance and stability of products and films are provided and therefore high product yield since at least a part thereof is formed of a cured product of the photosensitive resin composition having high thermal resistance and stability.

BRIEF DESCRIPTION OF THE DRAWINGS

In the accompanying drawings.

DESCRIPTION OF THE PREFERRED EMBODIMENTS

Figure 1:
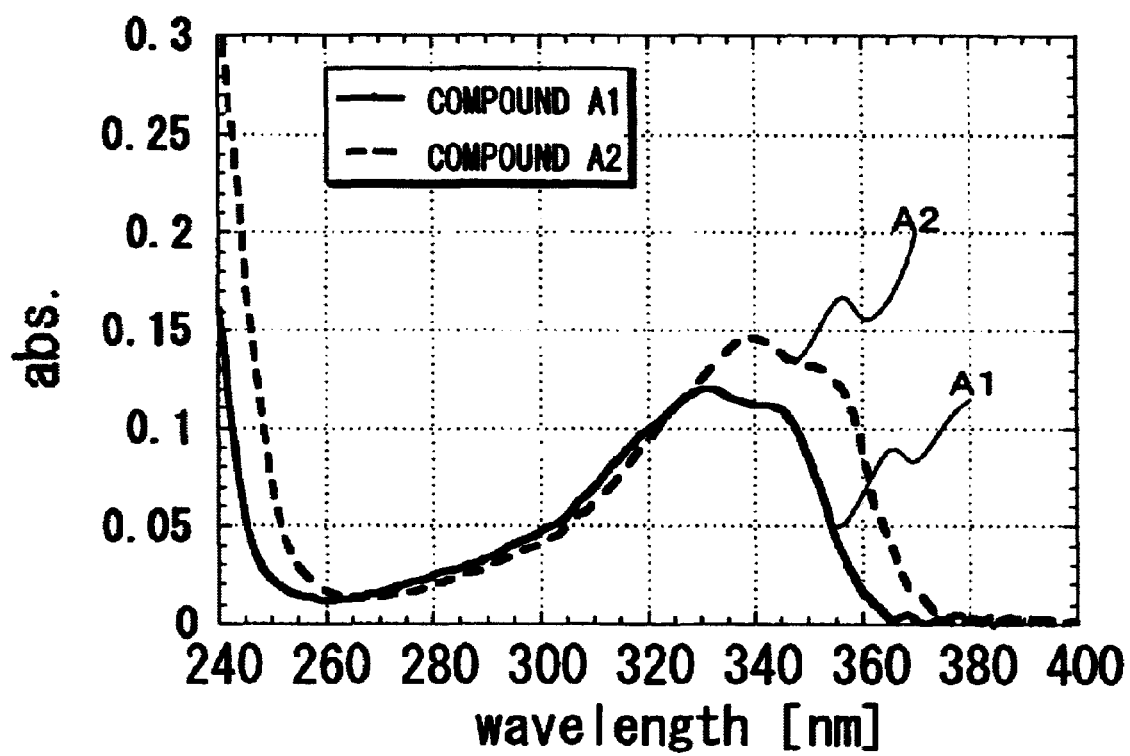
FIG. 1 is a graph showing the results of measurement of an ultraviolet absorption spectrum (compounds A1 and A2) in an example according to a first aspect.

The present invention will be hereinafter explained in detail. In the present invention, the light includes not only electromagnetic waves having wavelengths in the visible and invisible region and radicalizing the radical-generating part of a photosensitive compound or causing the photosensitive resin composition to enter into a radical reaction, but also corpuscular rays such as electron rays and radial rays which are a general term of electromagnetic waves and corpuscular rays or ionizing radial rays. Ultraviolet rays, visible rays, electron rays, ionizing radial rays and the like are primarily used for the photo-curing of a resin composition.

(1) First Aspect According to the Present Invention

First, a photoradical polymerization initiator according to the present invention will be explained. The photoradical polymerization initiator according to the present invention comprises a compound (a) having only one naphthalimide structure-containing group represented by the following formula (1) in one molecule:

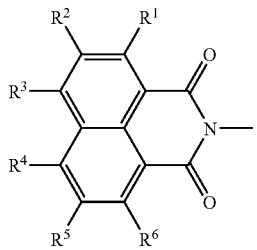

Formula (1)

wherein $R^1$, $R^2$, $R^3$, $R^4$, $R^5$ and $R^6$ respectively represent a hydrogen atom or a substituent and may be bonded to form a cyclic structure.

As to the mechanism of generation of a radical by the naphthalimide structure-containing group, it is inferred that the naphthalimide structure absorbs light such as electromagnetic waves and radial rays to thereby generate radicals.

The above described naphthalimide structure-containing group which functions as a hydrogen-drawing type radical-generating part, and the photoradical polymerization initiator according to the present invention can be excited by applying light to cause a radical reaction, to initiate radical polymerization and to crosslink polymers.

In the naphthalimide structure-containing group represented by the above formula (1), $R^1$, $R^2$, $R^3$, $R^4$, $R^5$ and $R^6$ in the formula are respectively a hydrogen atom or a substituent or may be a cyclic structure in which they are bonded to each other.

Examples of the substituent include a halogen atom, a hydroxyl group, a mercapto group, an amino group, a cyano group, a silyl group, a silanol group, an alkoxy group, a nitro group, a carboxyl group, an acetyl group, an acetoxy group, a sulfone group or an organic group which may have a substituent or may be a cyclic structure in which they are bonded to each other. Examples of the organic group which may have a substituent include a saturated or unsaturated alkyl group, saturated or unsaturated alkyl halide group or aromatic group such as a phenyl group and naphthyl group and allyl group.

When $R^1$, $R^2$, $R^3$, $R^4$, $R^5$ and $R^6$ are respectively a hydroxyl group or the aforementioned exemplified substituents, this is preferable from the view point of easiness in the procurement of raw materials and synthetic simplicity.

Also, the term "may be a cyclic structure in which they are bonded to each other" means that not only aliphatic cyclic structures such as a cyclohexyl group but also, for example, those having an anthracene structure in which an aromatic ring is bonded to $R^1$ and $R^2$, those having a phenanthrene structure in which an aromatic ring is bonded to $R^2$ and $R^3$ or having a pyrene structure or perylene structure like the above and also those bonding to the naphthalene ring via $R^1$, $R^2$, $R^3$, $R^4$, $R^5$ and $R^6$ to form a condensed cyclic hydrocarbon larger than naphthalene as far as the imide ring has a six-membered structure are included in the naphthalimide structure-containing group according to the present invention. Also, the cyclic structure may be an aromatic condensed ring or an aliphatic cyclic structure and may further contain a heteroatom other than C as an atom composing the ring structure.

As the substituent introduced into the naphthalimide structure-containing group of the compound (a), a saturated or unsaturated alkyl group having 1 to 15 carbon atoms, alkoxy group, bromo group, chloro group or fluoro group is preferable from the viewpoint of improving solubility when the compound (a) is compounded in the photosensitive resin composition.

When the part to which N of the naphthalimide structure-containing group is bonded is expressed as Q in the above compound (a), the compound (a) may be represented by the following formula (2).

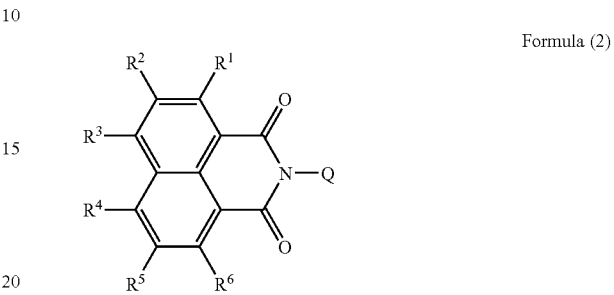

Formula (2)

wherein $R^1$, $R^2$, $R^3$, $R^4$, $R^5$ and $R^6$ are the same as those in the formula (1) and Q is a monovalent chemical structure.

The chemical structure Q contained in the formula (2) may be a monovalent one having any chemical structure and is typically an organic group. Examples of the organic group include hydrocarbon groups such as a straight-chain and/or branched and/or cyclic saturated or unsaturated alkyl group, aryl group and allyl group. Further, one or more bonds such as a single bond, an ester bond, ether bond, thioether bond, amino bond, amide bond, urethane bond, urea bond, thiocarbamate bond, carbodiimide bond and carbonate bond may be contained in these hydrocarbon groups.

Examples of a monovalent chemical structure except for organic groups include siloxane, silane and borazine.

As Q, straight-chain or branched alkyl groups are preferable from the viewpoint of, particularly, cost, availability, synthetic simplicity and solubility. Straight-chain or branched alkyl groups containing an ester bond, ether bond, amide bond, urethane bond and urea bond therein are more preferable. Also, from the viewpoint of thermal resistance, straight-chain or branched alkyl groups such as those having a saturated or unsaturated cyclic structure are preferable and those having an ester bond, ether bond, amide bond, urethane bond and urea bond are more preferable.

The photoradical polymerization initiator described above has an absorption wavelength longer than that of maleimide because many π-bonds are connected and therefore easily have an absorption in a wavelength of 365 nm which is a major emitting wavelength of a high pressure mercury lamp, exhibiting high sensitivity.

In order to improve sensitivity, it is effective to select substituents $R^1$ to $R^6$ and the center structure Q properly such that the naphthalimide skeleton contained in the structure of the compound (a) takes a chemical structure which is excited by light to easily produce a radical.

In order to obtain practical sensitivity, it is preferable to make a combination of the substituents $R^1$, $R^2$, $R^3$, $R^4$, $R^5$ and $R^6$ in the formula (1) so that a part of the absorption wavelength of the compound (a) overlaps on any of the emitting wavelengths of an exposure light source (irradiation light source) in a process. The absorption maximum of the compound (a) falls within a range of particularly preferably ±20% and still more preferably ±10% of the emitting wavelength closest to the absorption maximum.

The molar extinction coefficient of the compound (a) in any of the emitting wavelengths of an exposure light source (irradiation light source) in a process is preferably 0.1 or more from the viewpoint of sensitivity.

Here, the molar extinction coefficient e is given by the relationship induced from the Lambert-Beer rule and expressed by the following formula.

$$A = \epsilon c b$$

where:
A=Absorbance;
b=Length of an optical path in an example (cm); and
c=Concentration of a solute (mol/L).

In usual, when a change in absorbance is recorded using a solution having the same concentration and a cell having the same length of an optical path with changing the wavelength of incident light, the absorbance varies according to the wavelength, showing a maximum molar extinction coefficient $\epsilon_{max}$ at a wavelength specific to a compound to be a subject of measurement. The aforementioned term "the molar extinction coefficient of the compound (a) in the exposure wavelength is 0.1 or more" implies that the molar extinction coefficient when measured using a wavelength adopted when carrying out exposure by using the compound (a) is 0.1 or more but does not imply that the maximum molar extinction coefficient $\epsilon_{max}$ is 0.1 or more.

It is considered that the naphthalimide compound is put in an excited state due to π-π* transition in consideration of the point of the maximum molar extinction coefficient of the naphthalimide compound. It is thought that a radical is produced through this excited state and it is therefore important that the naphthalimide enters into a π-π* transition state. According to THE ORGANIC COMPOUND IDENTIFICATION METHOD BY A SPECTRUM, fifth edition (R. M. Silverstein, 1993), π-π* transition is characterized by a molar extinction coefficient of 10,000 or more. However, in actual, π-π* transition takes place even if the molar extinction coefficient is about several thousands like the case of phenol. Therefore, it is thought that if the maximum molar extinction coefficient of naphthalimide is 2,000 or more, a radical is easily produced. Accordingly, the maximum molar extinction coefficient $\epsilon_{max}$ of the compound (a) is preferably 2000 or more.

In the case of an usual high pressure mercury lamp, there are three significant emissions at 365 nm (i rays), 405 nm (h rays) and 436 nm (g rays). However, in actual, emissions are also present at, for instance, 333 nm. Therefore, the compound (a) may have absorption maximum in the vicinity of these wavelengths. Also, when irradiating with an F2-excimer laser (157 nm), ArF excimer laser (193 nm), KrF excimer laser (248 nm) or the like, the compound (a) may have an absorption in the vicinity of these wavelengths. To state specifically, the absorption maximum around 365 nm falls in a range of preferably 365±73 nm and more preferably 365±37 nm.

If the absorption wavelength is overlapped on the region covering at least one wavelength among 157 nm, 193 nm, 248 nm, 365 nm, 405 nm and 436 nm which are major wavelengths of very popular exposure light sources as described above, this is convenient to utilize these wavelengths as exposure wavelengths. It is particularly preferable that the molar extinction coefficient at this wavelength be 0.1 or more.

THE INTERPRETATION OF THE ULTRAVIOLET SPECTRA OF NATURAL PRODUCTS (A. I. Scott, 1964) and the table described in THE ORGANIC COMPOUND IDENTIFICATION METHOD BY A SPECTRUM, fifth edition (R. M. Silverstein, 1993) may be used as the references showing a guide to determine as to what substituent is introduced to shift the absorption wavelength to a desired wavelength.

Since the photoradical polymerization initiator of the present invention is a hydrogen-drawing type, a radical is scarcely generated only by heating. Also, since the base skeleton is a naphthalimide skeleton, the photoradical polymerization initiator is scarcely decomposed by heating. Therefore, it has high thermal resistance, imparts good preserving stability to the photosensitive resin composition when compounded in the resin composition, improves the stability of the cured film which will be finally obtained and also prevents the light-resistance of the coating layer from being impaired and coloring, fading, peeling and cracks of the coating layer.

In the photoradical polymerization initiator according to the present invention, the 90% heat decomposition temperature of the compound (a) is preferably 50° C. or more and more preferably 100° C. or more in view of thermal resistance.

Here, the 90% heat decomposition temperature means a temperature at which the weight of a sample is reduced to 90% of the initial weight when a decrement of weight is measured using a thermogravimetric analyzer according to the same method as in the examples of the present invention as will be explained later. Similarly, the 95% heat decomposition temperature means a temperature at which the weight of a sample is reduced to 95% of the initial weight.

The compound (a) preferably has high solubility when compounded in the photosensitive resin composition with the intention of improving coating suitability, transparency of the cured film, sensitivity during exposure or the like.

The solubility of the compound (a) in a solvent is preferably high from the viewpoint of coating suitability during application. Specifically, the solubility of the compound (a) in a solvent to be used, particularly in any of common solvents as will be described later is preferably 0.1% by weight or more.

Also, even in the case of a photosensitive resin composition dissolved in a transparent state by using a solvent, precipitates are produced in the coating layer during drying when the solvent is evaporated at a coating process in the case where the compatibility among solids contained in the resin composition is low and only insufficient transparency is obtained. For this, when a coating layer or a molded body having such high transparency as that of an optical member is needed, it is preferable to use the compound (a) having high compatibility with other solid components in the photosensitive resin composition, particularly, a polymerizable compound such as the compound (b), especially a monomer component. When high transparency is needed, all ray-transmittance (JIS K7105) is preferably 90% or more and more preferably 95% or more when the layer thickness of the coating layer formed by curing the photosensitive resin composition is 10 μm.

In the case where the solubility of the compound (a) in a polymerizable compound is high, the function as the initiator is improved and therefore has high sensitivity at the time of exposing. From this point, a saturated concentration of the compound (a) in methylacrylate at 20° C. is 0.01 mol/L or more when evaluating solubility by using methylacrylate as a typical monomer component.

The solubility or compatibility of the compound (a) can be improved by introducing a substituent into a naphthalimide ring. From this point of view, a saturated or unsaturated alkyl group having 1 to 15 carbon atoms, alkoxy group, bromo group, chloro group or fluoro group or the like is preferable as a substituent of the naphthalimide ring. The solubility or compatibility of the compound (a) also can be improved by changing the structure of Q or by introducing a substituent into Q in the formula (2). The substituent introduced into or the structural reformation made to the naphthalimide ring or Q part of the compound (a) are selected variously corresponding to a solvent in which the compound (a) is intended to be dissolved and other solid components which is intended to be solved mutually. For example, when selecting a carboxyl group as the substituent, it is easily solved in water and organic polar solvents whereas when introducing an ester, its solubility in a solvent or compound having an ester bond is improved.

A 1,8-naphthalimide compound such as those represented by the formula (1) is usually synthesized from 1,8-naphthalic acid anhydride having substituents at the first position and eighth position of naphthalene, these substituents being bonded to form an anhydride. An imide bond is generally formed by running an addition reaction between an anhydride and an amine to form an amide acid and then by running a dehydration condensation reaction by using, for example, hear or a catalyst. In the case where the acid anhydride has a five-membered cyclic structure like a phthalic acid anhydride and maleic acid anhydride, the reaction proceeds in two stages as described above and therefore no imide is formed if the dehydration condensation reaction using heat, a catalyst or the like is not run, giving rise to various synthetic problems. However, because the 1,8-naphthalic acid anhydride has an anhydrous structure of a six-membered ring, a dehydration reaction easily proceeds when it is subjected to an addition reaction with a primary amine. This is considered to be because a six-membered cyclic structure is more decreased in distortion than a five-membered cyclic structure and is energetically stable, and in the case of the six-membered cyclic structure, an imide is more stable than an amide acid. From these facts, a naphthalimide structure is synthesized very more simply than a maleimide structure, which is synthetically advantageous. Therefore, the photoradical polymerization initiator comprising the compound (a) has high productivity including yield, reaction rate, control aspect and cost aspect.

The compound (a) having only one naphthalimide structure-containing group in the present invention may be synthesized using various known measures. For example, the compound (a) can be synthesized by reacting a compound having one or more primary amino groups with a naphthalic acid anhydride. Specifically, a N-alkylnaphthalimide is obtained when using a monoamine, a N-secondary or tertiary aminoalkylnaphthalimide is obtained when using an amine having one primary amine and one or more secondary or tertiary amines, a N-hydroxyalkylnaphthalimide is obtained when using an amino alcohol and a N-carboxyalkylnaphthalimide is obtained when using an amino acid.

As raw material in the above synthetic method, acid anhydrides such as 1,8-naphthalic acid anhydride and 4-bromo-1,8-naphthalic acid anhydride and, besides, derivatives of these compounds may be used. As the derivatives of the naphthalic acid anhydride, those into which the substituents $R^1$ to $R^6$ of the compound (a) to be finally intended has been already introduced may be used. Also, the substituent $R^1$ to $R^6$ in the formula (1) maybe introduced before or after running the imide reaction.

Measures for synthesizing the compound (a) having only one naphthalimide structure-containing group will be hereinafter exemplified; however, these measures are not intended to be limiting of the synthetic method according to the present invention.

First, 1,8-naphthalic acid anhydride is poured into N,N-dimethylformamide and stirred. To there, 2-aminoethanol in an amount by mol equivalent to the naphthalic acid anhydride is added dropwise, and stirred at ambient temperature for about 1 to 15 hours. The reaction solvent used at this time is not limited to dimethylformamide and a mixture of two or more solvents may be used. As the reaction solvent, solvents such as organic polar solvents in which a final product is dissolved are preferable. Because the naphthalic acid anhydride has poor solubility and is sparingly soluble in a general solvent, there are many cases where it is made soluble by reacting with an amine.

The 1,8-naphthalic acid anhydride occasionally forms an imide bond only by mixing with an amine and stirring at ambient temperature. To accelerate the reaction further, it may be heated to a temperature ranging from ambient temperature to 200° C. Also, an azeotropic solvent such as toluene may be used by mixing it to remove the water generated during reaction.

The solvent in the reaction solution stirred for several hours is removed by distillation or by pouring the solution into water or the like to take out a solid. This solid is recrystallized from a desired solvent, whereby a N-substituted naphthalimide compound, that is, the compound (a) having only one naphthalimide structure-containing group represented by the formula (1) can be obtained. The refining method is not limited to recrystallization but all known methods such as sublimation refining and column chromatography may be used. However, recrystallization is preferable in view of cost.

As the acid anhydride used here, not only 1,8-naphthalic acid anhydride but also a compound into which a substituent is introduced in advance, such as 4-bromo-1,8-naphthalic acid anhydride having a bromo group at the fourth position, may be used according to the purpose.

Also, no particular limitation is imposed on the amino group-containing compound and various compounds may be used corresponding to the purpose. There may be exemplified aliphatic amines such as ethylamine, butylamine, hexylamine and cyclohexylamine and aromatic amines such as aniline, benzylamine and allylamine. Examples of a primary amine having a tertiary amino group include N,N-dimethylethylenediamine and N,N-diethylethylenediamine.

As to also a polyvalent amino compound having two or more primary amino groups, only one primary amino group in its molecule can be reacted with 1,8-naphthalic acid anhydrides by controlling the condition under which it is reacted with the 1,8-naphthalic acid anhydrides. As the polyvalent amino compound having two or more primary amines, various diamino compounds may be used. There may be exemplified aromatic amines such as 4,4'-(or 3,4'-, 3,3'-, 2,4' or 2,2'-)diaminodiphenyl ether, 4,4'-(or 3,4'-, 3,3'-, 2,4' or 2,2'-)diaminodiphenylmethane, 4,4'-(or 3,4'-, 3,3'-, 2,4' or 2,2'-)diaminodiphenylsulfone, 4,4'-(or 3,4'-, 3,3'-, 2,4' or 2,2'-)diaminodiphenyl sulfide, paraphenylenediamine, methaphenylenediamine and p-xylylenediamine, m-xylylenediamine; and aliphatic diamines such as ethylenediamine, diethylenetriamine, 1,3-diaminopropane, 1,2-diaminopropane, 2,2-diaminopropane, 1,4-diaminocyclohexane and 1,8-diaminooctane.

The amines used in the synthesis of the compound (a) may have a functional group other than an amino group. Examples of amines having a hydroxyl group include oxyalkylamines such as 2-aminoethanol, propanolamine, hexanolamine and 2-amino-1,3-propanediol; and hydroxyl group and ether group-containing amines such as 2-(2-aminoethoxy)ethanol and 3-(3-propoxy)propanol.

Examples of amines having a carboxyl group include amino acid compounds such as α-alanine, β-alanine, serine and glycine. Examples of amines having an ether bond include 2-amino-1-methoxypropane, aminomethyl vinyl ether, aminoethyl vinyl ether, aminobutyl vinyl ether, aminohexyl vinyl ether, aminocyclohexyl vinyl ether, aminononyl vinyl ether and those obtained by substituting the vinyl groups of these compounds with an alkyl or aryl group at the α-position or β-position of each compound, for example, an aminoalkyl propenyl ether, aminoalkyl isopropenyl ether and aminoalkyl styryl ether. Other examples include 2-aminoethanethiol having a thiol group, 2-aminoethylhydrogen sulfate having a sulfonic group and 2-aminoethyldihydrogen phosphate having a phosphoric acid group.

The photoradical polymerization initiator obtained in this manner according to the present invention can cause a radical reaction by applying light such as electromagnetic waves, radial rays or the like to excite it because the aforementioned naphthalimide structure-containing group functions as a hydrogen-drawing type radical-generating part. The naphthalimide structure-containing group is not a self-cleavage type but is a hydrogen-drawing type and also has a naphthalene skeleton having high thermal resistance and it is therefore possible to obtain a photoradical polymerization initiator having high thermal resistance, stability and preserving ability.

Also, since the radical generated by the naphthalimide structure-containing group acts in accordance with a hydrogen-drawing mechanism, it can react not only with a general polymerizable group such as an ethylenic unsaturated bond but also with various compounds such as aromatic rings. Therefore, it can crosslink low-molecular weight aromatic compounds such as methylbenzene and polymers having an aromatic part such as PET. So, the compound (a) is used as an usual photoradical polymerization initiator and also can used as, for example, a crosslinking agent for a resin composition containing an aromatic polymer to thereby improve solvent resistance after curing.

Also, the photoradical polymerization initiator comprising the compound (a) is a hydrogen-drawing type and is bonded to a reaction product such as a polymer generated by a radical reaction to constitute a part of the chemical structure of the reaction product. For this, when the compound (a) is used as the photoradical polymerization initiator, the decomposition material does not remain in a free state after the radical reaction and it is not necessary to evaporate at the time of the post-baking unlike the case of using a self-cleavage type. Also, even if the compound (a) remains unreacted, a volatile decomposition material is not generated since the radical-generating part has a naphthalimide structure having high thermal resistance.

Namely, the residues originated from the photoradical polymerization initiator comprising the compound (a) according to the present invention, namely, the part consumed by a radical reaction and an unreacted part are both present in a chemically stable state in the cured coating layer of the photosensitive resin composition and no volatile decomposition material is produced.

Therefore, the residue originated from the photoradical polymerization initiator of the present invention does not give rise to a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, a reaction for forming a maleimide structure does not proceed if a dehydration condensation reaction is not promoted, for example, by heating or by using a catalyst. For this, there are various synthesis problems. In the reaction for forming a naphthalimide structure, a dehydration condensation reaction proceeds more rapidly than in the case of maleimide and therefore the synthesis of the naphthalimide structure is very simple, which is advantageous from the viewpoint of synthesis. Therefore, productivity including yield, reaction rate, control aspect and cost aspect is raised.

Next, the photosensitive resin composition according to the first aspect will be explained.

The photosensitive resin composition according to the first aspect contains the compound (a) having only one naphthalimide structure-containing group represented by the formula (1) and the compound (b) having an ethylenic unsaturated bond as essential components. The photosensitive resin composition may further contains, according to the need, a hydrogen donor, a curable reactive compound except for the compound (b), a radical generator except for the compound (a), a macro molecular weight binder component or other components.

In this photosensitive resin composition (hereinafter referred to simply as a resin composition), the naphthalimide structure-containing group of the photoradical polymerization initiator comprising the compound (a) functions as a hydrogen-drawing type radical-generating part and radicalized when excited by applying light such as electromagnetic waves and radial rays to cause a radical reaction in the resin composition. The compound (b) having an ethylenic unsaturated bond in the resin composition causes radical polymerization thereby curing the resin composition and changing solubility.

When the resin composition further contains a radical reactive compound other than compound (b) having an ethylenic unsaturated bond as a curable reactive compound or a macro molecular weight binder component, the radical reactive compound causes various radical reaction such as a radical dimerization reaction with the compound (a) which is a radical generator and a radical crosslinking reaction according to the type of compound and therefore cures the resin composition and changes solubility in combination with the compound (b).

Here, the crosslinking means that a crosslinking bond is generated, wherein the crosslinking bond means a bond formed in such a manner as to build a bridge between optional two atoms among a molecule consisting of atoms bound chain-wise. The bond in this case may be formed in the same molecule or between different molecules (CHEMICAL HANDBOOK, Tokyo Kagaku Dojin Co., Ltd., p. 1082).

The compound (b) having an ethylenic unsaturated bond has been widely utilized as a curable reactive compound which is radically polymerizable and has a wide range of application. Therefore, the compound (b) is used as an essential curable reactive compound in the photosensitive resin composition of the present invention. As the compound (b) having an ethylenic unsaturated bond, compounds having one or two or more ethylenic unsaturated bonds and compounds having at least one ethylenic unsaturated bond and other functional groups may be used. There may be exemplified amide type monomers, (metha)acrylate monomers, urethane (metha)acrylate oligomers, polyester(metha)acrylate oligomers, epoxy(metha)acrylates and hydroxyl group-containing (metha)acrylates and aromatic vinyl compounds such as styrene.

Examples of the amide type monomer include amide compounds such as N-vinyl pyrrolidone, N-vinyl caprolactam and acryloylmorpholine.

Examples of the (metha)acrylate monomer include imideacrylates such as hexahydrophthalimideethylacrylate and succinicimideethylacrylate; hydroxyalkyl(metha)acrylates such as 2-hydroxyethyl(metha)acrylate, 2-hydroxypropyl (metha)acrylate and 2-hydroxy-3-phenylpropylacrylate; acrylates of phenol alkylene oxide adducts such as phenoxyethyl(metha)acrylate and their halogen nucleus substitution derivatives; mono or di(metha)acrylates of glycols such as mono or di(metha)acrylates of ethylene glycol, mono(metha) acrylates of methoxyethylene glycol, mono or di(metha)acrylates of tetraethylene glycol and mono or di(metha)acrylates of tripropylene glycol, (metha)acrylates of polyols or their alkylene oxides such as trimethylolpropanetri(metha)acrylate, pentaerythritol tri(metha)acrylate, pentaerythritol tetra (metha)acrylate and dipentaerythritol hexaacrylate, and isocyanuric acid EO-denatured di or tri(metha)acrylates.

Examples of the urethane(metha)acrylate oligomer include reaction products obtained by further reacting a hydroxyl group-containing (metha)acrylate with a reaction product between a polyol and an organic polyisocyanate.

Here, the polyol includes low-molecular weight polyols, polyethylene glycols and polyester polyols. Example of the low-molecular weight polyol include ethylene glycol, propylene glycol, cyclohexanedimethanol and 3-methyl-1,5-pentanediol. Examples of the polyether polyol include polyethylene glycols and polypropylene glycols. Examples of the polyester polyol include reaction products between these low-molecular weight polyols and/or polyether polyol and acid components, for example, dibasic acids such as adipic acid, succinic acid, phthalic acid, hexahydrophthalic acid and terephthalic acid or their anhydrides.

Also, examples of the organic polyisocyanate to be reacted with the aforementioned polyol include tolylenediisocyanate, 4,4'-diphenylmethanediisocyanate, 4,4'-dicyclohexylmethanediisocyanate, hexamethylenediisocyanate and isophoronediisocyanate.

Examples of the polyester(metha)acrylate oligomer include dehydration condensates between polyester polyols and (metha)acrylic acids. Examples of the polyester polyol include low-molecular weight polyols such as ethylene glycol, polyethylene glycol, cyclohexanedimethanol, 3-methyl-1,5-pentanediol, propylene glycol, polypropylene glycol, 1,6-hexanediol and trimethylolpropane and reaction products between polyols such as alkylene oxide adducts of these low-molecular weight polyols and acid components such as dibasic acids, e.g., adipic acid, succinic acid, phthalic acid, hexahydrophthalic acid and terephthalic acid or their anhydrides.

The epoxy(metha)acrylate is those obtained by addition-reacting unsaturated carboxylic acids such as (metha)acrylic acids with epoxy resins. There may be exemplified epoxy (metha)acrylates of bisphenol A type epoxy resins, epoxy (metha)acrylates of phenol or cresol novolac type epoxy resins and (metha)acrylic acid addition reaction materials of diglycidyl ether as a polyether.

The compound (b) preferably has two or more and particularly three or more ethylenic unsaturated bonds from the viewpoint of crosslinking radical polymerizable compounds or radical reactive (except for radical polymerization) compounds three-dimensionally.

As the compound (b), those having alkali-soluble and hydrophilic functional groups such as a carboxyl group, phenolic hydroxyl group, sulfonic acid group and hydroxyl group may be used to improve the alkali developing ability of the photosensitive resin composition in the case of using the photosensitive resin composition as a resist forming a pattern by exposure in applications such as electronic parts, color filters or the like.

A macro molecular compound maybe compounded as a binder component in the photosensitive resin composition to regulate the film forming property of the composition in an uncured state and the physical properties of the cured coating layer. As the macro molecular compound, all known macro molecular compounds may be used. There may be exemplified, though not limited to, all known macro molecular compounds such as organic polyisocyanates such as tolylenediisocyanate, 4,4'-diphenylmethanediisocyanate, 4,4'-dicyclohexylmethanediisocyanate, hexamethylenediisocyanate and isophoronediisocyanate; polymers and copolymers of acryl or vinyl compounds such as vinyl acetate, vinyl chloride, acrylates and methacrylates; styrene type resins such as polystyrene; acetal resins such as formal resins and butyral resins; silicone resins; phenoxy resins; epoxy resins typified by bisphenol A type epoxy resins; urethane resins such as polyurethane; phenol resins; ketone resins; xylene resins; polyamide resins; polyimide resins; polyether resins; polyphenylene ether resins; polybenzoxazole resins; cyclic polyolefin resins; polycarbonate resins; polyester resins; polyarylate resins; polystyrene resins; novolac resins; alicyclic polymers such as polycarbodiimide, polybenzoimidazole and polynorbornane; siloxane type polymers. These compounds may be used either independently or in combinations of two or more. Each of these macro molecular compounds preferably has a weight average molecular weight of 10,000,000 or less in usual though depending on the use of the photosensitive resin composition. An excessively large molecular weight brings about a deterioration in solubility and processability.

The amount of the compound (a) in the resin composition according to the present invention is preferably 0.1% by weight or more based on the whole solid of the photosensitive resin composition from the viewpoint of preventing a retardation in the curing speed of the resin composition when irradiated with light and preventing a drop in the strength and glass transition temperature of the coating layer which drop is due to decreased crosslinking density caused by a reduction in the amount of the generated radicals. The amount of the compound (a) is more preferably 1% by weight or more from the viewpoint of sensitivity and the physical properties of the coating layer. In this case, the mixing ratio of the compound (a) to the compound (b) is optionally selected according to the object taking various material physical properties into account. It is to be noted that the solid content of the photosensitive resin composition means the whole components other than solvents and a liquid monomer component is included in the solid content.

In the case of using a combination of the compound (b) and other radical reactive compounds as the curable reactive compound, the amount of the compound (a) is appropriately adjusted according to the type and amount of the radical reactive compound to be combined.

The amount of the compound (b) is preferably 1% by weight or more based on the whole solid content of the photosensitive resin composition to obtain sufficient photocurability. The photosensitive resin composition may contain a macro molecular weight binder component other than the component (b). In this case, the amount of the binder component is preferably 1% by weight or more and 97% by weight or less based on the solid content of the whole of the resin composition according to the use. When the amount of the macro molecular weight binder component containing no ethylenic unsaturated bond is more than 97% by weight, photocurability tends to be deteriorated.

Also, since the compound (a) is a hydrogen-drawing type radical generator, it is preferable to compound a hydrogen donor in the resin composition from the viewpoint of more improving the efficiency of generation of radicals and bettering sensitivity. Examples of the hydrogen-donating group of the hydrogen donor include functional groups such as an alkyl group in which hydrogen is directly bonded to carbon and organic groups having an amine, thiol, hydroxyl group or ether bond which is usually used as a hydrogen-donating group. Particularly, organic groups having a thiol, amine, hydroxyl group and an ether bond which easily provide hydrogen are preferable in view of sensitivity. It is said that as to the ether bond, hydrogens of a hydrocarbon structure (alkane and alkene) adjacent to the ether bond is easily drawn. Therefore, the hydrogen-donating group containing an ether bond preferably has a structure having such a hydrogen.

The proportion of the hydrogen-donating group contained in the hydrogen donor is preferably the same as or more than the number of the mols of the naphthalimide part in the resin composition from the viewpoint of sensitivity. However, a proper value can be arbitrarily selected depending on relation between sensitivity and the physical properties of the coating layer obtained finally.

When the photosensitive resin composition of the present invention is cured by ultraviolet rays, other photoradical generator may be used as required together with the compound (a) to promote a radical reaction. When other photoradical generator is used together with the compound (a), the other photoradical generator possibly produces decomposition materials, giving rise to problems concerning discoloration and physical properties of the cured film, vaporization of decomposition materials and stability and preserving ability of the photosensitive resin composition or the like. However, because the amount of the other photoradical generator can be decreased by using the compound (a) together, the above problems arise with more difficulty than in the case of using only other photoradical generator. Even if these problems arise, the problematic level is low. Therefore, the problems due to the photoradical generator can be suppressed to a practically allowable level while a sufficient radical reactivity is allowed to be exhibited.

Examples of the other photoradical generator include benzoins and their alkyl ethers such as benzoin, benzoinmethyl ether, benzoin ethyl ether and benzoin isopropyl ether; acetophenones such as acetophenone, 2,2-dimethoxy-2-phenylacetophenone, 2,2-diethoxy-2-phenylacetophenone, 1,1-dichloroacetophenone, 1-hydroxyacetophenone, 1-hydroxycyclohexyl phenyl ketone and 2-methyl-1-[4-(methylthio)phenyl]-2-morpholino-propan-1-one; anthraquinone such as 2-methylanthraquinone, 2-ethylanthraquinone, 2-tertiary butylanthraquinone, 1-chloroanthraquinone and 2-amylanthraquinone; thioxanthone such as 2,4-dimethylthioxanthone, 2,4-diethylthioxanthone, 2-chlorothioxanthone and 2,4-diisopropylthioxanthone; ketals such as acetophenonedimethylketal and benzylmethylketal; monoacylphosphine oxides such as 2,4,6-trimethylbenzoyldiphenylphosphine oxide or bisacylphosphine oxides; benzophenons such as benzophenone; and xanthones.

These photoradical generators may be used in combination with a photopolymerization-initiation promoter such as benzoic acid types and amine types. The proportion of these photoinitiator is preferably 0.1% by weight or more and 35% by weight or less and more preferably 1% by weight or more and 10% by weight or less based on the whole solid content of the resin composition.

Other than the above, various organic or inorganic low-molecular or macro molecular compounds may be compounded to provide processability and various abilities to the photosensitive resin compositions according to the present invention. For example, dyes, surfactants, leveling agents, plasticizers, microparticles and sensitizers or the like may be used. Examples of the microparticles include organic microparticles such as polystyrene and polytetrafluoroethylene and inorganic microparticles such as colloidal silica, carbon and phyllosilicate. Examples of the function or form of these microparticles include pigments, fillers and fibers.

The proportion of these optional components is preferably in a range from 0.1% by weight to 95% by weight based on the whole solid content of the resin composition. If the proportion is less than 0.1% by weight, it is difficult to exhibit the effect of the added additives whereas if the proportion exceeds 95% by weight, the ratio of the resin composition is small and thus it is difficult to reflect the characteristics of the resin composition upon a final product.

When components absorbing the light emitted from a irradiation light source are compounded in a large amount in the photosensitive resin composition, the light insufficiently reaches the compound (a), decreasing sensitivity. Components other than the compound (a) preferably has a transmittance of 20% or more in a wavelength range where the emitting wavelength of a irradiation light source is overlapped on the absorption wavelength of the compound (a) contained in the resin composition from the viewpoint of regarding the sensitivity of contained in the photosensitive resin composition as important.

The photosensitive resin composition according to the present invention may be diluted with a solvent to bring the concentration to a proper one. Given as examples of the solvent are various common solvents including ethers such as diethyl ether, tetrahydrofuran, dioxane, ethylene glycol dimethyl ether, ethylene glycol diethyl ether, propylene glycol dimethyl ether and propylene glycol diethyl ether; glycol monoethers (so-called cellosolves) such as ethylene glycol monomethyl ether, ethylene glycol monoethyl ether, propylene glycol monomethyl ether, propylene glycol monoethyl ether, diethylene glycol monomethyl ether and ethylene glycol monoethyl ether; ketones such as methyl ethyl ketone, acetone, methyl isobutyl ketone, cyclopentanone and cyclohexanone; esters such as ethyl acetate, butyl acetate, n-propyl acetate, i-propyl acetate, n-butyl acetate, i-butyl acetate, acetates of the aforementioned glycol monoethers (e.g., methylcellosolve acetate and ethylcellosolve acetate), methoxypropyl acetate, ethoxypropyl acetate, dimethyl oxalate, methyl lactate and ethyl lactate; alcohols such as ethanol, propanol, butanol, hexanol, cyclohexanol, ethylene glycol, diethylene glycol and glycerol; halogenated hydrocarbons such as methylene chloride, 1,1-dichloroethane, 1,2-dichloroethylene, 1-chloropropane, 1-chlorobutane, 1-chloropentane, chlorobenzene, bromobenzene, o-dichlorobenzene and m-dichlorobenzene; amides such as N,N-dimethylformamide and N,N-dimethylacetamide; pyrrolidones such as N-methylpyrrolidone; lactones such as γ-butyrolactone; sulfoxides such as dimethylsulfoxide; and other organic polar solvents; and further aromatic hydrocarbons such as benzene, toluene and xylene and organic non-polar solvents. Also, compounds having a reactive group in their structures, such as ethylenic unsaturated compounds which are liquids at ambient temperature may be used as a reactive diluent. These solvents are used either independently or in combinations. Also, these solvents may be used after they are filtered to remove impurities by known various methods, for example, using, for example, a filter having a pore diameter of about 0.05 μm to 0.2 μm in general.

The resin composition according to the first aspect may be prepared by mixing the compound (a), the compound (b) and further, optional components corresponding to the case or uses, with stirring or the like.

The photosensitive resin composition obtained in such manner according to the first aspect may be used in all known fields and products, such as pattern-forming materials (resists), coating materials, printing inks, adhesives, fillers, molding materials and three-dimensional articles, using materials which are cured or changed in solubility by irradiation with light. Particularly, it is suitable for those which are required thermal resistance and a high reliability, such as forming paints, printing inks, color filters, electronic parts, layer insulation films, wire cover films, optical materials, optical circuits, optical circuit parts, antireflection films, holograms or building materials.

In the case of, for example, the color filters, the pixel portion, light-shading portion (black matrix) disposed at the boundary of the pixels, protective layer and spacer for keeping a cell gap may be formed of a cured product of the above described photosensitive resin composition.

In the case of the electronic parts, an under-filling agent and a sealing agent used in semiconductor devices may be exemplified.

As to the layer insulation films, layer insulation films for build-up substrates, layer insulation films in fuel cells and insulation coatings of car parts and domestic electric products, for which the thermal resistance and the reliability to insulation are required, may be formed of a cured product of the photosensitive resin composition.

Also, as the wire protective films, solder resists which are wire protective layers on the surface of printed boards and wire surface covers may be exemplified.

In the case of the optical materials, overcoats of various optical lenses, antireflection films, optical waveguides, optical circuit parts such as wave dividers and relief type or volume type holograms may be exemplified.

In the case of the building materials, wall papers, wall materials, floor materials and other surface covering materials reduced in volatile components, adhesives/pressure sensitive adhesives and inks may be exemplified.

The print product, color filter, electronic parts, layer insulation film, wire cover film, optical material, optical circuit, optical circuit parts, antireflection film, hologram or building material according to the present invention has high thermal resistance and stability and therefore has such a merit that productive yield is high since at least a part of each is formed of a cured product of the photosensitive resin composition having high thermal resistance and stability.

Examples According to the First Aspect

A1. Preparation of a Photoradical Polymerization Initiator

Example A1

A 1 L eggplant-shape flask was charged with 19.8 g (0.1 mol) of 1,8-naphthalic acid anhydride, 500 mL of N,N-dimethylformamide (hereinafter referred to as DMF) and a catalytic amount of pyridine, and stirred. To there, 6.7 g (0.11 mol) of 2-aminoethanol was added dropwise, which was then stirred at ambient temperature for 4 hours and then at 130° C. for 5 hours. DMF was removed by a rotary evaporator, and followed by re-crystallizing from methanol to obtain 22.5 g of N-2-hydroxyethylnaphthalimide as needle crystals (compound A1).

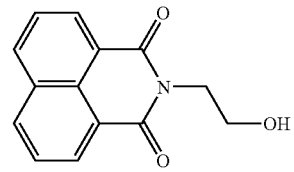

Compound A1

Example A2

A reaction was run in the same condition as in Example A1 except that the acid anhydride as the starting material was altered to 4-bromo-1,8-naphthalic acid anhydride. Each raw material was supplied in the same number of mols as in Example A1 (compound A2).

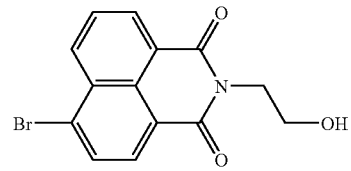

Compound A2

Example A3

A 1 L eggplant-shape flask was charged with 19.8 g (0.1 mol) of 1,8-naphthalic acid anhydride, 500 mL of DMF and a catalytic amount of pyridine, and stirred. To there, 8.9 g (0.1 mol) of β-alanine was added, which was then stirred at ambient temperature for 4 hours, and then at 130° C. for 5 hours. DMF was removed by a rotary evaporator, and followed by re-crystallizing from methanol to obtain 20.9 g of a compound A3 provided with a carboxyl group at its terminal as crystals (compound A3).

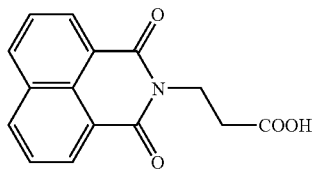
Compound A3

Example A4

A reaction was run in the same condition as in Example A1 except that the amine as the starting material was altered to N,N-dimethylethylenediamine. Each raw material was supplied in the same number of mols as in Example A1 (compound A4).

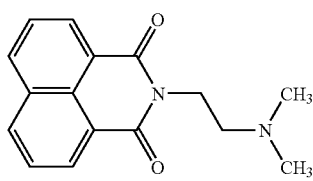
Compound A4

Example A5

A reaction was run in the same condition as in Example A1 except that the amine as the starting material was altered to 2-(2-aminoethoxy) ethanol, to obtain a compound A5 provided with a hydroxyl group at its terminal. Each raw material was supplied in the same number of mols as in Example A1 (compound A5).

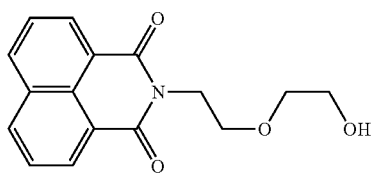
Compound A5

Example A6

A reaction was run in the same condition as in Example A1 except that the amine as the starting material was altered to 2-(2-aminoethoxy)ethanol and the acid anhydride as the starting material was altered to 4-bromo-1,8-naphthalic acid anhydride, to obtain a compound A6 provided with a hydroxyl group at its terminal. Each raw material was supplied in the same number of mols as in Example A1 (compound A6).

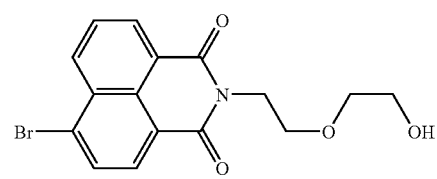
Compound A6

Example A7

A reaction was run in the same condition as in Example A1 except that the amine as the starting material was altered to 2-methoxyethylamine, to obtain a compound A7 provided with a hydroxyl group at its terminal. Each raw material was supplied in the same number of mols as in Example A1 (compound A7).

Compound A7

Example A8

A reaction was run in the same condition as in Example A1 except that the amine as the starting material was altered to 2-methoxyethylamine and the acid anhydride as the starting material was altered to 4-bromo-1,8-naphthalic acid anhydrode, to obtain a compound A8 provided with a hydroxyl group at its terminal. Each raw material was supplied in the same number of mols as in Example A1 (compound A8).

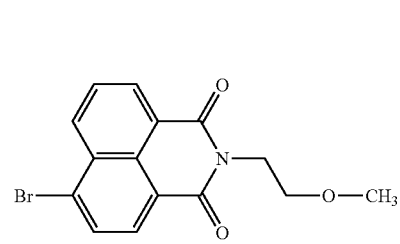
Compound A8

Example A9

A reaction was run in the same condition as in Example A1 except that the amine as the starting material was altered to L-valinol, to obtain a compound A9 provided with a hydroxyl group at its terminal. Each raw material was supplied in the same number of mols as in Example A1 (compound A9).

Compound A9

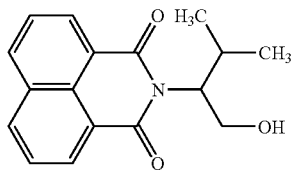

Example A10

A reaction was run in the same condition as in Example A1 except that the amine as the starting material was altered to L-valinol and the acid anhydride as the starting material was altered to 4-bromo-1,8-naphthalic acid anhydride, to obtain a compound A10 provided with a hydroxyl group at its terminal. Each raw material was supplied in the same number of mols as in Example A1 (compound A10).

Compound A10

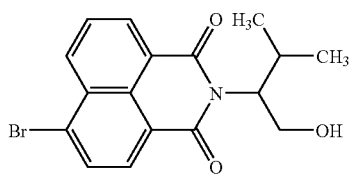

Example A11

A reaction was run in the same condition as in Example A1 except that the acid anhydride as the starting material was altered to 4-chloro-1,8-naphthalic acid anhydride. Each raw material was supplied in the same number of mols as in Example A1 (compound A11).

Compound A11

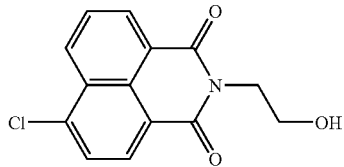

Example A12

A reaction was run in the same condition as in Example A1 except that the amine and the acid anhydride as the starting materials were altered to 2-(2-aminoethoxy)ethanol and 4-chloro-1,8-naphthalic acid anhydride respectively, to obtain a compound A12 provided with a hydroxyl group at its terminal. Each raw material was supplied in the same number of mols as in Example A1.

Compound A12

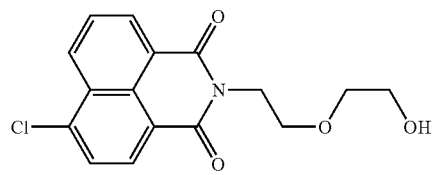

Example A13

A reaction was run in the same condition as in Example A1 except that the amine and the acid anhydride as the starting materials were altered to 2-(2-aminoethoxy)ethanol and 4-nitro-1,8-naphthalic acid anhydride respectively, to obtain a compound A13 provided with a hydroxyl group at its terminal. Each raw material was supplied in the same number of mols as in Example A1.

Compound A13

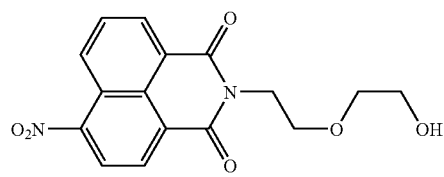

Example A14

A reaction was run in the same condition as in Example A1 except that the amine and the acid anhydride as the starting materials were altered to 2-(2-aminoethoxy)ethanol and 3-nitro-1,8-naphthalic acid anhydride respectively, to obtain a compound A14 provided with a hydroxyl group at its terminal. Each raw material was supplied in the same number of mols as in Example A1.

Compound A14

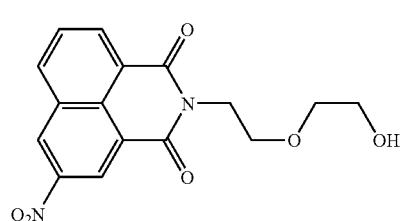

Example A15

A reaction was run in the same condition as in Example A1 except that the amine and the acid anhydride as the starting materials were altered to 2-methoxyethylamine and 4-chloro- 1,8-naphthalic acid anhydride respectively, to obtain a compound A15 provided with a hydroxyl group at its terminal. Each raw material was supplied in the same number of mols as in Example A1.

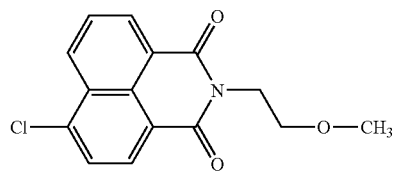

Compound A15

Example A16

A reaction was run in the same condition as in Example A1 except that the amine and the acid anhydride as the starting materials were altered to L-valinol and 4-chloro-1,8-naphthalic acid anhydride respectively, to obtain a compound A16 provided with a hydroxyl group at its terminal. Each raw material was supplied in the same number of mols as in Example A1.

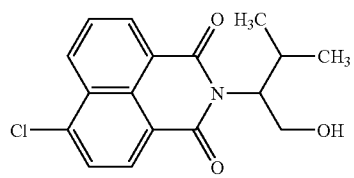

Compound A16

Example A17

2.74 g (10 mmol) of the aforementioned compound A15 was poured into a 1 L three-neck flask and dissolved in 500 mL of isopropyl alcohol, which was stirred at ambient temperature. To there, an isopropyl alcohol solution of sodium isopropoxide obtained by reacting 1 g of metal sodium with 200 mL of dry isopropyl alcohol was added dropwise to trace the process of the reaction by TLC (thin layer chromatography). The dropwise addition was continued until the spot of the compound 15 which was the starting material disappeared, and the reaction was finished when the spot of the compound 15 disappeared. The reaction solution was poured into 5 L of pure water. The precipitate was dried and then purified by column chromatography to obtain a compound A17.

Compound A17

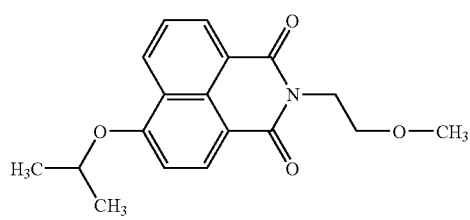

A2. Preparation of a Photosensitive Resin Composition

Examples A18 to A34, Comparative Examples A1 to A3

Each of the compounds A1 to A17 obtained in Examples A1 to A17, cyclohexylmaleimide (comparative compound A1) represented by the formula shown below and manufactured by Aldrich Corporation, Irgacure 907 as a photoradical generator (trademark: manufactured by Ciba Specialty Chemicals) (comparative compound A2) and benzophenone (manufactured by Tokyo Kasei Kogyo Co., Ltd.) (comparative compound A3) is mixed with Trifunctional Acrylate M-305 (trademark: manufactured by Toagosei Co., Ltd.) such that the mol ratio of each compound to the ethylenic double bond of the trifunctional acrylate, namely (compound/ethylenic double bond) was 1/100. Then it was dissolved in a proper solvent, such as chloroform, tetrahydrofuran or the like, which was selected according to the compound, to produce photosensitive resin compositions A18 to A34 of Examples A18 to A34 respectively and the comparative compositions A1 to A3 of Comparative Examples A1 to A3.

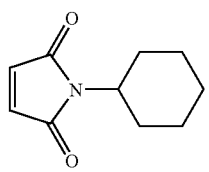

Comparative compound A1

Examples A35 to A51, Comparative Examples A4 to A6

Triethanolamine was added as a hydrogen donor to each of the photosensitive resin compositions A18 to A34 and the comparative compositions A1 to A3 in an amount by mol equivalent to that of the photoradical-generating part to produce photosensitive resin compositions A35 to A51 of Examples A35 to A51 and the comparative compositions A4 to A6 of Comparative Examples A4 to A6.

A3. Test of Evaluation (1) Evaluation of Thermal Resistance

Using a differential type differential thermal balance TG8120 (trademark: manufactured by Rigaku Corporation), the 95% heat decomposition temperature of each of the compounds A1 to A17 and the comparative Compounds A1 and A2 was measured at a temperature rise rate of 10° C./min in a nitrogen atmosphere. The results of Measurement are shown in Table A1. From these results, the 95% heat decomposition temperature of the compounds A1 to A17 was 229° C. (compound 7) at the lowest, showing that these compounds A1 to A17 had significantly higher heat stability than cyclohexylmaleimide (95% heat decomposition temperature: 123° C.) which was the comparative compound A1 and than Irgacure 907 (95% heat decomposition temperature: 207° C.) which was the comparative compound A2.

TABLE A1

| Compound No. | 95% heat decomposition temperature (° C.) |
|---|---|
| A1 | 260 |
| A2 | 273 |
| A3 | 279 |
| A4 | 253 |

TABLE A1-continued

| Compound No. | 95% heat decomposition temperature (° C.) |
|---|---|
| A5 | 268 |
| A6 | 279 |
| A7 | 229 |
| A8 | 239 |
| A9 | 229 |
| A10 | 262 |
| A11 | 271 |
| A12 | 278 |
| A13 | 272 |
| A14 | 275 |
| A15 | 238 |
| A16 | 244 |
| A17 | 251 |
| Comparative Example A1 (cyclohexylmaleimide) | 123 |
| Comparative Example A2 (Irgacure 907) | 207 |

(2) Evaluation of Ultraviolet Absorption

Figure 2:
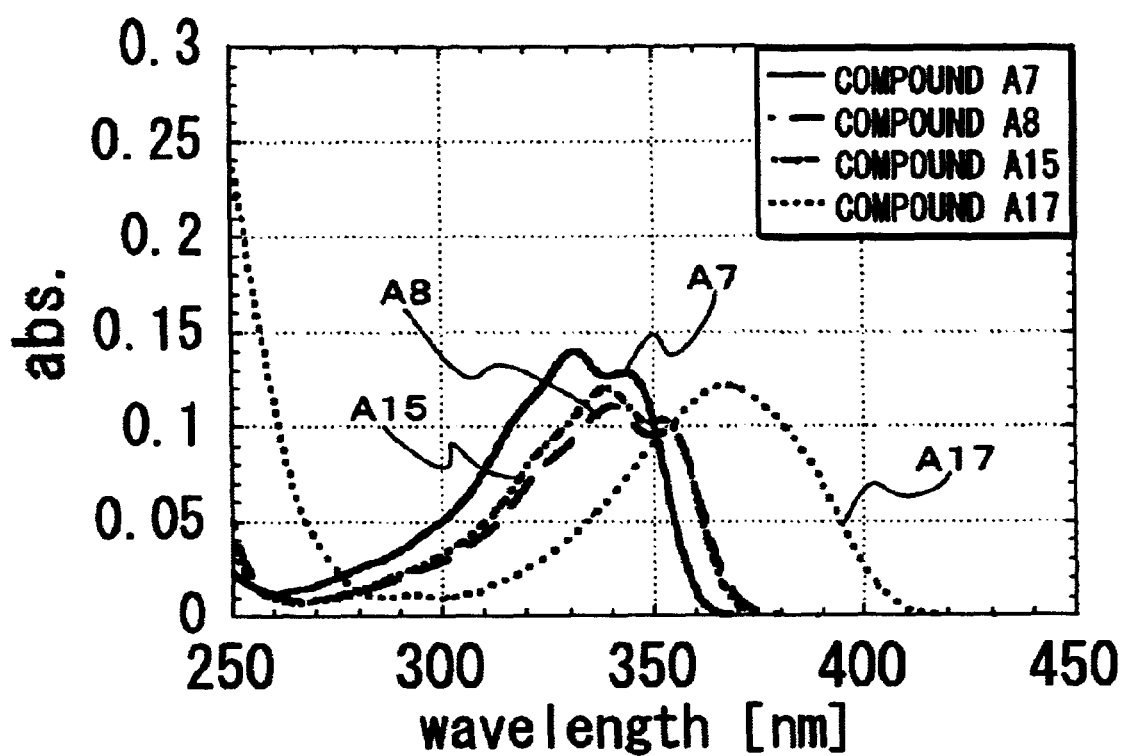
FIG. 2 is a graph showing the results of measurement of an ultraviolet absorption spectrum (compounds A7, A8, A15 and A17) in an example according to a first aspect.

Using an acetonitrile solution containing $1.0 \times 10^{-5}$ mol/L of each of the compounds A1, A2, A5 to A10, A11, A12 and A15 to A17, each ultraviolet absorption spectrum was measured. The results of measurement are shown in Table A2. Particularly, the results of measurement of the compounds A1 and A2 are shown in the graph of FIG. 1 and the results of measurement of the compounds A7, A8, A15 and A17 are shown in the graph of FIG. 2.

From these results, the compounds A1, A5, A7 and A9 having no substituent have a maximum at 330 nm in a solution. It is inferred that this maximum is due to excitation based on π-π* transition from the molar extinction coefficient at this wavelength.

It can be estimated from the molar extinction coefficient that what transition state the absorption corresponds to. Generally, with increased molar extinction coefficient, light is more absorbed, namely, an excitation is made more easily, radicals are generated more easily and a crosslinking reaction proceeds more easily. As a consequence, a molecule having a large molar extinction coefficient at exposure wavelength is better from the viewpoint of sensitivity.

Also, in the case of the compounds A2, A6, A8 and A10 into which bromine is introduced and the compounds A11, A12, A15 and A16 into which chlorine is introduced, at the fourth position of the naphthalimide group, these compounds respectively have the maximum wavelength shifted by about 10 nm to a longer wavelength side as compared with the unsubstituted compounds and have strong absorption at a wavelength of 365 nm which is the emitting wavelength of a high pressure mercury lamp. Also, the compound A17 into which an isopropyl ether group is introduced as a substituent has the maximum absorption at 365 nm, to find that it has very strong absorption at 365 nm which is the emission wavelength of a high pressure mercury lamp.

The generation of radicals by naphthalimide is considered to be due to hydrogen-drawing. In general, the generation of radicals due to hydrogen-drawing is said to be caused by the triplet excited state of a carbonyl group. It is considered that when the ratio of the absorbed energy to be consumed for fluorescent emission and thermal deactivation is large even if a compound is excited, the efficiency of generation of radicals drops.

When the ratio of such a deactivation process other than hydrogen-drawing is small, the stronger the absorption at the exposure wavelength is, the more easily the photosensitive compound is excited, and therefore, the efficiency of generation of radicals is considered to be improved. Thus, it is expected that the compounds A2, A6, A8, A10, A11, A12, A15, A16 and A17 are more improved than the unsubstituted compounds A1, A5, A7 and A9 in sensitivity to a wavelength of 365 nm.

TABLE A2

| Compounds | Substituent on part of Naphthalimide | $\lambda_{max}$ (nm) | Maximum molar Extinction Coefficient | Molar extinction Coefficient at 365 nm |
|---|---|---|---|---|
| A1 | — | 330 | 12,100 | 200 |
| A2 | Br | 340 | 14,500 | 4200 |
| A5 | — | 330 | 12,500 | 300 |
| A6 | Br | 340 | 13,800 | 3700 |
| A7 | — | 330 | 12,100 | 200 |
| A8 | Br | 340 | 11,100 | 2800 |
| A9 | — | 330 | 11,000 | 300 |
| A10 | Br | 340 | 16,700 | 5400 |
| A11 | Cl | 340 | 12,100 | 2100 |
| A12 | Cl | 340 | 12,300 | 2300 |
| A15 | Cl | 340 | 12,000 | 2200 |
| A16 | Cl | 340 | 11,700 | 2000 |
| A17 | iPrO | 365 | 12,200 | 12200 |

(3) Evaluation 1 of Curability

The photosensitive resin compositions A18 to A34 and the comparative compositions A1 to A3 were respectively applied by spin coating to a glass substrate on which chromium was sputtered to obtain coating layers.

A decrement of the peak at 810 cm$^{-1}$ was recorded with time by using an infrared spectrometer while exposing the above coating layer to ultraviolet rays, to confirm the degree of the disappearance of a double bond. The atmosphere around the sample during measurement was replaced with nitrogen. As the UV exposure apparatus, UV Spot Cure SP-III type (standard reflecting mirror type) manufactured by Ushio Inc. was used and as the UV lamp, USH-255 BY manufactured by Ushio Inc. was used. Also, as the infrared spectrometer, FT S6000 manufactured by BIO RAD was used.

The compatibility with a trifunctional acrylate M305, odors during curing, a decrement of a double bond in relation to exposure amount (reaction rate) and coloring of the coating layer were observed. The results are shown in Table A3.

The photosensitive resin compositions A18 to A34 use a compound having a naphthalimide part and the photosensitive resin compositions provided with the compound compatible with M305 which is an acryl monomer is highly reactive. This is considered to be because the diffusion of radicals generated from the reason that the naphthalimide group-containing compound is compatible with M305 proceeds to run a reaction.

The comparative composition A1 uses the comparative compound A1 having a maleimide group. Although the comparative compound A1 is compatible with M305, the reaction does not proceed so much. This is also the same to the comparative composition A3 containing the comparative compound A3 (benzophenone) which is the same hydrogen-drawing type radical generator. Irg 907 which is a commercially available photoradical generator has a high reaction rate so that the reaction proceeds satisfactorily. However, because it is a self-cleavage type radical generator, impurities arise in the coating layer, causing coloring in the comparative composition A2 containing Irg 907.

TABLE A3

| Photosensitive Compositions | Compound No. | Compatability with Trifunctional Acrylate M305 | Odors During Exposure | Reaction Rate (%) Exposure Amount (ml/cm²) 50 | 100 | 400 | Coloring of Coating Layer |
|---|---|---|---|---|---|---|---|
| A18 | A1 | ○ | None | 0.9 | 3.2 | 32.2 | Transparent |
| A19 | A2 | Δ | None | 1.2 | 6.6 | 33.3 | Pale white |
| A20 | A3 | X | None | 0.6 | 1.0 | 3.6 | Cloudy |
| A21 | A4 | ○ | None | 0.5 | 0.5 | 1.1 | Transparent |
| A22 | A5 | ○ | None | 2.7 | 5.1 | 25.0 | Transparent |
| A23 | A6 | ○ | None | 5.3 | 13.9 | 34.1 | Pale yellow |
| A24 | A7 | ○ | None | 1.0 | 2.5 | 26.6 | Transparent |
| A25 | A8 | X | None | 1.7 | 3.4 | 18.5 | Cloudy |
| A26 | A9 | ○ | None | 2.0 | 4.3 | 24.8 | Transparent |
| A27 | A10 | ○ | None | 18.0 | 26.1 | 41.9 | Pale yellow |
| A28 | A11 | X | None | 0.8 | 1.4 | 14.7 | Cloudy |
| A29 | A12 | X | None | 1.2 | 4.5 | 14.3 | Cloudy |
| A30 | A13 | X | None | 0.4 | 1.0 | 9.2 | Pale brown |
| A31 | A14 | X | None | 0.8 | 1.2 | 7.1 | Pale brown |
| A32 | A15 | X | None | 9.7 | 16.2 | 29.3 | Cloudy |
| A33 | A16 | ○ | None | 0.4 | 1.0 | 12.2 | Transparent |
| A34 | A17 | ○ | None | 0.6 | 2.4 | 9.9 | Pale yellowish green |
| Comparative A1 | Comparative A1 (Cyclohexylmaleimide) | ○ | None | 0.7 | 0.6 | 71.7 | Transparent |
| Comparative A2 | Comparative A2 (Irgacure 907) | ○ | Present | 34.8 | 40.8 | 50.6 | Yellow |
| Comparative A3 | Comparative A3 (Benzophenone) | ○ | Slightly present | 1.0 | 1.8 | 4.7 | Transparent |

(4) Evaluation 2 of Curability

In order to confirm whether or not the naphthalimide part was a hydrogen-drawing type radical generator, the photosensitive resin compositions A35 to A51 containing triethanolamine and the comparative compositions A2 to A6 were used to measure or observe the compatibility with a trifunctional acrylate M305, odors during curing, a decrement of a double bond in relation to exposure amount (reaction rate) and coloring of the coating layer in the same procedures as in the aforementioned evaluation 1 of curabilit. The results are shown in Table A4. It is to be noted that Irgacure 907 (comparative compound A2) was clearly a self-cleavage type and therefore the evaluation 2 of curability was omitted.

From the results of the photosensitive resin compositions A35 to A51, it was confirmed that each reaction rate of the compounds A1 to A17 was improved by addition of triethanolamine. Particularly, a rise in reaction rate at a low exposure amount was observed. Namely, it is considered that the naphthalimide group is improved in sensitivity by exposing it to light in the condition that a hydrogen-donating group is made to coexist.

TABLE A4

(triethanolamine is added)

| Photosensitive Compositions | Compound No. | Compatibility with Trifunctional Acrylate M305 | Odors during Exposure | Reaction rate (%) Exposure Amount (mJ/cm²) 50 | 100 | 400 | Coloring of Coating Layer |
|---|---|---|---|---|---|---|---|
| A35 | A1 | ○ | None | 4.2 | 7.4 | 17.0 | Transparent |
| A36 | A2 | Δ | None | 3.3 | 5.8 | 14.1 | Pale white |
| A37 | A3 | X | None | 1.7 | 3.6 | 12.6 | Cloudy |
| A38 | A4 | ○ | None | 0.6 | 1.1 | 4.2 | Transparent |
| A39 | A5 | ○ | None | 5.7 | 9.6 | 23.3 | Transparent |
| A40 | A6 | ○ | None | 6.6 | 11.1 | 23.8 | Pale yellow |
| A41 | A7 | ○ | None | 3.3 | 5.4 | 11.1 | Transparent |
| A42 | A8 | X | None | 1.7 | 3.4 | 8.8 | Cloudy |
| A43 | A9 | ○ | None | 3.0 | 5.7 | 17.1 | Transparent |
| A44 | A10 | ○ | None | 4.7 | 8.3 | 21.4 | Pale yellow |
| A45 | A11 | X | None | 0.8 | 2.4 | 8.1 | Cloudy |
| A46 | A12 | X | None | 2.2 | 3.0 | 9.7 | Cloudy |
| A47 | A13 | X | None | 6.8 | 8.8 | 13.0 | Pale brown |
| A48 | A14 | X | None | 2.7 | 4.4 | 10.3 | Pale brown |
| A49 | A15 | X | None | 2.3 | 3.1 | 8.2 | Cloudy |
| A50 | A16 | ○ | None | 1.4 | 2.6 | 7.3 | Transparent |

TABLE A4-continued (triethanolamine is added)

| Photosensitive Compositions | Compound No. | Compatability with Trifunctional Acrylate M305 | Odors during Exposure | Reaction rate (%) Exposure Amount (mJ/cm$^2$) | | | Coloring of Coating Layer |
|---|---|---|---|---|---|---|---|
| | | | | 50 | 100 | 400 | |
| A51 | A17 | ○ | None | 5.7 | 8.2 | 16.4 | Pale yellowish green |
| Comparative A4 | Comparative A1 (Cyclohexylmaleimide) | ○ | None | 0.7 | 0.6 | 1.7 | Transparent |
| Comparative A5 | Comparative A2 (Irgacure 907) | — | — | — | — | — | — |
| Comparative A6 | Comparative A3 (Benzophenone) | ○ | Slightly Present | 0.2 | 0.7 | 1.3 | Transparent |

From these results, it is understood that the naphthalimide compound is transparent and is a photoradical generator generating neither odors nor volatile materials.

The compound A17 has no large reaction rate though it has strong absorption of light having an exposure wavelength. To confirm this fact, the fluorescent spectrum of an acetonitrile solution containing $1.0 \times 10^{-5}$ mol/L of each of the compounds A7, A15 and A17 was measured. The excitation wavelengths of these compounds were 330 nm, 340 nm and 365 nm which were the maximum absorption wavelengths respectively. The results of measurement are shown in Table A5.

TABLE A5

| Compounds | Excitation Wavelength | Maximum Emission Wavelength | Emission Intensity |
|---|---|---|---|
| A7 | 330 nm | 380 nm | 15.5 |
| A15 | 340 nm | 390 nm | 10.5 |
| A17 | 365 nm | 490 nm | 160 |

From this result, it is understood that the compound A17 emits fluorescent light more strongly than other naphthalimide compounds. It is therefore estimated that the reaction rate is not large so much because it releases absorbed energy. Also, it is thought that the compound A15 has a small emission intensity owing to a heavy atom effect since the compound A15 has chlorine as a substituent. From these results, the fluorescent emission is considered to be preferably small in the case of seeking for high sensitivity.

(5) Solubility in Monomer Components

As to the compounds A2, A6 and A10 in which the fourth position of the aromatic ring of the naphthalimide part was substituted with bromine and which had a hydroxyl group at the terminal of the side chain extended from nitrogen, the solubility at 20° C. in the trifunctional monomer M305 (trademark: manufactured by Toagosei Co., Ltd.) which was the matrix in the above described curability evaluation was found to confirm the relationship between the solubility in a matrix and the reaction rate in the case of photo-curing a (metha) acryloyl type polyfunctional monomer by naphthalimide. A saturated concentration at 20° C. in methylacrylate was also found to generalize the evaluation of solubility. The results are shown in Table A6.

TABLE A6

| Compound | Saturated Concentration (mol/L) | | Reaction rate (%) | |
|---|---|---|---|---|
| | Methacrylate | M305 | 50 mJ/cm$^2$ | 100 mJ/cm$^2$ |
| A2 | 0.01 | 0.006 | 1.2 | 6.6 |
| A6 | 0.05 | 0.014 | 5.3 | 13.9 |
| A10 | 0.44 | 0.041 | 18.0 | 26.1 |

It is found from these results that a sample having better solubility has a higher reaction rate; specifically, when the naphthalimide part has the same structure, solubility in the matrix is changed corresponding to the structure of the side chain extended from the nitrogen atom of the imide bond and a high reaction rate is obtained despite a small exposure amount by improving this solubility.

(6) Evaluation of Out-Gas

Each of the photosensitive resin compositions A5, A6, A29 and A34 and the comparative composition A2 was applied by spin coating to a glass substrate and heated on a 50° C. hot plate for one minute. Then, the substrate was exposed to light from a high pressure mercury lamp at an intensity of 2000 mJ/cm$^2$ based on h-rays by using a hand-operated exposure apparatus (MA-1200, manufactured by Dainippon Screen Mfg. Co., Ltd.), to obtain a coating layer having a thickness of 25 μm.

The glass substrate provided with the coating layer formed thereon was cut into a size of 1 cm×1.5 cm. Then gas generated by heating at 250° C. for one hour was analyzed using GC-MS (QP-5000, manufactured by Shimadzu Corporation).

Other measuring conditions are as follows.

Collector: Curie Point Purge and Trap (JHS-100A type) manufactured by Japan Analytical Industry Co., Ltd.

Heating condition: 250° C.×60 min.

Adsorbent: TEMX TA (2,6-Diphenyl-p-Phenylene Oxide), weak polarity

Collecting temperature: −40° C. (using liquid nitrogen for cooling)

Heat decomposition temperature: 255° C.×30s

Inlet temperature: 250° C.

Column: 5% Phenyl-95% dimethylsiloxane (PTE-5), weak polarity, inside diameter: 0.25 μm, length: 30 m Column temperature: 50° C.×5 min (kept)–10° C./min. (temperature-up)–320° C.×3 min.(kept)

Ionization method: Electron collision ionization method (EI method)

Detector: Quadrupole type detector

As a result, decomposed materials originated from the polyfunctional monomer M305 were detected in all samples. Moreover, several types of aromatic compound which were considered to be decomposed materials originated from other photoradical generators were detected in only the coating layer formed using the comparative composition A2.

It becomes clarified from the above results that the naphthalimide compound of the present invention does not generate decomposed materials as gas originated from the initiator by heating.

The photoradical polymerization initiator according to the first aspect can cause a radical reaction when excited by applying radial rays or the like since the naphthalimide structure-containing group functions as a hydrogen-drawing type radical-generating part. The naphthalimide structure-containing group is a hydrogen-drawing type which is more stable than a self-cleavage type and also, has a naphthalene skeleton having high thermal resistance and therefore, a photoradical polymerization initiator having high stability and preserving ability can be obtained.

Also, the compound (a) can be reacted not only with an ethylenic unsaturated bond but also with various compounds such as aromatic rings and enables a polymer to be crosslinked even in the case of a resin composition having no ethylenic unsaturated bond. Therefore, the photoradical polymerization initiator according to the present invention is used as an usual photoradical polymerization initiator and also used as a crosslinking agent for a resin composition containing, for example, an aromatic polymer, to be able to improve solvent resistance of the cured coating layer.

The above compound (a) is a hydrogen-drawing type and is bonded to a reaction product such as a polymer generated by a radical reaction to constitute a part of the chemical structure of the reaction product. For this, when the compound (a) is used as a photoradical polymerization initiator, no decomposed material is left in a free state after a radical reaction and it is therefore unnecessary to carry out volatilized during post-baking unlike the case of using a self-cleavage type initiator. Also, even if the compound (a) is left unreacted, a volatile decomposed product is not produced because the radical-generating part has a naphthalimide structure having high thermal resistance.

Therefore, a problem concerning operational safety, problems concerning a decline in the reliability of a final product such as deteriorated light resistance, coloring, fading and peeling and cracks of a coating layer, a problem as to shortening of the life of a chemical solution and a problem concerning the generation of odors can be all solved.

Furthermore, a reaction for forming a maleimide structure does not proceed without a dehydration condensation reaction, for example, by heating or by using a catalyst. For this, there are various synthesis problems. In the reaction for forming a naphthalimide structure, a dehydration condensation reaction proceeds more rapidly than in the case of an imide having a five-membered cyclic structure such as maleimide and therefore the synthesis is very simpler than that of a maleimide structure. Because the solubility in a solvent is also good, which is advantageous from the viewpoint of synthesis. Productivity including yield, reaction rate, control aspect and cost aspect is therefore raised.

In the photosensitive resin composition according to the present invention, the naphthalimide structure-containing group of the photoradical polymerization initiator comprising the compound (a) functions as a hydrogen-drawing type radical-generating part and radicalized when excited by applying light to cause a radical reaction in the resin composition. The compound (b) having an ethylenic unsaturated bond in the resin composition causes radical polymerization thereby curing the composition and changing solubility.

When the photosensitive resin composition according to the first aspect is used as a pattern forming material (resist), paint or printing ink or formation materials for a color filter, electronic parts, layer insulation film, wire cover film, optical material, optical circuit, optical circuit parts, antireflection film, hologram or building material, there is such an effect that the product or film has high thermal resistance and high stability. Also, it is free from the generation of odors during exposure, which improves the operational circumstance.

The resulting printed product, color filter, electronic parts, layer insulation film, wire cover film, optical material, optical circuit, optical circuit parts, antireflection film, hologram or building material has such a merit that each product has high thermal resistance and high stability as products and films and high productive yield is therefore obtained since at least a part thereof is formed of a cured product of the photosensitive resin composition having high thermal resistance and high stability.

(2) Second Aspect of the Present Invention

Next, a radical generator according to the second aspect of the present invention will be explained. The radical generator according to the present invention comprises a compound (c) having two or more naphthalimide structure-containing groups represented by the following formula (3) in one molecule.

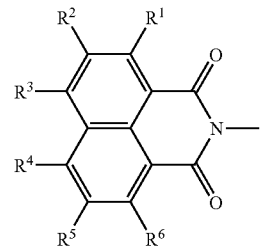

Formula (3)

wherein $R^1$, $R^2$, $R^3$, $R^4$, $R^5$ and $R^6$ respectively represent a hydrogen atom or a substituent and may be bonded to each other to form a cyclic structure.

In the compound (c), the naphthalimide structures present in one molecule may be the same structures or two or more kinds of naphthalimide structures may be intermingled in one molecule.

As to a radical generating mechanism by a naphthalimide structure-containing group, it is inferred that the naphthalimide structure absorbs light such as electromagnetic waves and radial rays to thereby generate a radical.

The radical generator according to the present invention can cause a radical reaction, initiate radical polymerization and crosslink a polymer when excited by applying light because the naphthalimide structure-containing group functions as a hydrogen-drawing type radical-generating part.

$R^1$, $R^2$, $R^3$, $R^4$, $R^5$ and $R^6$ in the naphthalimide structure-containing group represented by the formula (3) respectively represent a hydrogen atom or a substituent and may be bonded to each other to form a cyclic structure.

The aforementioned substituents $R^1$, $R^2$, $R^3$, $R^4$, $R^5$ and $R^6$ are the same as those in the aforementioned first aspect.

If the part where N of these two or more naphthalimide structure-containing groups is connected is expressed by W in the above compound (c), the compound (c) may be given by the following formula (4).

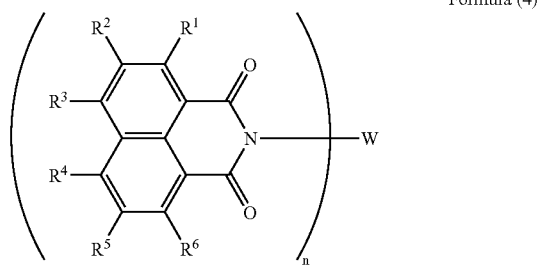

Formula (4)

wherein $R^1$, $R^2$, $R^3$, $R^4$, $R^5$ and $R^6$ are the same as those in the formula (3), W represents a chemical structure with n valencies and n denotes an integer of 2 or more.

The chemical structure W contained in the formula (4) is typically an organic group though it may have any of chemical structures having two or more valencies. Examples of the organic group include straight-chain and/or branched and/or cyclic saturated or unsaturated polyvalent alkyl groups, aryl groups and allyl groups or the like, wherein each of these groups may have one or more bonds such as a single bond, an ester bond, ether bond, thioether bond, amino bond, amide bond, urethane bond, urea bond, thiocarbamate bond, carbodiimide bond and carbonate bond.

Examples of the chemical structure having two or more valencies except for organic groups include siloxane, silane and borazine or the like.

Particularly, straight-chain or branched polyvalent alkyl groups are preferable and those having an ester bond, ether bond, amide bond, urethane bond or urea bond are more preferable from the view point of cost, availability, synthetic simplicity and solubility. Also, from the viewpoint of thermal resistance, straight-chain or branched polyvalent alkyl groups having a saturated or unsaturated cyclic structure are preferable and those having an ester bond, ether bond, amide bond, urethane bond or urea bond are more preferable.

The radical generator according to the present invention has two or more naphthalimide structure-containing groups, and it preferably has three or more naphthalimide structure-containing groups with the view of crosslinking radical polymerizable compounds or radical reactive (except for radical polymerization) compounds three-dimensionally. Also, in the case where the radical generator has a structure in which plural naphthalimide structure-containing groups of the formula (3) are bound pendant-wise with a polymer skeleton and is used as a main polymer in a photosensitive resin composition, the radical generator preferably has the naphthalimide structures in an amount equivalent to the degree of polymerization to be intended. However, the optimum value as to the number of the naphthalimide structure-containing groups may be optionally selected taking the material system to be used and the physical properties of a final coating layer into consideration.

The absorption wavelength of the radical generator is considered to be the same as that of the compound (a) according to the first aspect.

Specifically, in the radical generator, many $\pi$-bonds are connected, so that its absorption wavelength is longer than that of maleimide. Therefore, the radical generator easily has an absorption in a wavelength of 365 nm which is the major emitting wavelength of a high pressure mercury lamp and therefore has good sensitivity.

In order to improve sensitivity, it is effective to select substituents $R^1$ to $R^6$ and the center structure W properly such that the naphthalimide skeleton contained in the structure of the compound (c) takes a chemical structure which is excited by radial rays to easily produce a radical.

In order to obtain practical sensitivity, it is preferable to make a combination of the substituents $R^1$, $R^2$, $R^3$, $R^4$, $R^5$ and $R^6$ in the formula (3) so that a part of the absorption wavelength of the compound (c) overlaps on any of the emitting wavelengths of an exposure light source (irradiation light source) in a process. The absorption maximum of the compound (a) falls within a range of particularly preferably ±20% and still more preferably ±10% of the emitting wavelength closest to the absorption maximum.

The molar extinction coefficient of the compound (c) in any of the emitting wavelengths of an exposure light source (irradiation light source) in a process is preferably 0.1 or more from the viewpoint of sensitivity.

Also, in the case where the maximum molar extinction coefficient $\epsilon_{max}$ of the compound (c) is 2000 or more, it is thought that the generation of radicals and a crosslinking reaction are easily caused, which is desirable.

Other relationships between the absorption wavelength of the radical generator containing the compound (c) and the emitting wavelength of a light source are the same as in the case of the compound (a) according to the first aspect.

Since the radical generator of the present invention is a hydrogen-drawing type, a radical is scarcely generated only by heating. Also, since the base skeleton is a naphthalimide skeleton, the radical generator is scarcely decomposed by heating. Therefore, the radical generator has high thermal resistance, imparts good preserving stability to a photosensitive resin composition when compounded in the resin composition, improves the stability of the cured film which will be finally obtained and also prevents the light-resistance of the coating layer from being impaired and coloring, fading, peeling and cracks of the coating layer.

In the radical generator according to the present invention, the 90% heat decomposition temperature of the compound (c) is preferably 50° C. or more and more preferably 100° C. or more in view of thermal resistance.

Similarly to the compound (a) according to the first aspect described above, the compound (c) preferably has high solubility when compounded in a photosensitive resin composition with the intention of improving coating suitability, the transparency of the cured film and sensitivity during exposure.

Specifically, the solubility of the compound (c) in a solvent to be used for the preparation of a coating solution is preferably 0.1% by weight or more.

When high transparency is needed, all ray-transmittance (JIS K7105) is preferably 90% or more and more preferably 95% or more when the film thickness of the coating layer formed by curing a photosensitive resin composition is 10 μm.

Further, a saturated concentration of the compound (c) in methylacrylate at 20° C. is 0.01 mol/L or more when evaluating solubility by using methylacrylate as a typical monomer component.

The solubility or compatibility of the compound (c) can be improved by introducing the same substituent as those in the compound (a) into a naphthalimide ring. The solubility or compatibility of the compound (c) can also be improved by changing the structure of W or by introducing a substituent into W in the formula (4). The substituent introduced into or the structural reformation made to the naphthalimide ring or W part of the compound (c) are selected variously corresponding to a solvent in which the compound (c) is intended to be dissolved and other solid components which are intended to be solved mutually. For example, when selecting a carboxyl group as the substituent, it is easily solved in water and organic polar solvents whereas when introducing an ester, its solubility in a solvent or compound having an ester bond is improved.

A 1,8-naphthalimide compound such as those represented by the formula (3) is usually synthesized from 1,8-naphthalic acid anhydride having substituents at the first position and the eighth position of naphthalene, these substituents being bonded to form anhydride. The photoradical generator containing the compound (c) having such a chemical structure has high productivity including yield, reaction rate, control aspect and cost aspect.

The compound (c) having two or more naphthalimide structure-containing groups in the present invention may be synthesized using various known methods. Specific examples of these methods include, though not particularly limited to, a method in which naphthalic acid anhydride is reacted with a compound having plural amino groups such as diamine, triamine or tetramine, a method in which amino alcohol is reacted with naphthalic acid anhydride to synthesize N-hydroxyalkyl(allyl)naphthalimide, which is then dehydration-condensed with a polyvalent carboxylic acid, a method in which N-hydroxyalkyl(allyl)naphthalimide is synthesized and then reacted with polyvalent carboxylic acid chloride and a method in which naphthalic acid anhydride is reacted with an amino acid to synthesize N-carboxyalkyl(allyl)naphthalimide, which is then treated with thionyl chloride or the like to form an acid chloride, which is then reacted with a polyvalent amine or polyhydric alcohol.

As the raw materials in the above synthetic methods, anhydrides such as 1,8-naphthalic acid anhydride and 4-bromo-1,8-naphthalic acid anhydride or derivatives of these may be used.

Specific examples of methods for synthesizing the compound (c) having two naphthalimide structure-containing groups will be explained hereinbelow. They are, however, not intended to be limiting of the synthetic method of the present invention. Also, the compound having two or more naphthalimide structure-containing groups maybe synthesized using similar methods or known methods.

First, 1,8-naphthalic acid anhydride is poured into N,N-dimethyl formamide, followed by stirring, to which is then added 1,12-diaminododecane in an amount of ½ by mol of the naphthalic acid anhydride and it is stirred at ambient temperature for 1 to 15 hours. The subsequent procedures and other reaction conditions, for example, reaction temperature, the use of an azeotropic solvent and refining method or the like are basically the same as in the case of synthesizing the compound (a) in the first aspect described above.

As to an amino compound used here, the number of amino groups (—NH₂) which the amino compound has may be selected corresponding to the number of naphthalimide structure-containing groups to be introduced into the compound (c).

In the case of the compound having two naphthalimide structure-containing groups, a diamino compound may be used there may be exemplified, though not particularly limited to, 3,5-diaminobenzoic acid, 4,4'-dihydroxy-3,3'-diaminobiphenyl, 3,4-diaminobenzoic acid, 3,3'-dihydoxy-4,4'-diaminobiphenyl, 2,3-diamino-4-hydroxypyridine, 2,2-bis(4-hydroxy-3-aminophenyl)hexafluoroprpane, 2,4-diaminophenol, 2,4-diaminobenzoic acid, 3-carboxy-4,4'-diaminodiphenyl ether, 3,3'-dicarboxy-4,4'-diaminodiphenyl ether, 3-carboxy-4,4'-diaminodiphenylmethane, 3,3'-dicarboxy-4,4'-diaminodiphenylmethane, 3,3'-dicarboxy-4,4'-diaminobiphenyl, 3,3',5,5'-tetracarboxy-4,4'-diaminobiphenyl, 3-carboxy-4,4'-diaminodiphenylsulfone, 3,3'-dicarboxy-4,4'-diaminodiphenylsulfone, 1,1,1,3,3,3-hexafluoro-2,2-bis(3-carboxy-4-aminophenyl)propane, 4,4'-(or 3,4'-, 3,3'-,2,4'- or 2,2'-)diaminodiphenyl ether, 4,4'-(or 3,4'-, 3,3'-, 2,4'- or 2,2'-)diaminodiphenylmethane, 4,4'-(or 3,4'-, 3,3'-, 2,4'- or 2,2'-)diaminodiphenylsulfone, 4,4'-(or 3,4'-, 3,3'-, 2,4'- or 2,2'-)diaminodiphenyl sulfide, paraphenylenediamine, methaphenylenediamine, p-xylylenediamine, m-xylenediamine, o-tolidine, o-tolidinesulfone, 4,4'-methylene-bis-(2,6-diethylaniline), 4,4'-methylene-bis-(2,6-diisopropylaniline), 2,4-diaminomesitylene, 1,5-diaminonaphthalene, 4,4'-benzophenonediamine, bis-{4-(4'-aminophenoxy)phenyl}sulfone, 1,1,1,3,3,3-hexafluoro-2,2-bis(4-aminophenyl)propane, 2,2-bis{4-(4'-aminophenoxy)phenyl}propane, 3,3'-dimethyl-4,4'-diaminodiphenylmethane, 3,3',5,5'-tetramethyl-4,4'-diaminodiphenylmethane, bis(4-(3'-aminophenoxy)phenyl)sulfone, 2,2-bis(4-aminophenyl)propane, ethylenediamine, diethylenetriamine, 1,3-diaminopropane, 1,2-diaminopropane, 2,2-diaminopropane, 1,4-diaminobutane, 1,5-diaminopentane, 1,6-diaminohexane, 1,4-diaminocyclohexane, 1,7-diaminoheptane, 1,8-diaminooctane, 1,12-diaminododecane and 2-(2-aminoethoxy)ethylamine.

The compound (c) may be synthesized by using a triamino compound in the case of the compound (c) having three naphthalimide structure-containing groups and by using a tetramino compound in the case of the compound (c) having four naphthalimide structure-containing groups in the same manner as in the case of the compound having two naphthalimides. Also, the compound (c) in which the amount of the naphthalimide group to be introduced is smaller than the number of amino groups of the amino compound may be synthesized by changing the ratio of the naphthalic acid anhydride to amino compound to be supplied in the synthesis.

As a synthetic method other than the above methods, a method in which amino alcohol is reacted with naphthalic acid anhydride to synthesize N-hydroxyalkyl(allyl)naphthalimide, which is then dehydration-condensed with a polyvalent carboxylic acid will be explained as a specific example. This method, however, are not intended to be limiting of the present invention.

First, 1,8-naphthalic acid anhydride is poured into N,N-dimethylformamide and stirred. To there, 2-aminoethanol in the same mol as the naphthalic acid anhydride is added dropwise and then stirred at ambient temperature for about 1 to 15 hours. The reaction solvent used at this time is not limited to dimethylformamide but may be a solvent, such as an organic polar solvent, in which a final product is dissolved. These solvents may be used either singly or by mixing two or more. The aforementioned naphthalic acid anhydride has poor solubility and is sparingly soluble in a general solvent, and there are many cases where it is made soluble by reacting with an amine.

1,8-Naphthalic acid anhydride occasionally forms an imide bond only by mixing with an amine and stirring at ambient temperature. To accelerate the reaction further, it may be heated to a temperature ranging from ambient temperature to 200° C. Also, an azeotropic solvent such as toluene may be used by mixing it to remove the water generated during reaction.

N-2-hydroxyethylnaphthalimide synthesized by reacting 2-aminoethanol with 1,8-naphthalic acid anhydride may be made into the compound (c) by various methods. Typical examples of these methods will be shown below, but these examples are not intended to be limiting of the present invention.

N-2-hydroxyethylnaphthalimide and 1.2 mol equivalents of 4-dimethylaminopyridine are dissolved in a solvent such as dehydrated toluene. To there, 0.6 mol equivalents of succinyl chloride is dropwise and gradually added and then stirred at ambient temperature for about 1 to 15 hours. Using a separating funnel, it is treated by 1N HCl to transfer 4-dimethylaminopyridine to the water phase. After the water phase is separated from the oil phase, the oil phase is further treated using a saturated $NaHCO_3$ solution to transfer succinic acid derived from unreacted succinyl chloride to the water phase, and separate the oil phase from the water phase. The oil phase obtained in this manner is dehydrated using a proper dehydrator such as magnesium sulfate and then subjected to filtration. The material obtained by distilling solvents from this filtrate is recrystallized to obtain a target product.

In addition to the above procedures, the same compound can be obtained also by a method utilizing dehydration condensation with a dicarboxylic acid by using an acid catalyst.

Also, the compound (c) may be obtained by synthesizing an amide, ester or urea by a known method using N-carboxyalkylnaphthalimide as disclosed in the publication of Japanese patent application Laid-open No. 5-19505.

As mentioned previously, not only 1,8-naphthalic acid anhydride but also a compound, such as 4-bromo-1,8-naphthalic acid anhydride having a bromo group at the fourth position thereof, into which a substituent is introduced in advance may be used as the acid anhydride to be used here corresponding to an object.

Also, the amine compound used here is not limited to 2-aminoethanol but various amine compounds may be used corresponding to an object. There may be exemplified oxyalkylamines such as propanolamine and hexanolamine and substituted oxyalkylamines such as ethoxyethanolamine, propoxyprapanolamine and 2-(2-aminoethoxy)ethanol.

The radical generator thus obtained according to the present invention can cause a radical reaction when excited by applying light such as electromagnetic waves and radial rays since the naphthalimide structure-containing group functions as a hydrogen-drawing type radical-generating part. The naphthalimide structure-containing group is not a self-cleavage type but a hydrogen-drawing type and also, has a naphthalene skeleton having high thermal resistance and therefore, a photoradical generator having high thermal resistance, stability and preserving ability can be obtained.

Also, since the radical generated by the naphthalimide structure-containing group acts in accordance with a hydrogen-drawing mechanism, it can react not only with a general polymerizable group such as an ethylenic unsaturated bond but also with various compounds such as aromatic rings. Therefore, it can react with a low-molecular weight aromatic compound such as xylene and crosslink polymers having an aromatic part such as PET. Also, since the radical generator has two or more naphthalimide structure-containing groups which function as a radical-generating part, two or more naphthalimide-containing groups in one molecule can be bonded to other molecules to form a three-dimensional crosslinking structure. So, the radical generator as the compound (c) is used as an usual photoradical polymerization initiator and also can used as, for example, a crosslinking agent for a resin composition containing an aromatic polymer to thereby improve solvent resistance after curing.

Also, if any one among the plural naphthalimide structure-containing groups (radical-generating part) contained in one molecule of the radical generator generates a radical and forms a bond with a reaction product such as a polymer, all of the unreacted radical-generating parts contained in the molecule constitute a part of the chemical structure of a reaction product such as a polymer. Therefore, even if unreacted parts remain in the molecule of the radical generator, individual unreacted parts do not remain in a free state in a reaction product such as a polymer and do not volatilize during postbaking. Also, even if the radical-generating part remains unreacted, it does not produce a volatile decomposition material in the cured coating layer since it is a hydrogen-drawing type and also has a naphthalimide structure having high thermal resistance. Therefore, the residue originated from the radical generator of the present invention scarcely causes the coating layer to be denatured. As aforementioned, the residue originated from the radical generator of the present invention is bonded to a matrix in the cured coating layer of a photosensitive resin composition and exists in the cured coating layer in a chemically stable state, so that it does not impair thermal resistance, weather resistance and stability.

As a consequence, the residue originated from the photo radical polymerization initiator of the present invention does not give rise to a problem concerning operational safety, problems concerning a decline in the reliability of a final product such as deteriorated light resistance, coloring, fading and peeling and cracks of a coating layer, a problem as to short life of a chemical solution and a problem concerning the generation of odors.

Furthermore, the reaction for forming a maleimide structure is more advantageous than that of a maleimide structure, which is advantageous in synthesis. For this, productivity including yield, reaction rate, control aspect and cost aspect is raised.

Next, a photosensitive resin composition according to the second aspect will be explained.

The photosensitive resin composition according to the second aspect contains the compound (c) having two or more naphthalimide structure-containing groups represented by the aforementioned formula (3) as an essential component and may contain, as required, a radical reactive compound or other curable reactive compound, a macro molecular weight binder component, a hydrogen donor, a radical generator other than the compound (c) or other components.

In the photosensitive resin composition (hereinafter referred to simply as a resin composition) according to the second aspect, the naphthalimide structure-containing group of the radical generator comprising the above described compound (c) functions as a hydrogen-drawing type radical-generating part and radicalized when excited by applying light such as electromagnetic waves and radial rays to cause a radical reaction in the resin composition. The radical reactive compound in the resin composition causes various radical reactions such as radical polymerization, a radical dimerization reaction with the compound (c) which is a radical generator and a radical crosslinking reaction according to the type of the compound to thereby cure the photosensitive resin composition and change solubility.

The resin composition according to the second aspect may use the compound (b) having an ethylenic unsaturated bond and a macro molecular compound which is a binder component like the case of the first aspect.

Since a radical produced by the naphthalimide structure-containing group contained in the compound (c) proceeds with reactions not only with an ethylenic unsaturated bond but also with various compounds such as aromatic rings, it can cause curing and/or a change in solubility even in a system in which a compound having an ethylenic unsaturated bond is not present. Therefore, the compound (c) not only cures the photosensitive resin composition containing a compound having an ethylenic unsaturated bond by an usual radical polymerization reaction, but also can cures a photosensitive resin composition containing, for example, an aromatic polymer which is generally non-polymerizable such as polystyrene or polyethylene terephthalate (PET) or the like by a crosslinking reaction to thereby improve physical properties of the film qualities such as solvent resistance, thermal resistance, hardness, strength, adhesiveness or the like.

As a curable reactive binder component with macro molecular weight to be mixed with the compound (c) for preparing a photosensitive resin composition, not only usual radical polymerizable compounds such as compounds having an ethylenic unsaturated bond, but also all known macro molecular compounds may be used.

Also, when the compound (c) itself functions as a radical reactive compound, the photosensitive resin composition may be prepared without mixing a radical reactive compound. Accordingly, in this case, a macro molecular weight non-reactive binder component may be used or no binder component may be used.

The amount of the compound (c) in the resin composition according to the present invention is preferably 0.1% by weight or more based on the whole solid of the photosensitive resin composition from the viewpoint of preventing a retardation in the curing speed of the resin composition when irradiated with light and preventing a drop in the strength and glass transition temperature of the coating layer which drop is due to decreased crosslinking density caused by a reduction in the amount of the generated radicals. The amount of the compound (c) is more preferably 1% by weight or more from the viewpoint of sensitivity and physical properties of the coating layer. In this case, the mixing ratio of the compound (c) to the compound (b) and/or the aforementioned macro molecular compound is optionally selected according to the object taking various physical properties into account. It is to be noted that the solid content of the photosensitive resin composition means the whole components other than solvents and a liquid monomer component is included in the solid content.

In the case where the photosensitive resin composition of the present invention contains the compound (b) or a macro molecular weight binder component other than the compound (b), these proportions are the same as in the case of the first aspect.

Also, since the compound (c) is a hydrogen-drawing type radical generator, the resin composition of the present invention preferably contains a hydrogen donor from the viewpoint of more improving the efficiency of generation of radicals and bettering sensitivity. As the hydrogen donor, the same material as in the first aspect may be used.

The resin composition according to the second aspect may use other photoradical generator as required together with the compound (c) in the same manner as in the first aspect.

The same optional components as in the first aspect, for example, various organic or inorganic low-molecular or macro molecular compounds may be compounded in the resin composition according to the second aspect to impart processability and various functions.

Components other than the compound (c) contained in the photosensitive resin composition according to the second aspect preferably has a transmittance of 20% or more in a wavelength range where the emitting wavelength of an irradiation light source is overlapped on the absorption wavelength of the compound (c) from the viewpoint of regarding the sensitivity as important similarly to the first aspect.

The resin composition according to the second aspect may be diluted with the same solvent as used in the resin composition according to the first aspect so as to have a proper concentration.

Like the resin composition according to the first aspect, the resin composition according to the second aspect may be prepared by mixing and stirring optional components including a curable reactive compound such as the compound (b) or the like and a macro molecular binder component according to a case or use with the compound (c) as an essential component.

Like the photosensitive resin composition according to the first aspect, the photosensitive resin composition according to the second aspect may be utilized in all known fields and products, using materials which are cured or changed in solubility by irradiation with light, such as pattern-forming materials (resists), coating materials, printing inks, adhesives, fillers, molding materials and three-dimensional articles. Particularly, it is suitable for forming paints, printing inks, color filters, electronic parts, layer insulation films, wire cover films, optical materials, optical circuits, optical circuit parts, antireflection films, holograms or building materials for which thermal resistance is required and high reliability is demanded.

Examples According to the Second Aspect

B1. Production Examples

Production Example B1 Synthesis of poly-4-methylstyrene

A 500 mL separable flask equipped with a stirrer was charged with 30 mL of ethyl acetate, which was then stirred in a 60° C. oil bath with flowing nitrogen at a rate of 100 mL/min, followed by adding 50 g of 4-methylstyrene in which 400 mg of AIBN (2,2'-azobisisobutyronitrile) was dissolved. After continuing stir for 7 hours, the reaction solution was diluted adequately with ethyl acetate. Then ethanol was added dropwise thereto to re-precipitate and purify the solution, thus obtaining 42.3 g of a target product (Polymer B1).

Production Example B2 Synthesis of a Copolymer of 4-methylstyrene and Hydroxystyrene A mixture system of 41.3 g (0.35 mol) of 4-methylstyrene and 24.3 g (0.15 mol) of 4-acetoxystyrene was used as the raw material to run polymerization in the same manner as in Production Example B1. After the reaction solution was re-precipitation and refinement, the resulting polymer was dissolved in tetrahydrofuran, to which was added dropwise an appropriate amount of a NaOH saturated methanol solution to unprotect. Then, the polymer was refined by reprecipitation to obtain an alkali-soluble polymer B1 in an amount of 42.9 g.

Production Example B3 Synthesis of an Epoxy Group-Containing Acryl Polymer

A 500 mL separable flask equipped with a stirrer was charged with 150 mL of dry ethyl acetate, which was then dipped in a 60° C. oil bath and stirred with flowing nitrogen at a rate of 100 mL/min, followed by gradually adding dropwise a mixed solution of 30.1 g (0.3 mol) of methylmethacrylate (MMA) in which 200 mg of AIBN (2,2'-azobisisobutyronitrile) was dissolved and 14.2 g (0.1 mol) of glycidylmethacrylate (GMA). The reaction was finished 4 hours after the addition was finished, followed by re-precipitating from n-hexane to obtain 42.3 g of an epoxy group-containing acryl polymer. The weight average molecular weight based on polystyrene by GPC (gel permeation chromatography) was 150000 and the copolymerization ratio by NMR was as follows: GMA: MMA=1:2.6.

Production Example B4

A 1L eggplant-shape flask was charged with 19.8 g (0.1 mol) of 1,8-naphthalic acid anhydride, 500 mL of N,N-dimethylformamide (hereinafter called DMF) and a catalytic amount of pyridine, and stirred. 6.7 g (0.11 mol) of 2-aminoethanol was added dropwise thereto, and then stirred at ambient temperature for 15 hours. DMF was distilled by a rotary evaporator, followed by re-crystallizing from methanol to obtain N-2-hydroxyethylnaphthalimide as needle crystals in an amount of 22.5 g (precursor compound B1).

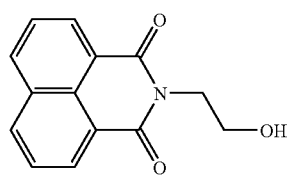

Precursor compound B1

Production Example B5

A reaction was run in the same condition as in Production Example B4 except that the acid anhydride as the starting material was altered to 4-bromo-1,8-naphthalic acid anhydride. Each raw material was supplied in the same number of mols as in Production Example B4 (precursor compound B2).

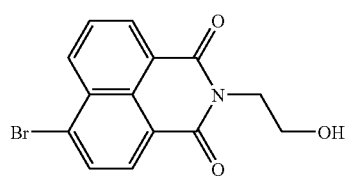

Precursor compound B2

Production Example B6

A 1 L eggplant-shape flask was charged with 19.8 g (0.1 mol) of 1,8-naphthalic acid anhydride, 500 mL of DMF and a catalytic amount of pyridine, and stirred. 8.9 g (0.1 mol) of β-alanine was added thereto, and stirred at ambient temperature for 4 hours, and then at 130° C. for 5 hours. DMF was distilled by a rotary evaporator, followed by re-crystallizing from methanol to obtain N-2-carboxyethylnaphthalimide as crystals in an amount of 20.9 g (precursor compound B3).

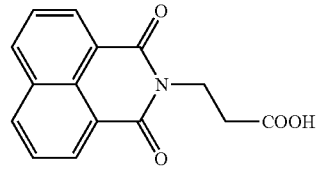

Precursor compound B3

Production Example B7

9.6 g (40 mmol) of the precursor compound B1 (N-2-hydroxyethylnaphthalimide) and 5.4 g (44 mmol) of 4-dimethylaminopyridine were poured into a 1L three-neck flask. A calcium chloride pipe was attached to the center opening and the remainder two openings were sealed with a Silicon W Cap (trademark: manufactured by ASONE CORPORATION). 500 ml of tetrahydrofuran (THF) which had been dehydrated in advance was poured into there by using a syringe, followed by stirring at ambient temperature. 4.0 g (44 mmol) of acrylic acid chloride was added dropwise to there, followed by stirring at ambient temperature for 10 hours. Thereafter, the reaction solution was treated with 1N HCl by using a separating funnel to transfer 4-dimethylaminopyridine to the water phase. After the water phase was separated from the oil phase, the oil phase was further treated using a saturated $NaHCO_3$ solution to transfer acrylic acid originated from unreacted acrylic acid chloride to the water phase, and the oil phase was separated from the water phase. The oil phase obtained in this manner was dehydrated using a proper dehydrator such as magnesium sulfate, followed by filtration. The filtrate, from which a solvent was removed, was re-crystallized from a chloroform-ethyl acetate mixed solvent to obtain 10.3 g of a target product (precursor compound B4).

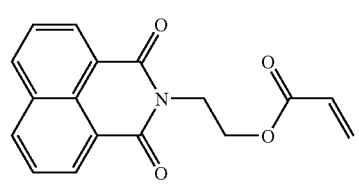

Precursor compound B4

B2. Preparation of a Radical Generator

Example B1

A 1 L eggplant-shape flask was charged with 19.8 g (0.1 mol) of 1,8-naphthalic acid anhydride, 500 mL of N,N-dimethylformamide (hereinafter called DMF) and a catalytic amount of pyridine, and stirred. 10.2 g (0.5 mol) of 1,12-diaminododecane was poured into there, which was then stirred at 130° C. for 5 hours. DKF was distilled by a rotary evaporator, followed by re-crystallizing from tetrahydrofuran to obtain a target product as needle crystals in an amount of 25.5 g (compound B1).

Compound B1

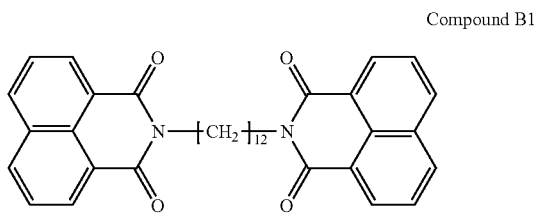

Example B2

A reaction was run in the same condition as in Example B1 except that the acid anhydride as the starting material was altered to 4-chloro-1,8-naphthalic acid anhydride. Each raw material was supplied in the same number of mols as in Example B1 (compound B2).

Compound B2

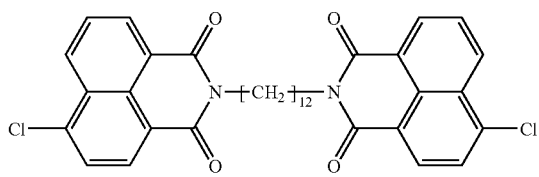

Example B3

3.2 g (5 mmol) of the compound B2 was poured into a 1 L three-neck flask and dissolved in 500 mL of dry isopropyl alcohol, followed by stirring at ambient temperature. An isopropyl alcohol solution of sodium isopropoxide obtained by reacting 1 g of metal sodium with 200 mL of dry isopropyl alcohol was gradually added dropwise to there to trace the process of the reaction by TLC (thin layer chromatography). The dropwise addition was continued until the spot of the compound B2 which was the starting material disappeared and the reaction was finished when the spot of the compound B2 disappeared. The reaction solution was poured into 5 L of pure water. The precipitate was dried and then purified by column chromatography to obtain a compound B3.

Compound B3

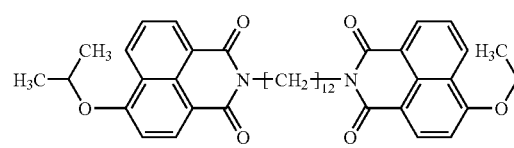

Example B4

A reaction was run in the same condition as in Example B1 except that the acid anhydride as the starting material was altered to 4-bromo-1,8-naphthalic acid anhydride. Each raw material was supplied in the same number of mols as in Example B1 (compound B4).

Compound B4

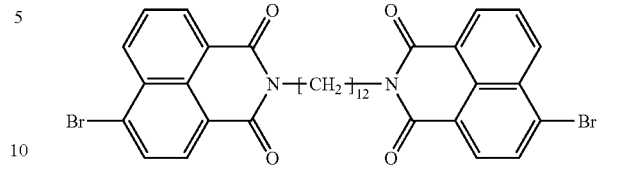

Example B5

A reaction was run in the same condition as in Examples B1 and B4 except that the diamine as the starting material was altered to diethylenetriamine and the reaction temperature was altered to 40° C. Each raw material was supplied in the same number of mols as in Example B1 (compound B5 and compound B6).

Compound B5

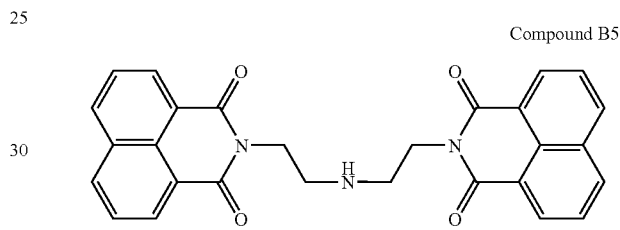

Compound B6

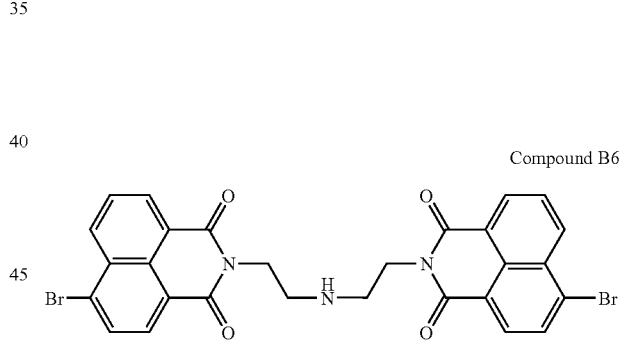

Example B6

9.6 g (40 mmol) of the precursor compound B1 (N-2-hydroxyethylnaphthalimide) and 5.4 g (44 mmol) of 4-dimethylaminopyridine were poured into a 1 L three-neck flask. A calcium chloride pipe was attached to the center opening and the remainder two openings were sealed with a Silicon W Cap (trademark: manufactured by ASONE CORPORATION). 500 ml of tetrahydrofuran (THF) which had been dehydrated in advance was poured into there by using a syringe, followed by stirring at ambient temperature. 3.4 g (22 mmol) of succinyl chloride which had been dissolved in 10 mL of dehydrated THF in advance was added dropwise to there, followed by stirring at ambient temperature for 10 hours. Thereafter, the reaction solution was treated with 1N HCl by using a separating funnel to transfer 4-dimethylaminopyridine to the water phase. After the water phase was separated from the oil phase, the oil phase was further treated using a saturated $NaHCO_3$ solution to transfer succinic acid originated from unreacted succinyl chloride to the water phase, and the oil phase was separated from the water phase. The oil phase obtained in this manner was dehydrated using a proper dehydrator such as magnesium sulfate, followed by filtration. The filtrate, from which a solvent was removed, was re-crystallized from a chloroform-ethyl acetate mixed solvent to obtain 9.4 g of a target product (compound B7).

Compound B7

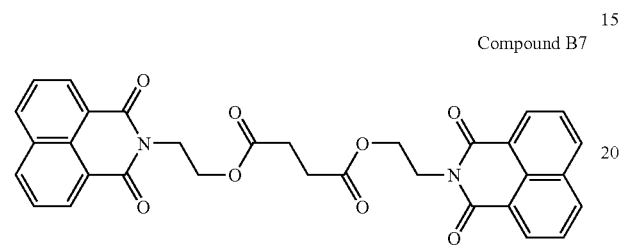

Example B7

A reaction was run in the same condition as in Example B6 except that the compound as the starting material was altered to the precursor compound B2 derived from 4-bromo-1,8-naphthalic acid anhydride. Each raw material was supplied in the same number of mols as in Example B6 (compound B8).

Compound B8

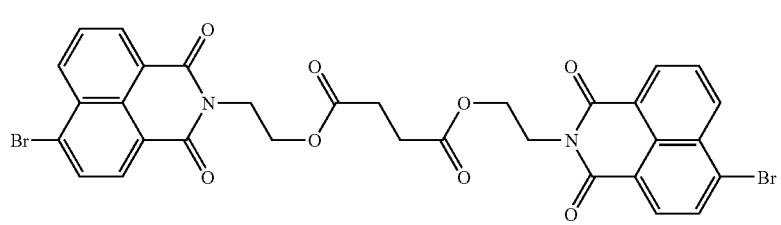

Example B8

11.7 g (about 50 mmol, converted value per one structural unit by the mol ratio) of a styrene/maleimide copolymer (Mn=1600, copolymerization ratio=1.3 : 1, manufactured by Aldrich) and 12.1 g (50 mmol) of the precursor compound B1 (N-2-hydroxyethylnaphthalimide) were placed in a 300 mL eggplant-shape flask and dissolved in 100 mL of tetrahydrofuran which had been dried in advance. A catalytic amount of concentrated sulfuric acid was added dropwise to there, which was stirred at 60° C. for 96 hours. Thereafter, the reaction solution was poured into hexane to reprecipitate, followed by filtration and drying to obtain 20.3 g of a target product into which a naphthalimide group was introduced. (compound B9)

Compound B9

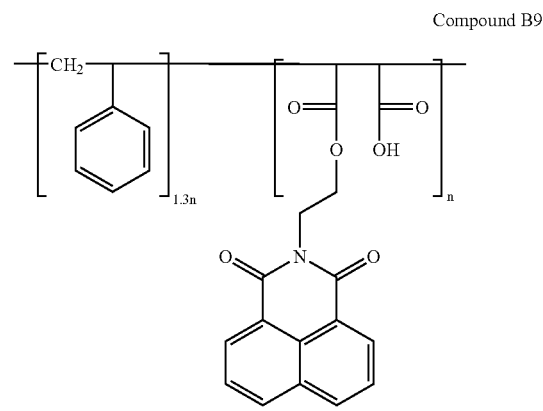

Example B9

A reaction was run in the same condition as in Example B8 except that the precursor compound B1 as the starting material of Example B8 was altered to the precursor compound B2. Each raw material was supplied in the same number of mols as in Example B8 to obtain 21.1 g of a target product. (compound B10)

Compound B10

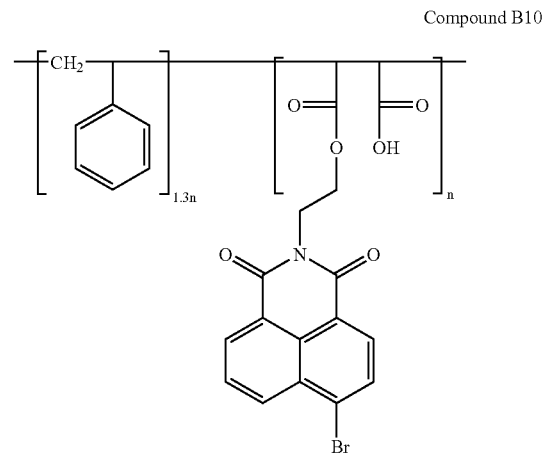

Example B10

3.0 g (10 mmol) of the precursor compound B4 and 3.0 g (30 mmol) of methylmethacrylate were dissolved in 50 mL of chloroform, followed by stirring. 200 mg of AIBN (2,2'-azobisbutyronitrile) was poured into a reaction vessel with flowing nitrogen at a rate of 100 mL/min, followed by stirring at 50° C. for 14 hours. Thereafter re-precipitation was carried out from n-hexane to obtain 5.2 g of a copolymer of the precursor compound B4 and methyl methacrylate (compound B11). The weight average molecular weight based on polystyrene by gel permeation chromatography was 39000 and the copolymerization ratio by NMR was as follows: precursor compound B4:methylmethacrylate=1:3.2.

Compound B11

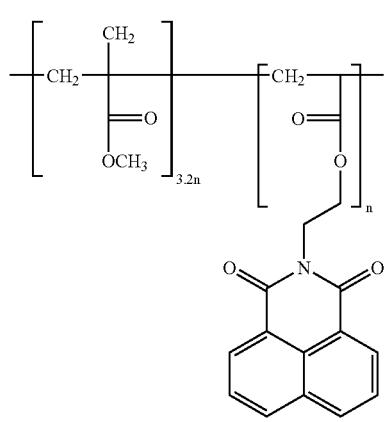

Example B11

8.1 g of the epoxy group-containing acryl polymer (Production Example B3) and 5.4 g (20 mmol) of the precursor compound B3 were dissolved in 300 ml of dry dimethylformamide (DMF), and then one droplet of triethylamine was added therein, followed by stirring at 100° C. for 20 hours. The reaction solution was re-precipitated from n-hexane to obtain 12.7 g of a target compound (compound B12).

Compound B12

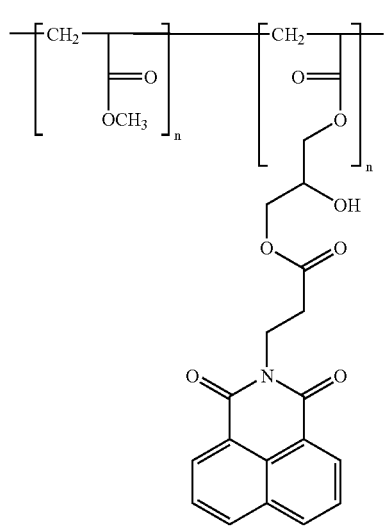

Comparative Example B1

A 1 L eggplant-shape flask equipped with a Deanstark pipe was charged with 9.8 g (0.1 mol) of maleic acid anhydride, 400 mL of N,N-dimethylformamide (hereinafter called DNF), 100 mL of toluene and a catalytic amount of pyridine, and stirred. 10.2 g (0.5mol) of 1,12-diaminododecane was poured into there, which was then stirred at 130° C. for 15 hours with removing the water distilled together with toluene by azeotrope. DMF was distilled by a rotary evaporator, followed by re-crystallizing from tetrahydrofuran to obtain 12.5 g of a target compound. (comparative compound B1)

Comparative compound B1

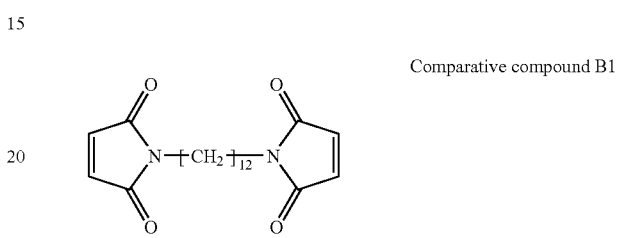

Comparative Example B2

A reaction was run in the same condition as in Example B8 except that the precursor compound B1 as the starting material of Example B8 was altered to dodecanol. Each raw material was supplied in the same number of mols as in Example B8 to obtain 12.2 g of a target product. (comparative compound B2)

Comparative compound B2

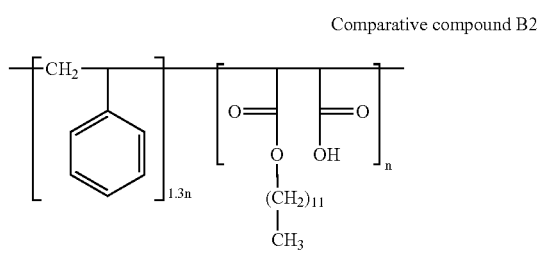

B3. Preparation of a Photosensitive Resin Composition

Each of the compounds 31 to 312 obtained in Examples B1 to B11, the comparative compounds B1 and B2 obtained in Comparative Examples B1 and B2, a photoradical generator (trademark: Irgacure 907, manufactured by Ciba Specialty Chemicals) and benzophenone (manufactured by Tokyo Kasei Kogyo Co., Ltd.) is mixed with a trifunctional acrylate (trademark: M-305, manufactured by Toagosei Co., Ltd.) such that the mol ratio of the photoradical-generating part of each compound to the ethylenic double bond of the trifunctional acrylate, namely (photoradical-generating part/ethylenic double bond) was 1/100. Then it was dissolved in THF to produce photosensitive resin compositions B1 to B12 of Examples B12 to B23 and the comparative compositions B1 to B4 of Comparative Examples 33 to 36.

Example B24

The compound B11 obtained in Example B10 and a trifunctional acrylate (trademark: M-305, manufactured by Toagosei Co., Ltd.) were mixed in equal amounts by weight, and then dissolved in THF to produce a photosensitive resin composition B13.

Examples B25 to B36, Comparative Examples B7 to B9

Triethanolamine was added as a hydrogen donor to each of the photosensitive resin compositions obtained in Examples B12 to B23 and Comparative Examples B3, B4 and B6 in an amount by mol equivalent to that of the photoradical-generating part to produce photosensitive resin compositions B14 to B25 of Examples B25 to B36 and the comparative compositions B5 to B7 of Comparative Examples B7 to B9.

Example B37

Triethanolamine was added as a hydrogen donor to the photosensitive resin composition B13 obtained in Example B24 in an equal mol to that of the photoradical-generating part to produce a photosensitive resin composition B26 of Example B37.

B4. Test of Evaluation (1) Evaluation 1 of Thermal Resistance

Figure 3:
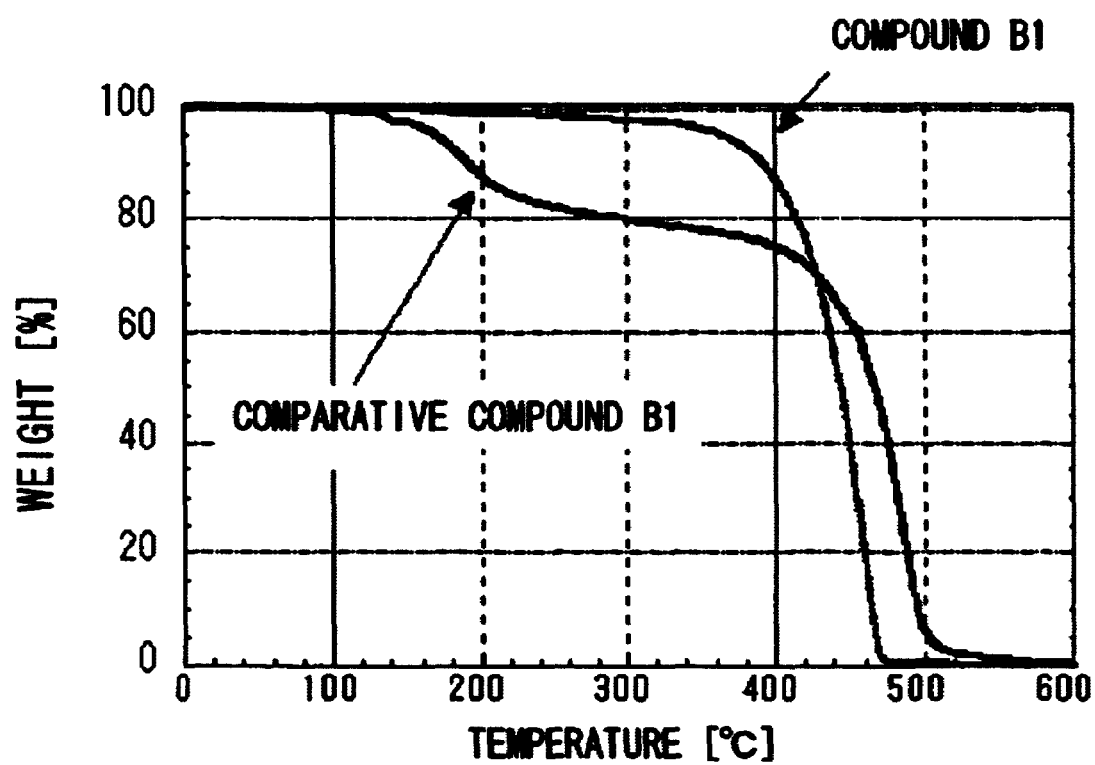
FIG. 3 is a graph showing the result of measurement of heat-decomposition temperature in an example according to a second aspect.

Using a thermogravimetric analyzer (TGA7, manufactured by Perkin Elmer), the heat decomposition temperature of each of the compound B1 and the comparative compound B1 was measured in a temperature rise condition of 10° C./min. The results of measurement are shown in FIG. 3. It is found from these results that the compound B1 is not almost decomposed until 200° C., and a reduction in the weight is about 2% at 300° C., exhibiting very high heat stability. On the other hand, it is found that a reduction in the weight of the comparative compound B1 is about 12% at 200° C. and about 20% at 300° C.

(2) Evaluation 2 of Thermal Resistance

Using a differential type differential thermal balance (TG8120, manufactured by Rigaku Corporation), the 90% heat decomposition temperature of each of the compounds B1 to B8, the comparative compound B1 and the photoradical generator (trademark: Irgacure 907, manufactured by Ciba Specialty Chemicals) was measured at a temperature rise rate of 10° C./min in a nitrogen atmosphere. The results of measurement are shown in Table B1. It is understood from these results, each heat decomposition temperature of the compounds B1 to B8 is higher than those of maleimide (comparative compound B1) and Irg 907 which are comparative compounds, thus showing good heat resistance.

TABLE B1

| | 90% heat decomposition temperature (° C.) |
|---|---|
| Compound B1 | 418 |
| Compound B2 | 426 |
| Compound B3 | 435 |
| Compound B4 | 429 |
| Compound B5 | 307 |
| Compound B6 | 321 |
| Compound B7 | 337 |
| Compound B8 | 345 |
| Comparative Compound B1 | 198 |
| Irg 907 | 221 |

(3) Evaluation of Ultraviolet Absorption

Figure 4:
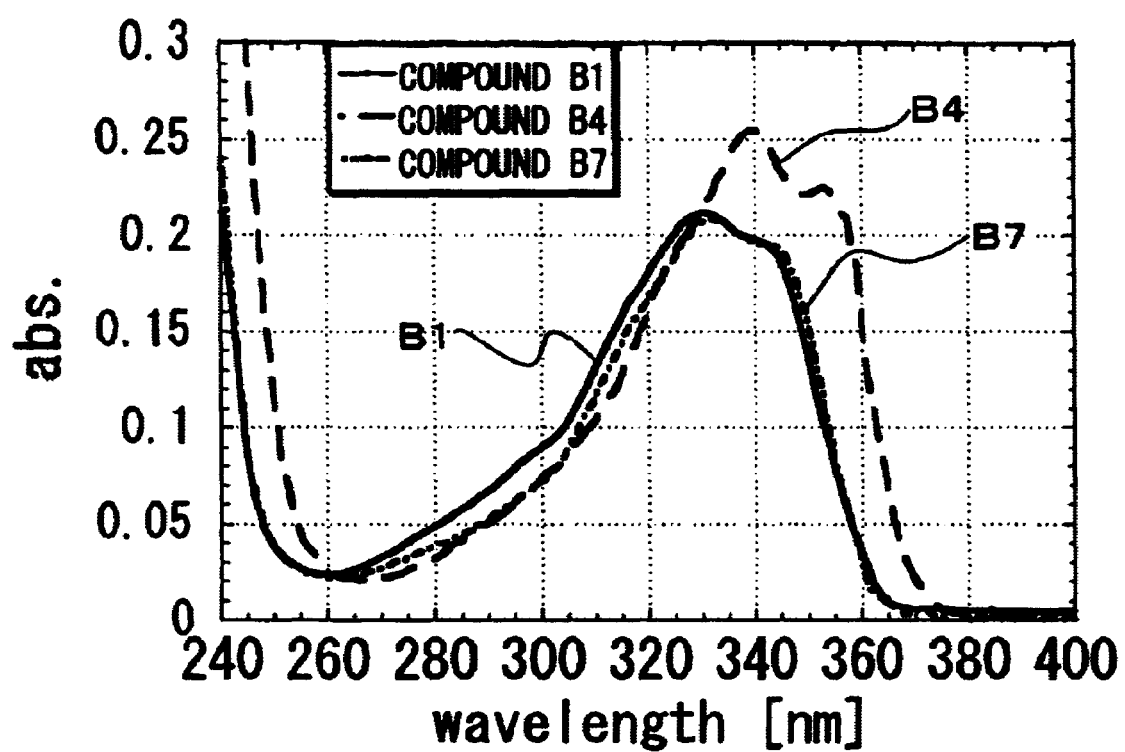
FIG. 4 is a graph showing the results of measurement of an ultraviolet absorption spectrum (compounds B1, B4 and B7) in a second aspect.
Figure 5:
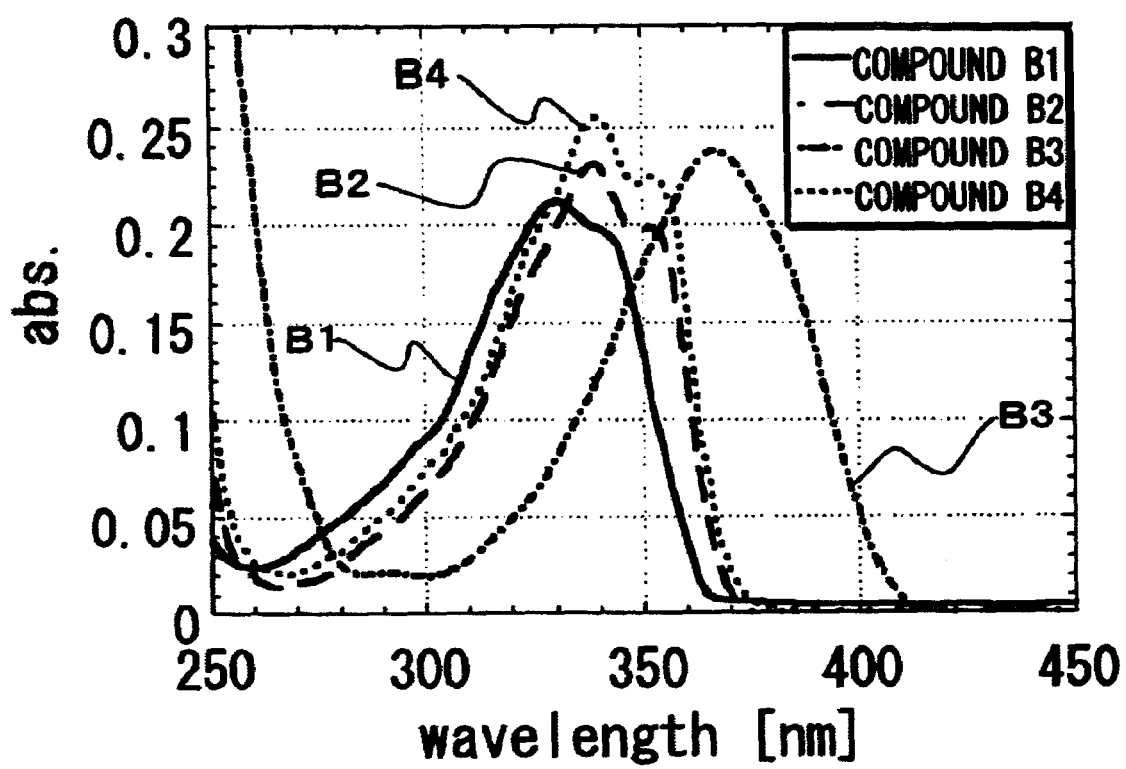
FIG. 5 is a graph showing the results of measurement of an ultraviolet absorption spectrum (compounds B1, B2, B3 and B4) in a second aspect.

Using an acetonitrile solution containing $1.0 \times 10^{-5}$ mol/L of each of the compounds B1 to B4 and B7, each ultraviolet absorption spectrum was measured. The results of measurement are shown in FIG. 4, FIG. 5 and Table B2.

TABLE B2

| | Naphthalimide Part | Substituent on Part of Naphthalimide | $\lambda$max (nm) | Maximum Molar Extinction Coefficient | Molar Extinction Coefficient (365 nm) |
|---|---|---|---|---|---|
| Compound B1 | Two | — | 330 | 22,000 | 1,000 |
| Compound B2 | Two | Cl | 340 | 23,200 | 5,200 |
| Compound B3 | Two | i-PrO | 365 | 23,800 | 23,800 |
| Compound B4 | Two | Br | 340 | 26,000 | 9,000 |
| Compound B7 | Two | — | 330 | 22,000 | 1,100 |

From these results, the compounds B1 and B7 having no substituent on the aromatic cyclic part of naphthalimide have a maximum at 330 nm in a solution. It is inferred that this maximum is due to excitation based on $\pi$-$\pi$* transition from the molar extinction coefficient at this wavelength.

It can be estimated from the molar extinction coefficient that what transition state the absorption corresponds to. Generally, with increased molar extinction coefficient, light is more absorbed, namely, excitation is made more easily, radicals are generated more easily and a crosslinking reaction proceeds more easily. As a consequence, a molecule having a large molar extinction coefficient at exposure wavelength is better from the viewpoint of sensitivity.

Also, in the case of the compound B4 into which bromine is introduced and the compound B2 into which chlorine is introduced, at the fourth position of the naphthalimide group, they have the maximum wavelength shifted by about 10 nm to a longer wavelength side as compared with the unsubstituted compounds and have strong absorption at a wavelength of 365 nm which is the emitting wavelength of a high pressure mercury lamp. Also, the compound B3 into which an isopropyl ether group is introduced as a substituent to the aromatic ring of naphthalimide has the maximum absorption at 365 nm, to find that it has very strong absorption at 365 nm which is the emission wavelength of a high pressure mercury lamp.

The generation of radicals by naphthalimide is considered to be due to hydrogen-drawing. In general, the generation of radicals due to hydrogen-drawing is said to be caused by the triplet excited state of a carbonyl group. It is considered that when the ratio of the absorbed energy to be consumed for fluorescent emission and thermal deactivation is large even if a compound is excited, the efficiency of generation of radicals drops.

When the ratio of such a deactivation process other than hydrogen-drawing is small, the stronger the absorption at the exposure wavelength is, the more easily the photosensitive compound is excited. Because the efficiency of generation of radicals is therefore considered to be improved, it is expected that the compounds B2, B3 and B4 are more improved than the unsubstituted compounds B1 and B7 in sensitivity to a wavelength of 365 nm.

Moreover, from the results of various experiments explained later, when comparing the case where electromagnetic waves having such a wavelength at which excitation based on π-π* transition is observed are applied with the case where such electromagnetic waves are not applied, radical-generating efficiency is higher in the case of applying than in the case of not applying. Thus, it is inferred that π-π* transition is important in the mechanism of generation of radicals in the naphthalimide part. The π-π* transition is mostly observed when the molar extinction coefficient is 2000 or more. It is considered that in any compound having a molar extinction coefficient larger than the above value, radicals are easily generated and a crosslinking reaction easily proceeds if considering from the mechanism.

(4) Evaluation 1 of Curability 5.9 g of the poly-4-methylstyrene synthesized in Production Example B1 and 1.4 g of the compound B1 were dissolved in chloroform and it was applied by spin coating to a glass substrate to form a coating layer.

The above coating layer was irradiated with ultraviolet rays based on h-rays by using a hand-operated exposure apparatus (MA-1200, manufactured by Dainippon Screen Mfg. Co., Ltd.), and then, whether the coating layer was cured or not was confirmed. At this time, studies were made in two cases, namely, a case of carrying out exposure by using filters transmitting lights having wavelengths of 333 nm, 365 nm, 405 nm and 436 nm respectively and a case of carrying out exposure by using the emission wavelength of a high pressure mercury lamp exactly as it was without using any filter. The curability was determined from the state of the coating layer after the exposed coating layer was immersed in a chloroform solution for 24 hours.

The results are shown in Table B3. The coating layer became insoluble in chloroform at 1000 mJ in the case of using no filter and at 5000 mJ in the case of using the filter. It is considered that the compound B1 allows poly-4-methylstyrene to be crosslinked by exposure, whereby the solubility of the coating layer drops and the coating layer is cured.

The reason why there is a difference in curability based on whether a filter is present or not is considered to be that because the ultraviolet absorption wavelength range of the compound B1 is 360 nm or less, the sensitivity is more decreased in the case where the filter is present by which the emission of wavelengths in this range is considerably cut.

In other words, the above fact suggests that the sensitivity is more increased with an increase in the range where the absorption of the compound B1 is overlapped on the exposure wavelength. Also, from the fact that the molar extinction coefficient in the wavelength range cut at this time is 2000 or more, it is considered that π-π* transition takes place in this range and it is therefore inferred that the π-π* transition largely participates in the generation of radicals. In the meantime, there is a possibility that n-π* transition having a molar extinction coefficient smaller than the above value, and accordingly the absorption based on the n-π* transition is concealed by large absorption based on the π-π* transition.

The coating layer produced above was exposed to light through a mask with a stripe pattern of line/space (1 mm/1 mm) without a filter at an intensity of 1000 mJ and then immersed in chloroform, whereby a good stripe pattern formed on the coating layer could be obtained.

Also, a coating layer produced by blending 6.0 g of the alkali-soluble polymer polymerized in Production Example B2 with 1.4 g of the compound B1 was likewise exposed to light through the above mask. Thereafter, the coating layer was immersed in aqueous 1N NaOH solution to wash away the unexposed part, whereby a good stripe pattern could be obtained.

TABLE B3

| Exposure Amount (mJ) | Solubility in Chloroform | |
|---|---|---|
| | Non Filter | With Filter |
| 100 | Soluble | Soluble |
| 500 | Soluble | Soluble |
| 1000 | Insoluble | Soluble |
| 5000 | Insoluble | Insoluble |

(5) Evaluation 2 of Curability

Using a hydroxyl group-containing pentafunctional acrylate (trademark: Sartomer SR399, manufactured by Nippon Kayaku Co., Ltd.) and hexafunctional acrylate (trademark: M400, manufactured by Toagosei Co., Ltd.) as polyfunctional monomers, the compound B1 was mixed with each polyfunctional monomer in a ratio by mol of 1/20 to the double bond of the polyfunctional monomer to produce solutions, which were then respectively applied to a glass substrate by spin coating. For comparison, the compound B1 was replaced with the comparative compound B1, a photoradical generator Irgacure 369 (trademark) (manufactured by Ciba Specialty Chemicals) and benzophenone (manufactured by Tokyo Kasei Kogyo (kabushiki kaisha) to form a coating layer.

The above coating layer was irradiated with light at an intensity of 5000 mJ/cm$^2$ based on h-rays by using a hand-operated exposure apparatus (MA-1200, manufactured by Dainippon Screen Mfg. Co., Ltd.), and then, whether the coating layer was cured or not was confirmed. The degree of curing was determined by touching the exposed coating layer with the fingers. The case where the surface of the coating layer was not sticky and was highly hard defined as ○ and the case where the coating layer was liquid as it was even after exposed to light was defined as x.

Table B4 shows the results of evaluation. From the fact that like the comparative compound B1 and Irgacure 369, the compound B1 can cure the polyfunctional acrylates, it is found that naphthalimide functions as a radical generator.

TABLE 4

| Initiator | Polyfunctional Monomer | Curability |
|---|---|---|
| Compound B1 | SR-399 | ○ |
| | M-400 | ○ |

TABLE 4-continued

| Initiator | Polyfunctional Monomer | Curability |
|---|---|---|
| Irgacure 369 | SR-399 | ○ |
|  | M-400 | ○ |
| Comparative Compound B1 | SR-399 | ○ |
|  | M-400 | ○ |
| Benzophenone | SR-399 | ○ |
|  | M-400 | ○ |
| Non initiator | SR-399 | X |
|  | M-400 | X |

(6) Evaluation 3 of Curability

The photosensitive resin compositions B1 to B13 and the comparative compositions B1 to B4 were respectively applied by spin coating to a glass substrate on which chromium was sputtered to obtain coating layers.

A decrement of the peak at 810 cm$^{-1}$ was recorded with time by using an infrared spectrometer while exposing the above coating layer to ultraviolet rays, to confirm the degree of the disappearance of a double bond. The atmosphere around the sample during measurement was replaced with nitrogen. As the UV exposure apparatus, UV Spot Cure SP-III type (standard reflecting mirror type) manufactured by Ushio Inc. was used and as the UV lamp, USH-255BY manufactured by Ushio Inc. was used. Also, as the infrared spectrometer, FT S6000 manufactured by BIO RAD was used.

Also, the comparative composition B1 uses the comparative compound B1 having a maleimide group, so that a reaction does not almost proceed though the comparative compound B1 is compatible with M305. The benzophenone which is also the hydrogen-drawing type radical generator is similar. Irg907 which is a commercially available photoradical generator has high reactivity and well proceeds with reaction. However, since it is a self-cleavage type radical generator, impurities remain in the coating layer.

The compound B3 having a large absorption for light having exposure wavelength has higher compatibility with trifunctional monomer M305 than other analogous compounds having different substituents. However, it is not improved in reactivity in contrast to the absorption for light having exposure wavelength.

This is considered to be because the compound B3 strongly emits fluorescent light. When the compound B3 was excited at an absorption maximum wavelength in a 1.0×10$^{-5}$ mol/L acetonitrile solution to measure the emission intensity of fluorescence and as a result, it was confirmed that the compound B3 had an fluorescent emission intensity ten times or more stronger than the compounds B1 and B2 and made much of the absorbed energy into the fluorescent emission and emitted externally. This is considered to show the fact that the absorbed light energy is utilized insufficiently for production of the radicals. For this, a naphthalimide compound having a small fluorescent emission intensity is preferable from the viewpoint of reactivity per hour.

TABLE B5

| Photosensitive Compositions | Compound No. | Compatability Trifunctional Acrylate M305 | Odors during Exposure | Reaction rate (%) Exposure Amount (mJ/cm$^2$) | | | Coloring of Coating Layer |
|---|---|---|---|---|---|---|---|
| | | | | 50 | 100 | 400 | |
| B1 | B1 | X | None | 0.2 | 0.2 | 0.3 | Cloudy |
| B2 | B2 | X | None | 0.5 | 0.7 | 1.0 | Cloudy |
| B3 | B3 | ○ | None | 1.0 | 2.5 | 9.5 | Transparent |
| B4 | B4 | X | None | 0.1 | 0.1 | 0.6 | Cloudy |
| B5 | B5 | ○ | None | 0.2 | 1.1 | 4.9 | Transparent |
| B6 | B6 | X | None | 0.2 | 0.2 | 0.2 | Cloudy |
| B7 | B7 | ○ | None | 0.5 | 1.4 | 16.7 | Transparent |
| B8 | B8 | X | None | 0.3 | 0.3 | 0.6 | Cloudy |
| B9 | B9 | ○ | None | 5.5 | 11.5 | 33.5 | Transparent |
| B10 | B10 | ○ | None | 5.2 | 9.2 | 16.6 | Pale yellow |
| B11 | B11 | ○ | None | 3.0 | 6.4 | 22.2 | Transparent |
| B12 | B12 | ○ | None | 0.3 | 1.4 | 6.8 | Yellow |
| B13 | B11 | ○ | None | 7.4 | 13.9 | 27.6 | Transparent |
| Comparative B1 | Comparative B1 | ○ | None | 1.0 | 1.3 | 4.1 | Transparent |
| Comparative B2 | Comparative B2 | ○ | None | 0.1 | 0.1 | 0.3 | Pale white |
| Comparative B3 | Irgacure 907 | ○ | Present | 34.8 | 40.8 | 50.6 | Yellow |
| Comparative B4 | Benzophenone | ○ | Slightly Present | 1.0 | 1.8 | 4.7 | Transparent |

The compatibility with a trifunctional acrylate M305, odors during curing, a decrement of a double bond in relation to exposure amount (reaction rate) and coloring of the coating layer were observed. The results are shown in Table B5.

The comparative composition B2 uses the comparative compound B2 having no photoradical-generating part and therefore the double bond is not almost reacted. The compositions B1 to B13 use a compound having a naphthalimide part and those provided with such a compound which is highly compatible with M305 which is an acryl monomer have high reactivity. It is inferred that the naphthalimide group-containing compound is solved mutually with M305 so that the diffusion of the generated radicals progresses to run a reaction.

(7) Evaluation 4 of Curability 5.9 g of poly-4-methylstyrene synthesized in Production Example B1 and 1.4 g of the compound B1 were dissolved in chloroform and the resulting solution was applied to a glass substrate by spin coating to form a coating layer. (Sample A)

An increment in a peak at 1725 cm$^{-1}$ was recorded with time by using an infrared spectrometer (FTS 6000, manufactured by BIO RAD) with exposing the coating layer to UV-rays to confirm the degree of progress of a crosslinking reaction.

As the UV exposure apparatus, UW Spot Cure SP-III type (standard reflecting mirror type) manufactured by Ushio Inc. was used and as the UV lamp, USH-255BY (manufactured by Ushio Inc.) was used.

Also, to confirm whether the naphthalimide part was a hydrogen-drawing type radical generator or not, a coating layer obtained by adding n-dodecanol further to the composition of Sample A in the same mol as that of the naphthalimide part was produced and was examined in the same manner. (Sample B)

Figure 6:
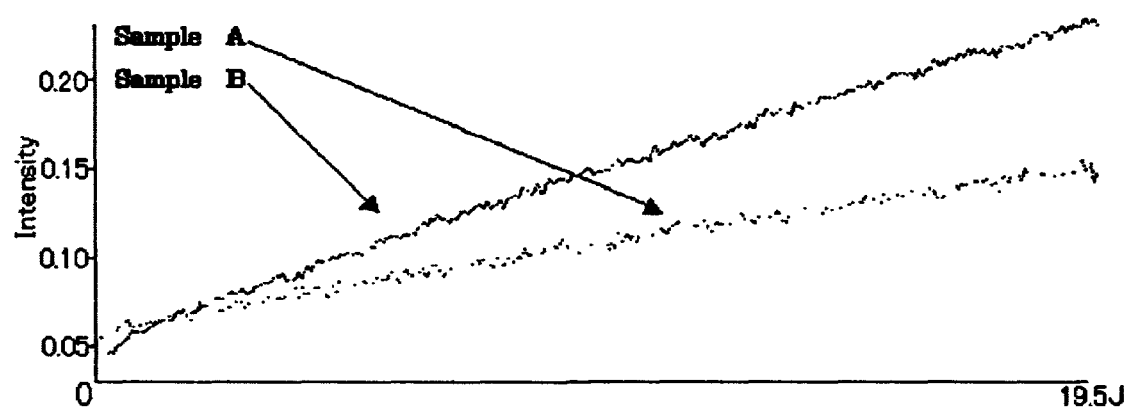
FIG. 6 is a graph showing an increment of a peak at 1725 $cm^{-1}$ under UV radiation in an example according to a second aspect.

The results of measurement are shown in FIG. 6. From these results, it is found that the increment of a peak is about two times larger in the system to which dodecanol is added to the coating layer and therefore a crosslinking reaction proceeds more rapidly in the case of compounding a hydrogen-donating group in the coating layer. Although the hydrogen connected with carbon may be drawn based on the mechanism, it is inferred that the hydrogen is easily drawn in the case of a thiol, hydroxyl group and amino group, so that the efficiency of generation of radicals is raised and sensitivity is improved.

In short, it is considered that the naphthalimide group is improved in sensitivity by exposing it to light in the presence of a hydrogen-donating group.

(8) Evaluation 5 of Curability

In order to confirm whether or not the naphthalimide part was a hydrogen-drawing type radical generator, the photosensitive resin compositions B14 to B26 and the comparative compositions B5 to B7 were respectively used to observe the compatibility with a trifunctional acrylate M305, odors during exposure, a decrement of a double bond in relation to exposure amount (reaction rate) and coloring of the coating layer in the same procedures as in the aforementioned evaluation 3 of curability. The results are shown in Table B6.

Each reactivity of the samples except for a part of them was improved by adding triethanolamine. Particularly, a rise in reaction rate is seen at low exposure amounts. Namely, it is considered that the naphthalimide group is improved in sensitivity by exposing it to light in the condition that a hydrogen-donating group is made to coexist.

was evaluated as aforementioned was found to confirm the relationship between the solubility in a matrix and the reaction rate in the case of photo-curing a (metha)acryloyl type polyfunctional monomer by naphthalimide. A saturated concentration at 20° C. in methylacrylate was also found to generalize the evaluation of solubility. The results are shown in Table B7.

TABLE B7

| Compound | saturated concentration (mol/L) | | Reaction rate (%) | |
| --- | --- | --- | --- | --- |
|  | Methacrylate | M305 | 50 mJ/cm$^2$ | 100 mJ/cm$^2$ |
| B1 | 0.006 | 0.042 | 0.2 | 0.2 |
| B7 | 0.027 | 0.085 | 0.5 | 1.4 |

It is found from these results that a sample having better solubility has a higher reaction rate. Specifically, when the naphthalimide part has the same structure, solubility in the matrix is changed corresponding to the structure of the side chain extended from the nitrogen atom of the imide bond and a high reaction rate is obtained despite a small exposure amount by improving this solubility.

(10) Evaluation of Out-Gas

Each of the photosensitive resin compositions B1, B2, B3 and B7 and comparative composition B3 was applied by spin coating to a glass substrate and heated on a 50° C. hot plate for one minute. Then, the substrate was exposed to light from a high pressure mercury lamp at an intensity of 2000 mJ/cm$^2$ based on h-rays by using a hand-operated exposure apparatus (MA-1200, manufactured by Dainippon Screen Mfg. Co., Ltd.), to obtain a coating layer having a thickness of 25 μm.

The glass substrate provided with the coating layer formed thereon was cut into a size of 1 cm×1.5 cm, which was then

TABLE B6

| Photosensitive Compositions | Compound No. | Compatability with Trifunctional Acrylate M305 | Odors during Exposure | Reaction rate (%) Exposure amount (mJ/cm$^2$) | | | Coloring of Coating Layer |
| --- | --- | --- | --- | --- | --- | --- | --- |
|  |  |  |  | 50 | 100 | 400 |  |
| B14 | B1 | X | None | 0.1 | 0.5 | 1.1 | Cloudy |
| B15 | B2 | X | None | 1.5 | 2.9 | 4.2 | Cloudy |
| B16 | B3 | o | None | 2.5 | 4.7 | 9.9 | Transparent |
| B17 | B4 | X | None | 1.7 | 2.6 | 4.4 | Cloudy |
| B18 | B5 | o | None | 0.6 | 1.1 | 4.9 | Transparent |
| B19 | B6 | X | None | 0.5 | 0.5 | 1.2 | Cloudy |
| B20 | B7 | o | None | 4.8 | 8.2 | 18.4 | Transparent |
| B21 | B8 | X | None | 0.6 | 1.1 | 4.2 | Cloudy |
| B22 | B9 | X | None | 6.8 | 14.4 | 33.9 | Cloudy |
| B23 | B10 | X | None | 16.2 | 24.1 | 38.3 | Turbid pale yellow |
| B24 | B11 | o | None | 2.3 | 4.8 | 11.9 | Transparent |
| B25 | B12 | o | None | 0.3 | 1.4 | 13.4 | Yellow |
| B26 | B11 | o | None | 0.9 | 1.7 | 5.8 | Transparent |
| Comparative B5 | Comparative B1 | o | None | 3.0 | 5.7 | 17.7 | Transparent |
| Comparative B6 | Comparative B2 | X | None | 0.1 | 0.5 | 0.7 | Cloudy |
| Comparative B7 | Benzophenone | o | Slightly present | 0.2 | 0.7 | 1.3 | Transparent |

(5) Solubility in Monomer Components

As to the compounds B1 and B7 which have naphthalimide parts having the same structures and differ in the spacer part from each other, the saturated concentration at 20° C. in the trifunctional monomer M305 (trademark: manufactured by Toagosei Co., Ltd.) which was the matrix when the curability heated at 250° C. for one hour, and the generated gas was analyzed using GC-MS (QP-5000, manufactured by Shimadzu Corporation).

Other measuring conditions are as follows.

Collector: Curie Point Purge and Trap (JHS-100A type) manufactured by Japan Analytical Industry Co., Ltd.

Heating condition: 250° C.×60 min.

Adsorbent: TENAX TA (2,6-Diphenyl-p-Phenylene Oxide), weak polarity

Collecting temperature: −40° C. (using liquid nitrogen for cooling)

Heat decomposition temperature: 255° C.×30 s

Inlet temperature: 250° C.

Column: 5% Phenyl-95% dimethylsiloxane (PTE-5), weak polarity, inside diameter: 0.25 μm, length: 30 m Column temperature: 50° C.×5 min (kept)–10° C./min. (temperature-up)–320° C.×3 min.(kept)

Ionization method: Electron collision ionization method (EI method)

Detector: quadrupole type detector

As a result, decomposed materials originated from the polyfunctional monomer M305 were detected in all samples. Moreover, several types of aromatic compound which were considered to be decomposed materials originated from other photoradical generators were detected in only the coating layer using the comparative composition B3.

It becomes clarified from the above results that the naphthalimide compound according to the present invention does not generate decomposed materials originated from the initiator as gas by heating.

The radial generator according to the second aspect as aforementioned can cause a radical reaction when excited by applying light since the naphthalimide structure-containing group functions as a hydrogen-drawing type radical-generating part. The naphthalimide structure-containing group is a hydrogen-drawing type which is more stable than a self-cleavage type and also, has a naphthalene skeleton having high thermal resistance and therefore, a photoradical generator having high thermal resistance, stability and preserving ability can be obtained.

Also, the radical generator according to the present invention can be reacted not only with an ethylenic unsaturated bond but also with various compounds such as aromatic rings and enables a polymer to be crosslinked and can initiate a radical reaction even in the case of a resin composition having no ethylenic unsaturated bond. Therefore, the photoradical generator according to the present invention is used as an usual photoradical polymerization initiator and also used as a crosslinking agent for a resin composition containing, for example, an aromatic polymer, to be able to improve solvent resistance of the cured coating layer.

Also, the radical generator according to the present invention has two or more naphthalimide structure-containing groups, which function as a radical-generating part, in one molecule. Radicals generated in any one among the plural naphthalimide structure-containing groups and bonded to a reaction product such as a polymer whereby the radical generator constitutes a part of the chemical structure of a reaction product such as a polymer. Since the radical generator constitutes a part of the chemical structure of a reaction product such as a polymer, the radical generator does not remain in a free state in the reaction product such as a polymer even if the radical generator is left unreacted. Also, even if the radical-generating part remains unreacted, a volatile decomposed material is not generated in a cured coating layer because the radical-generating part is a hydrogen-drawing type and has a naphthalimide structure having high thermal resistance. For this, the radical generator is not volatilized during post-baking and unlike usual, it does not remain independently in the coating layer. As a consequence, a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, a reaction for forming a maleimide structure does not proceed without acceleration of a dehydration condensation reaction, for example, by heating or by using a catalyst. For this, there are various synthesis problems. In the reaction for forming a naphthalimide structure, a dehydration condensation reaction easily proceeds and therefore the synthesis of the naphthalimide structure is very simpler than that of imides having a five-membered cyclic structure such as maleimide. The solubility in a solvent is also good. Accordingly, it is advantageous from the viewpoint of synthesis, and thus productivity including yield, reaction rate, control aspect and cost aspect is raised.

In the photosensitive resin composition according to the present invention, the naphthalimide structure-containing group of the photoradical polymerization initiator comprising the compound (c) functions as a hydrogen-drawing type radical-generating part and radicalized when excited by applying light to cause a radical reaction in the resin composition. Radicals generated by the naphthalimide structure-containing group can react not only with an ethylenic unsaturated bond, but also with various compounds such as aromatic rings, and therefore can crosslink a polymer, initiate a radical reaction and cause curing and/or a change in solubility. Moreover, a radical generated in any one among two or more naphthalimide structure-containing groups is bonded to the resin composition, it constitute a part of the chemical structure of the resin composition. Therefore, the radical generator and its decomposition material do not remain in a free state in the resin composition. As a consequence, a problem concerning a reduction in the reliability of a final product is solved.

When the photosensitive resin composition according to the second aspect is used as a pattern forming material (resist), paint or printing ink or formation materials for a color filter, electronic part, layer insulation film, wire cover film, optical material, optical circuit, optical circuit parts, antireflection film, hologram or building material, there is such an effect that the product or film has high thermal resistance and high stability. Also, it is free from the generation of odors during exposure, which improves the operational circumstance.

The resulting printed product, color filter, electronic parts, layer insulation film, wire cover film, optical material, optical circuit, optical circuit parts, antireflection film, hologram or building material has such a merit that each product has high thermal resistance and high stability as products and films and high productive yield is therefore obtained since at least a part thereof is formed of a cured product of the photosensitive resin composition having high thermal resistance and high stability.

(3) Third Aspect According to the Present Invention

Next, a photosensitive compound according to a third aspect of the present invention will be explained. The photosensitive compound according to the present invention include a first photosensitive compound comprising a compound (d) having a naphthalimide structure-containing group and an ethylenic unsaturated group in one molecule and represented by the following formula (5) and a second photosensitive compound comprising a polymer (e) of one or more polymerizable compounds containing at least the aforementioned compound (d):

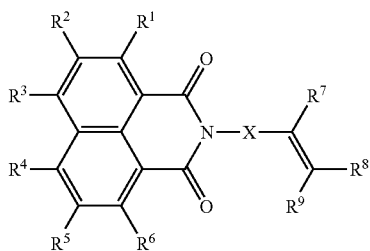

Formula (5)

wherein $R^1$, $R^2$, $R^3$, $R^4$, $R^5$ and $R^6$ respectively represent a hydrogen atom or a substituent and may be bonded to each other to form a cyclic structure, $R^7$, $R^8$ and $R^9$ respectively represents a hydrogen atom or a monovalent organic group and X represents a divalent group.

The photosensitive compound consisting the compound (d) or the polymer (e) can cause a radical reaction or initiate radical polymerization and in the case where it has two or more naphthalimide structure-containing groups in one molecule, can crosslink a polymer, when excited by applying light because the naphthalimide structure-containing group functions as a hydrogen-drawing type radical-generating part.

Also, the compound (d) has a naphthalimide structure-containing group which is a radical-generating part and an ethylenic unsaturated group which is a radical polymerizable part and combines a function as a radical generator and a function as a curable reactive compound.

On the other hand, since a compound having two or more naphthalimide structure-containing groups which are the radical-generating parts in one molecule can be easily synthesized as the polymer (e), the polymer (e) can combine a function as a radical generator and a function as a crosslinking agent. Also, it is possible to provide a function as a macro molecular weight binder component by regulating the molecular weight of the polymer (e).

In the naphthalimide structure-containing group involved in the formula (5), $R^1$, $R^2$, $R^3$, $R^4$, $R^5$ and $R^6$ respectively represent a hydrogen atom or a substituent and may be bonded to each other to form a cyclic structure.

The above substituents $R^1$, $R^2$, $R^3$, $R^4$, $R^5$ and $R^6$ are the same as those in the aforementioned first aspect.

In the ethylenic unsaturated group involved in the formula (5), $R^7$, $R^8$ and $R^9$ are respectively a hydrogen atom or a monovalent organic group, preferably a hydrogen atom, a halogen atom, a saturated or unsaturated alkyl group, a saturated or unsaturated halogenated alkyl group or a saturated or unsaturated hydroxyalkyl group, and particularly preferably a hydrogen atom, a halogen atom, a methyl group, a trifluoromethyl group or a hydroxymethyl group. Particularly, in ethylenic unsaturated group, it is most preferable that $R^7$ be a hydrogen atom, a halogen atom, a methyl group, a trifluoromethyl group, or a hydroxymethyl group and $R^8$ and $R^9$ be respectively a hydrogen atom or a fluorine atom from the viewpoint of cost, the rate of a radical reaction and physical properties of a final coating layer.

Preferable examples of the ethylenic unsaturated group include an acryloyl group, methacryloyl group, 2-trifluoromethylacryloyl group and unsubstituted vinyl group.

In the formula (5), the chemical structure X connecting the naphthalimide structure-containing group with the ethylenic unsaturated group may be any of chemical structures having two or more valencies but typically a divalent organic group, which may have a chemical structure represented by the following formula (6).

-Y-Z-  Formula (6)

In the divalent organic group represented by the formula (6), Y represents a divalent organic group and Z may be any one of bonds capable of combining with the ethylenic unsaturated part. There may be exemplified a single bond, ester bond, ether bond, thioether bond, amino bond, amide bond, urethane bond, urea bond, thiocarbamate bond, carbodiimide bond and carbonate bond. However, no particular limitation is imposed on the bond as far as it is a known divalent bond.

Z is preferably a single bond, ester bond, ether bond, thioether bond, amino bond, amide bond, urethane bond, urea bond, thiocarbamate bond, carbonate bond or the like in view of cost, availability and synthetic simplicity.

Also, Y in the formula (6) is a divalent organic group without any particular limitation. Specifically, straight-chain, branched or cyclic alkylene groups having about 1 to 15 carbon atoms are preferable. In this case, these saturated alkylene groups may contain an aliphatic and/or aromatic cyclic part and/or an additional structure such as an ester bond, ether bond, thioether bond, amino bond, amide bond, urethane bond, urea bond, thiocarbamate bond, carbodiimide bond or carbonate bond or the like either singly or in combinations of two or more in the alkyl chain, namely in the midst of the carbon skeleton.

Examples of the chemical structure X except for divalent organic groups include skeletons such as siloxane, silane and borazine.

The chemical structure X is preferably a straight-chain or branched alkyl group and more preferably those containing an ester bond, ether bond, amide bond, urethane bond and urea bond therein from the viewpoint of cost, availability, synthetic simplicity and solubility. Also, straight-chain or branched alkyl groups having a saturated or unsaturated cyclic structure are preferable and these alkyl groups more preferably have an ester bond, ether bond, amide bond, urethane bond and urea bond therein from the view point of thermal resistance.

The compound (d) represented by the formula (5) is a 1,8-naphthalimide compound and is usually synthesized from 1,8-naphthalic acid anhydride having substituents at its first and eighth positions wherein these substituents are bonded to form anhydride. The photosensitive compound containing the compound (d) having such a chemical structure has high productivity including a yield, reaction rate, control aspect and cost aspect.

The compound (d) may be synthesized using various known methods. Specific examples include, though not particularly limited to, a method using a reaction between a naphthalic acid anhydride and an amine having an ethylenic unsaturated bond and a method in which an amino alcohol is reacted with a naphthalic acid anhydride to synthesize N-hydroxyalkyl(allyl)naphthalimide, which is then dehydration-condensed with a (metha)acrylic acid or reacted with a (metha)acrylic acid chloride.

As the raw material in the above synthetic methods, similarly to the first aspect, acid anhydrides such as 1,8-naphthalic acid anhydride and 4-bromo-1,8-naphthalic acid anhydride or their derivatives may be used.

As the raw material for introducing the ethylenic unsaturated group, those having an ethylenic unsaturated bond and also a functional group which can be bonded to the naphthalimide structure-containing group are appropriately selected.

The substituents RE to $R^9$ in the formula (5) may be included in the raw material compound in advance or may be introduced after the ethylenic unsaturated group is bonded to the naphthalimide structure-containing group.

Specific examples of methods of synthesizing the compound (d) will be hereinafter given, but these examples are not intended to be limiting of the synthetic method of the present invention. Also, the compound (d) may be synthesized using similar methods or known methods.

First, 1,8-naphthalic acid anhydride is poured into N,N-dimethylformamide, and stirred. To there, 2-aminoethanol in an equal mol to that of the naphthalic acid anhydride is added dropwise, and stirred at ambient temperature for about 1 to 15 hours. The subsequent procedures and other reaction conditions, for example, reaction temperature, the use of an azeotropic solvent and refining method are made in the basically same as in the case of synthesizing the compound (a) in the aforementioned first aspect to thereby obtain an N-substituted naphthalimide compound (N-2-hydroxyethylnaphthalimide in this case) which is a precursor of the compound (d).

Next, N-2-hydroxyethylnaphthalimide thus obtained and 1.2 mol equivalents of 4-dimethylaminopyridine are dissolved in a solvent such as dehydrated toluene. To there, 1.2 mol equivalents of acrylic acid chloride is gradually added dropwise, and stirred at ambient temperature for 1 to 15 hours. The reaction solution is treated with 1N HCl by using a separating funnel to transfer 4-dimethylaminopyridine to the water phase. After the water phase is separated from the oil phase, the oil phase is further treated with a saturated $NaHCO_3$ solution to transfer acrylic acid originated from unreacted acrylic acid chloride to the water phase, and the oil phase is separated from the water phase. The oil phase obtained in this manner is dehydrated using an appropriate dehydrator such as magnesium sulfate, followed by filtration. The filtrate from which a solvent is distilled is re-crystallized to obtain the compound (d).

An ethylenic unsaturated bond may be introduced into N-2-hydroxyethylnaphthalimide, which is synthesized by reacting 2-aminoethanol with 1,8-naphthalic acid anhydride, by using various methods other than the aforementioned methods. A similar compound can be obtained by, for example, a method of dehydration condensation using an acid catalyst as disclosed in the publication of WO98/58912.

As the acid anhydride used in the methods exemplified above, not only 1,8-naphthalic acid anhydride but also compounds into which the substituent has been introduced in advance such as 4-bromo-1,8-naphthalic acid anhydride having a bromo group at the fourth position may be used according to the purpose.

Also, the amino compound is not limited to 2-aminoethanol and various amine compounds may be used according to the purpose. There may be exemplified oxyalkylamines such as propanolamine and hexanolamine; and substituted oxyalkylamines such as ethoxyethanolamine, propoxypropanolamine and 2-(2-aminoethoxy)ethanol.

Further, at this time, the (substituted) oxyalkylamine and acrylic acid chloride are not used, but an amine having an ethylenic unsaturated bond may be used. Specific examples include various aminoalkyl vinyl ethers, for example, aminomethyl vinyl ether, aminoethyl vinyl ether, aminobutyl ether, aminohexyl vinyl ether, aminocyclohexyl vinyl ether, aminononyl vinyl ether and compounds obtained by substituting these ethers with an alkyl or aryl group at the α-position or β-position of the vinyl group, for example, aminoalkyl propenyl ether, aminoalkyl isopropenyl ether and aminoalkyl styryl ether.

Next, the polymer (e) of the second photosensitive compound according to the second aspect is a homopolymer of the above compound (d) or a binary or more pluralistic system copolymer obtained by copolymerizing the compound (d) with various compounds having ethylenic unsaturated groups and has a chemical structure in which usually two naphthalimide structure-containing groups are bound pendant-wise with a polymer skeleton formed by a polymerization reaction of an ethylenic double bond.

Examples of the ethylenic unsaturated group-containing compound to be copolymerized with the compound (d) may include, though not particularly limited to, unsaturated monocarboxylic acids such as (metha)acrylic acids, crotonic acid, α-chloroacrylic acid and cinnamic acid; unsaturated dicarboxylic acids (anhydrides) such as maleic acid, maleic acid anhydride, fumaric acid, itaconic acid, itaconic acid anhydride, citraconic acid, citraconic acid anhydride and mesaconic acid; unsaturated polyvalent carboxylic acids (anhydrides) having three or more valencies; mono[(metha)acryloyloxyalkyl]esters of polyvalent carboxylic acids having two or more valencies such as mono[2-(metha)acryloyloxyethyl succinate and mono[2-(metha)acryloyloxyethyl phthalate; mono(metha)acrylates of both-terminal carboxy polymers such as ω-carboxy-polycaprolactonmono(metha)acrylate, aromatic vinyl compounds such as styrene, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, o-vinyl benzylmethyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether and indene; unsaturated carboxylates such as methyl(metha)acrylate, ethyl(metha)acrylate, n-propyl(metha)acrylate, i-propyl(metha)acrylate, n-butyl(metha)acrylate, i-butyl(metha)acrylate, sec-butyl(metha)acrylate, t-butyl(metha)acrylate, 2-hydroxyethyl(metha)acrylate, 2-hydroxypropyl(metha)acrylate, 3-hydroxypropyl(metha)acrylate, 2-hydroxybutyl (metha)acrylate, 3-hydroxybutyl(metha)acrylate, 4-hydroxybutyl(metha)acrylate, allyl(metha)acrylate, benzyl (metha)acrylate, cyclohexyl(metha)acrylate, phenyl(metha)acrylate, 2-methoxyethyl(metha)acrylate, 2-phenoxyethyl (metha)acrylate, methoxydiethylene glycol (metha)acrylate, methoxytriethylene glycol(metha)acrylate, methoxypropylene glycol(metha)acrylate, methoxydipropylene glycol (metha)acrylate, isobornyl (metha)acrylate, dicyclopentadienyl(metha)acrylate and 2-hydroxy-3-phenoxypropyl (metha)acrylate; unsaturated aminoalkyl carboxylates such as 2-aminoethyl(metha)acrylate, 2-dimethylaminoethyl (metha)acrylate, 2-aminopropyl(metha)acrylate, 2-dimethylaminopropyl(metha)acrylate, 3-aminopropyl(metha)acrylate and 3-dimethylaminopropyl(metha)acrylate; unsaturated glycidyl carboxylates such as glycidyl(metha)acrylate; vinyl carboxylates such as vinyl acetate, vinyl propionate, vinyl butylate and vinyl benzoate; unsaturated ethers such as vinyl methyl ether, vinyl ethyl ether, allyl glycidyl ether and methallyl glycidyl ether; vinyl cyanide compounds such as (metha)acrylonitrile, α-chloroacrylonitrile and vinylidene cyanide; unsaturated amides such as (metha)acrylamide, α-chloroacrylamide and N-(2-hydroxyethyl)(metha)acrylamide; unsaturated imides such as maleimide, N-cyclohexylmaleimide and N-phenylmaleimide; aliphatic conjugated dienes such as 1,3-butadiene, isoprene and chloroprene; and macromonomers having a monoacryloyl group or a monomethacryloyl group at the terminal of a polymer molecular chain such as polystyrene, polymethyl(metha)acrylate, poly n-butyl (metha)acrylate and polysilicone. These ethylenic unsaturated group-containing compounds may be used either singly or in combinations of two or more.

When the polymer (e) is used as a material (resist) for forming a pattern by exposure in applications such as electronic parts and color filters, a compound having an alkali-soluble or hydrophilic functional group such as a carboxyl group, phenolic hydroxyl group, sulfonic acid group and hydroxyl group as other monomers constituting the polymer (e) together with the compound (d) may be copolymerized to provide alkali developing ability.

The compound (e) may be homopolymerized or copolymerized with other unsaturated compounds. Particularly, the naphthalimide structure is not radicalized only by heating and it is therefore preferable to polymerize the compound (d) by using a heat radical generator. According to this method, a radical reaction between ethylenic unsaturated bonds can be run selectively while evading a crosslinking reaction caused by the naphthalimide structure containing group. Therefore, no gelation is caused during the course of the synthesis of the polymer (e). On the other hand, the compound having a maleimide structure as a radical-generating part together with an ethylenic unsaturated group has both a maleimide structure and an ethylenic unsaturated bond and it is therefore difficult to polymerize only the ethylenic unsaturated bond selectively, so that gelation is easily caused during a polymerization reaction.

The structural unit derived from the compound (d) is preferably contained in an amount of 0.5 mol % or more in the polymer (e) to generate radicals in a sufficient amount and to form crosslinking bonds in a sufficient amount.

In the case of using the polymer (e) as a main polymer in a photosensitive resin composition, its weight average molecular weight is designed to be about 500 to 500,000 based on polystyrene to impart film forming property. If this molecular weight exceeds 500,000, there is the case where the solubility is dropped, thus being not practicable.

The absorption wavelength of the photosensitive compound (compound (d) or polymer (e)) is considered to be the same as that of the aforementioned compound (a) according to the first aspect.

Specifically, the photosensitive compound has a longer absorption wavelength than maleimide since many n-bonds are connected and therefore has an absorption easily in a wavelength of 365 nm which is the major emitting wavelength of a high pressure mercury lamp, showing good sensitivity.

In order to improve sensitivity to irradiation, it is effective to select the substituents $R^1$ to $R^6$, the substituents $R^7$ to $R^9$ and X connecting them such that the naphthalimide skeleton contained in the structure of the compound (d) or the polymer (e) has a structure which is excited by radial-rays and easily generates radicals.

In order to obtain practical sensitivity, it is preferable to make a combination of the substituents $R^1$ to $R^9$ in the formula (5) so that apart of the absorption wavelength of the photosensitive compound is overlapped on any of the emission wavelengths of an exposure light source (irradiation light source) in a process. Particularly, it is preferable that the absorption maximum of the compound (d) or polymer (e) fall within a range of preferably ±20% and more preferably ±10% of the emitting wavelength closest to the absorption maximum.

The molar extinction coefficient of the compound (d) or polymer (e) in any of the emitting wavelengths of an exposure light source (irradiation light source) in a process is preferably 0.1 or more from the same viewpoint of sensitivity.

Also, in the case where the maximum molar extinction coefficient $\epsilon_{max}$ of the compound (d) or polymer (e) is 2000 or more, it is thought that the generation of radicals and a crosslinking reaction are easily caused, which is desirable.

Other relationships between the absorption wavelength of the photosensitive compound comprising the compound (d) or polymer (e) and the emitting wavelength of a light source are the same as in the case of the aforementioned compound (a) according to the first aspect.

Since the photosensitive compound of the present invention is a hydrogen-drawing type, a radical is scarcely generated only by heating. Also, since the base skeleton is a naphthalimide skeleton, the photosensitive compound is scarcely decomposed by heating. Therefore, it has high thermal resistance, imparts good preserving stability to a photosensitive resin composition when compounded in the resin composition, improves the stability of the cured film which will be finally obtained and also prevents the light-resistance of the coating layer from being impaired and coloring, fading, peeling and cracks of the coating layer.

In the photosensitive compound according to the present invention, the 90% heat decomposition temperature of the compound (d) is preferably 50° C. or more and more preferably 100° C. or more in view of thermal resistance.

Similarly to the aforementioned compound (a) according to the first aspect, the photosensitive compound preferably has high solubility when compounded in a photosensitive resin composition with the intention of improving coating suitability, transparency of the cured film and sensitivity during exposure.

Specifically, the solubility of the photosensitive compound in a solvent to be used for the preparation of a coating solution is preferably 0.1% by weight or more.

When high transparency is needed, all ray-transmittance (JIS K7105) is preferably 90% or more and more preferably 95% or more when the film thickness of the coating layer formed by curing a photosensitive resin composition is 10 µm.

Further, a saturated concentration of the compound (d) in methylacrylate at 20° C. is preferably 0.01 mol/L or more when evaluating solubility by using methylacrylate as a typical monomer component.

Also, in the case of a polymer having a naphthalimide structure part, each naphthalimide part contained in the polymer is regarded as one molecule to calculate as the saturated concentration (mol/L) of a naphthalimide structural unit. This can be calculated by finding the copolymerization ratio of the polymer by using a NMR (nuclear magnetic resonance analyzer) or the like.

The solubility or compatibility of the photosensitive compound can be improved by introducing the same substituent as those in the compound (a) into a naphthalimide ring. The solubility or compatibility of the compound (d) also can be improved by changing the structure of X or by introducing a substituent into X in the formula (5). The substituent introduced into or the structural reformation made to the naphthalimide ring or X part of the compound (d) are selected variously corresponding to a solvent in which the compound (d) is intended to be dissolved and other solid components which are intended to be solved mutually. For example, when selecting a carboxyl group as the substituent, it is easily solved in water and organic polar solvents whereas when introducing an ester, its solubility in a solvent or a compound having an ester bond is improved.

Both the photosensitive compounds comprising the compound (d) or the polymer (e) have the naphthalimide structure-containing group which is a photosensitive radical-generating part and functions as a photoradical generator.

Particularly, since the compound (d) has an ethylenic unsaturated group which is a radical polymerizable part together with the naphthalimide structure-containing group and combines a function as a photoradical generator and a function as a radical polymerizable component, and it may be preferably used a curable reactive compound in a photosensitive resin composition. Also, the compound (d) is used as a raw monomer of the polymer (e).

On the other hand, the polymer (e) generally has two or more naphthalimide structure-containing groups which are radical-generating part in one molecule and combines a function as a radical generator and a function as a crosslinking agent, and it may be preferably used as a radical generator and/or a crosslinking agent for a photosensitive resin composition. Also, the polymer (e) can be provided with a function as a macro molecular weight binder component by controlling its molecular weight.

The naphthalimide structure-containing group contained in the photosensitive compound according to the present invention functions as a hydrogen-drawing type radical-generating part and can cause a radical reaction by exciting it by applying light such as electromagnetic wave and radial-rays. The naphthalimide structure-containing group is not a self-cleavage type but a hydrogen-drawing type and also, has a naphthalene skeleton having high thermal resistance and therefore, the photosensitive compound of the present invention has high thermal resistance, stability and preserving ability.

Also, since the radical generated by the naphthalimide structure-containing group acts in accordance with a hydrogen-drawing mechanism, it can react not only with a general polymerizable group such as an ethylenic unsaturated bond but also with various compounds such as aromatic rings. Therefore, it can react with a low-molecular weight aromatic compound such as xylene or crosslink polymers having an aromatic part such as PET. Also, in the case of the polymer (e), it has usually two or more naphthalimide structure-containing groups which function as a radical-generating part and therefore these two or more naphthalimide-containing groups in one molecule can be bonded to other molecules to form a three-dimensional crosslinking structure. So, the photosensitive compound of the present invention is used as an usual photoradical polymerization initiator and also used as a crosslinking agent, for example, for a resin composition containing an aromatic polymer to thereby improve solvent resistance after curing.

Also, in the case of the photosensitive compound containing the compound (d), the naphthalimide structure-containing group generates radicals and is directly bonded to a reaction product such as a polymer or, even if the naphthalimide structure-containing group is not radicalized and left unreacted, the ethylenic unsaturated group contained in the same molecule is bonded to a reaction product such as a polymer by a radical reaction whereby the unreacted naphthalimide structure-containing group constitutes a part of the chemical structure of the reaction product such as a polymer.

On the other hand, in the case of the photosensitive compound comprising the polymer (e), if any one among the plural naphthalimide structure-containing groups (radical-generating part) contained in one molecule of the photosensitive compound generates radicals and forms a bond with a reaction product such as a polymer, all of the unreacted radical-generating parts contained in the molecule constitute a part of the chemical structure of the reaction product such as a polymer.

Therefore, the photosensitive compound comprising the compound (d) or the polymer (e) does not remain in a free state in a reaction product such as a polymer and do not volatilize during post-baking even if the radical-generating part remains unreacted. Also, even if the radical-generating part remains unreacted, it does not produce a volatile decomposition material in the cured coating layer since it is a hydrogen-drawing type and also has a naphthalimide structure having high thermal resistance. Therefore, the residue originated from the photosensitive compound of the present invention scarcely causes the coating layer to be denatured. As aforementioned, the radical-generating part of the photosensitive compound of the present invention is bonded to a matrix in the cured coating layer of a photosensitive resin composition when radicalized or, even if it is left unreacted, it constitutes a part of the chemical structure of a matrix in the cured coating layer. In any case, it exists in the cured coating layer in a chemically stable state, so that it does not impair thermal resistance, weather resistance and stability. Therefore, a problem concerning a reduction in the reliability of a final product is solved.

Also, a reaction for forming a maleimide structure is synthetically more advantageous than a reaction for forming a maleimide structure. Therefore, productivity including yield, reaction rate, control aspect and cost aspect is raised.

Next, a photosensitive resin composition according to the third aspect will be explained.

The photosensitive resin composition according to the third aspect contains the photosensitive compound comprising the compound (d) and/or the polymer (e) asessential components and may contain, as required, a radical reactive compound or other curable reactive compound, a macro molecular weight binder component, a hydrogen donor, a radical generator other than the compound (d) or the polymer (e) or other components.

In this photosensitive resin composition (hereinafter referred to simply as a resin composition) according to the third aspect, which contains the aforementioned photosensitive compound according to the present invention, the naphthalimide structure-containing group of the compound (d) or polymer (e) functions as a hydrogen-drawing type radical-generating part and radicalized when excited by applying light such as electromagnetic waves and radial rays to cause a radical reaction in the resin composition. The radical reactive compound in the resin composition causes various radical reactions such as radical polymerization, a radical dimerization reaction with the compound (d) or polymer (e) which is the photosensitive compound, a radical crosslinking reaction or the like according to the type of the compound to thereby cure the resin composition and change solubility. Also, when using the compound (d) as the photosensitive compound, the photosensitive compound itself is cured by a radical polymerization reaction.

When using the compound (d) as the photosensitive compound, the compound (d) itself has an ethylenic unsaturated group and functions as a radical reactive compound and it is therefore possible to prepare the photosensitive resin composition even if a radical reactive compound is not mixed. Also, when the polymer (e) is used as the photosensitive compound, the polymer (e) is allowed to function as a macro molecular weight binder component.

This resin composition according to the third aspect may use the compound (b) having an ethylenic unsaturated bond and a macro molecular compound which is a binder component like the case of the first aspect. As the compound (b)

having an ethylenic unsaturated bond, the same monomer that is used to synthesize the polymer (e) according to the third aspect may be used.

Radicals produced by the naphthalimide structure-containing group contained in the compound (d) or the polymer (e) proceeds with reactions not only with an ethylenic unsaturated bond but also with various compounds such as aromatic rings. Therefore, it can cause curing and/or a change in solubility even in a system in which a compound having an ethylenic unsaturated bond is not present. Therefore, the photosensitive compound not only cures a photosensitive resin composition containing a compound having an ethylenic unsaturated bond by an usual radical polymerization reaction, but also cures, for example, a photosensitive resin composition containing a generally non-polymerizable polymer such as polystyrene or polyethylene terephthalate (PET) by a crosslinking reaction to thereby improve physical properties of a film such as solvent resistance, thermal resistance, hardness, strength and adhesiveness.

Accordingly, as a curable reactive binder component with macromolecular weight to be mixed with the photosensitive compound for preparing the photosensitive resin composition, not only usual radical polymerizable compounds such as compounds having an ethylenic unsaturated bond, but also all known macro molecular compounds may be used.

Also, when using the compound (d) as the photosensitive compound, the compound (d) itself has an ethylenic unsaturated group and functions as a radical reactive compound. Therefore, the photosensitive resin composition may be prepared without mixing a radical reactive compound. Also, in the case of using the polymer (e) as the photosensitive compound, the polymer (e) is allowed to function as a macro molecular weight binder component.

In order to allow the resin composition according to the present invention to exhibit a sufficient effect, the compound (d) or a part derived from the compound (d) in the polymer (e), as the photosensitive compound, is preferably 0.1% by weight or more based on the whole solid of the resin composition from the viewpoint of preventing a retardation in the curing speed of the resin composition when irradiated with light and preventing a drop in the strength and glass transition temperature of the coating layer which drop is due to decreased crosslinking density caused by a reduction in the amount of the generated radicals, and more preferable is 1% by weight or more from the viewpoint of sensitivity and the physical properties of the coating layer.

When the resin composition of the present invention contains the polymer (e) as the photosensitive compound, the polymer (e) is contained in an amount of 1 to 95% by weight and preferably 5 to 80% by weight based on the whole solid from the viewpoint of curability. However, when the polymer (e) has such a structure having one or more ethylenic unsaturated bonds, sufficient curability is obtained even if the ratio of the polymer (e) is more increased to 95% by weight or more and the photosensitive resin composition may have 100% by weight of the polymer (e).

In this case, the mixing ratio of the photosensitive compound to the compound (b) is optionally selected according to the object taking various physical properties into account. It is to be noted that the solid content of the photosensitive resin composition means the whole components other than solvents and a liquid monomer component is included in the solid content.

In the case of a combination use of the compound (b) and other radical reactive compounds as the curable reactive compound, the amount of the compound (d) and/or polymer (e) which are the photosensitive compounds is appropriately regulated corresponding to the type and amount of the radical reactive compound to be combined.

When the photosensitive resin composition of the present invention contains the compound (b) or a macro molecular weight binder component other than the compound (b), these amounts to be formulated is the same as that according to the first aspect.

Also, since the compound (d) or the polymer (e) is a hydrogen-drawing type radical generator, a hydrogen donor is preferably contained in the resin composition of the present invention from the viewpoint of more improving radical-generating efficiency and sensitivity. As the hydrogen donor, the same one as that according to the first aspect may be used.

The resin composition according to the third aspect may use other photoradical generator as required together with the compound (d) and/or the polymer (e) in the same manner as in the first aspect.

The same optional components as those in the first aspect, for example, various organic or inorganic low-molecular or macro molecular compounds may be compounded in the resin composition according to the third aspect to impart processability and various functions.

In the resin composition according to the third aspect, components other than the photosensitive compound preferably has a transmittance of 20% or more in a wavelength range where the emitting wavelength of an irradiation light source is overlapped on the absorption wavelength of the photosensitive compound contained in the resin composition from the viewpoint of regarding the sensitivity as important similarly to the first aspect.

The resin composition according to the third aspect may be diluted with the same solvent that is used in the first aspect so as to have a proper concentration.

Like the resin composition according to the first aspect, the resin composition according to the third aspect may be prepared by mixing and, for example, stirring a curable reactive compound such as the compound (b) and optional components such as a macro molecular weight binder component according to the case and use with the compound (d) and/or the polymer (e) as an essential component.

Like the photosensitive resin composition according to the first aspect, the photosensitive resin composition according to the third aspect obtained in such a manner may be utilized in all known fields and products using materials which are cured or changed in solubility by irradiation with light, such as pattern-forming materials (resists), coating materials, printing inks, adhesives, fillers, formation materials and three-dimensional articles or the like. Particularly, it is suitable for forming paints, printing inks, color filters, electronic parts, layer insulation films, wire cover films, optical materials, optical circuits, optical circuit parts, antireflection films, holograms or building materials for which thermal resistance is required and high reliability is demanded.

Examples According to the Third Aspect

C1. Production Examples

Production Example C1

N-2-hydroxyethylnaphthalimide

A 1 L eggplant-shape flask was charged with 19.8 g (0.1 mol) of 1,8-naphthalic acid anhydride, 500 ml of N,N-dimethylformamide (hereinafter called DMF) and a catalytic amount of pyridine, and stirred. To there, 6.7 g (0.11 mol) of 2-aminoethanol was added dropwise, and stirred at ambient temperature for 15 hours. DMF was distilled by using a rotary evaporator, followed by re-crystallizing from methanol to obtain N-2-hydroxyethylnaphthalimide as needle crystals in an amount of 22.5 g. (Precursor compound C1)

Precursor compound C1

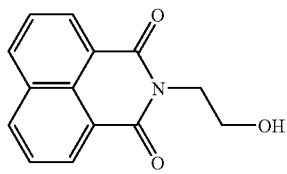

Production Example C2

A reaction was run in the same condition as in production Example C1 except that the acid anhydride as the starting material was altered to 4-bromo-1,8-naphthalic acid anhydride. Each raw material was supplied in the same number of mols as in Production Example C1. (Precursor compound C2)

Precursor compound C2

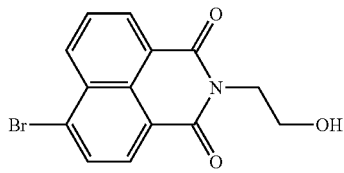

Production Example C3

A reaction was run in the same condition as in production Example C1 except that the acid anhydride as the starting material was altered to 4-chloro-1,8-naphthalic acid anhydride. Each raw material was supplied in the same number of mols as in Production Example C1. (Precursor compound C3)

Precursor compound C3

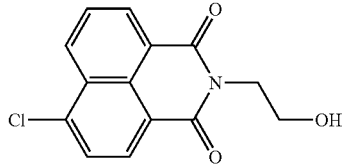

Production Example C4

A reaction was run in the same condition as in production Example C1 except that the acid anhydride as the starting material was altered to 4-nitro-1,8-naphthalic acid anhydride. Each raw material was supplied in the same number of mols as in Production Example C1. (Precursor compound C4)

Precursor compound C4

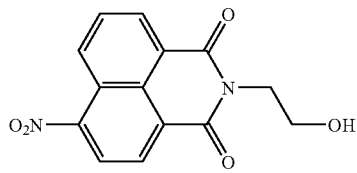

Production Example C5

A reaction was run in the same condition as in production Example C1 except that the amine as the starting material was altered to 2-(2-aminoethoxy) ethanol. Each raw material was supplied in the same number of mols as in Production Example C1. (Precursor compound C5)

Precursor compound C5

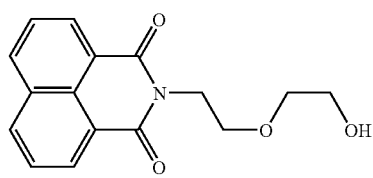

Production Example C6

A reaction was run in the same condition as in production Example C1 except that the amine and acid anhydride as the starting materials were altered to 2-(2-aminoethoxy) ethanol and 4-bromo-1,8-naphthalic acid anhydride respectively. Each raw material was supplied in the same number of mols as in Production Example C1. (Precursor compound C6)

Precursor compound C6

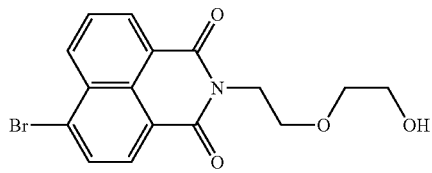

Production Example C7

A reaction was run in the same condition as in Example C1 except that the amine and acid anhydride as the starting materials were altered to 2-(2-aminoethoxy)ethanol and 4-chloro-1,8-naphthalic acid anhydride respectively, to obtain a compound provided with a hydroxyl group at the terminal thereof. Each raw material was supplied in the same number of mols as in Production Example C1. (Precursor compound C7)

Precursor compound C7

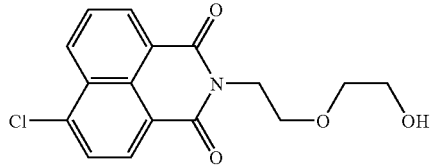

Production Example C8

A reaction was run in the same condition as in Example C1 except that the amine and acid anhydride as the starting materials were altered to 2-(2-aminoethoxy)ethanol and 4-nitro-1,8-naphthalic acid anhydride respectively, to obtain a compound provided with a hydroxyl group at the terminal thereof. Each raw material was supplied in the same number of mols as in Production Example C1. (Precursor compound C8)

Precursor compound C8

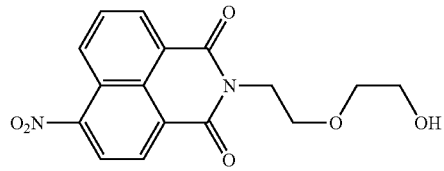

Production Example C9

A reaction was run in the same condition as in production Example C1 except that the amine as the starting material was altered to L-valinol. Each raw material was supplied in the same number of mols as in Production Example C1. (Precursor compound C9)

Precursor compound C9

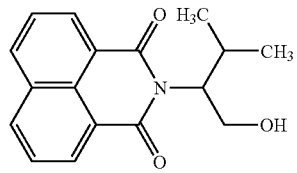

Production Example C10

A reaction was run in the same condition as in production Example C1 except that the amine and acid anhydride as the starting materials were altered to L-valinol and 4-bromo-1,8-naphthalic acid anhydride respectively. Each raw material was supplied in the same number of mols as in Production Example C1. (Precursor compound C10)

Precursor compound C10

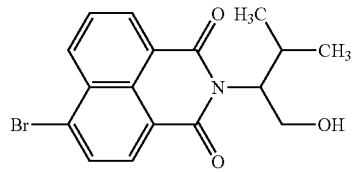

Production Example C11

A reaction was run in the same condition as in Example C1 except that the amine and acid anhydride as the starting materials were altered to L-valinol and 4-chloro-1,8-naphthalic acid anhydride respectively, to obtain a compound provided with a hydroxyl group at the terminal thereof. Each raw material was supplied in the same number of mols as in Production Example C1. (Precursor compound C11)

Precursor compound C11

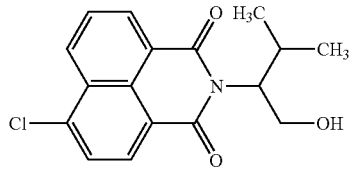

Production Example C12

A reaction was run in the same condition as in Example C1 except that the amine and acid anhydride as the starting materials were altered to L-valinol and 4-nitro-1,8-naphthalic acid anhydride respectively, to obtain a compound provided with a hydroxyl group at the terminal thereof. Each raw material was supplied in the same number of mols as in Production Example C1. (Precursor compound C12)

Precursor compound C12

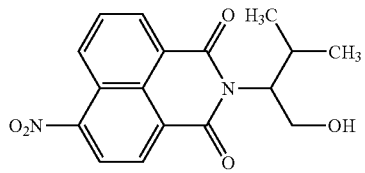

Comparative Production Example C1

Tetrahydrophthalic acid anhydride was reacted with 2-aminoethanol in the same method AS in the publication of WO98/58912. (precursor compound C13)

Precursor compound C13

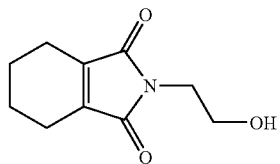

C2. Preparation of a Photosensitive Compound

Example C1

9.6 g (40 mmol) of the precursor compound C1 (N-2-hydroxyethylnaphtalimide) and 5.4 g (44 mmol) of 4-dimethylaminopyridine were poured into a 1 L three-neck flask. A calcium chloride pipe was attached to the center opening and the remainder two openings were sealed with a Silicon W Cap (trademark: manufactured by ASONE CORPORATION). 500 ml of tetrahydrofuran (THF) which had been dehydrated in advance was poured into there by using a syringe, followed by stirring at ambient temperature. 4.0 g (44 mmol) of acrylic acid chloride was added dropwise to there, followed by stirring at ambient temperature for 10 hours. Thereafter, the reaction solution was treated with 1N HCl by using a separating funnel to transfer 4-dimethylaminopyridine to the water phase. After the water phase was separated from the oil phase, the oil phase was further treated using a saturated NaHCO₃ solution to transfer acrylic acid originated from unreacted acrylic acid chloride to the water phase, and the oil phase was separated from the water phase. The oil phase obtained in this manner was dehydrated using a proper dehydrator such as magnesium sulfate, followed by filtration. The filtrate, from which a solvent was removed, was re-crystallized from a chloroform-ethyl acetate mixed solvent to obtain 10.3 g of a target product (compound C1).

Compound C1

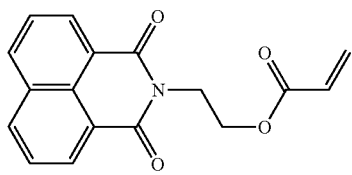

Example C2

A reaction was run in the same condition as in Example C1 except that the compound as the starting material was altered to the precursor compound C2 derived from 4-bromo-1,8-naphthalic acid anhydride. Each raw material was supplied in the same number of mols as in Example C1 (compound C2).

Compound C2

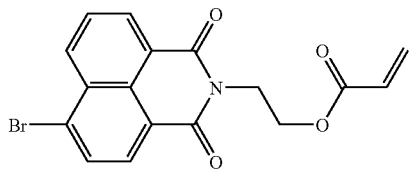

Example C3

A reaction was run in the same condition as in Example C1 except that the compound as the starting material was altered to the precursor compound C3. Each raw material was supplied in the same number of mols as in Example C1 (compound C3).

Compound C3

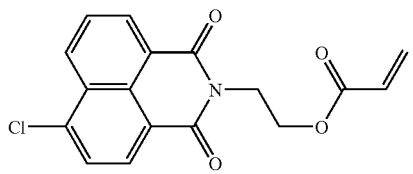

Example C4

A reaction was run in the same condition as in Example C1 except that the compound as the starting material was altered to the precursor compound C4. Each raw material was supplied in the same number of mols as in Example C1 (compound C4).

Compound C4

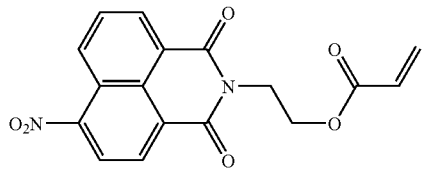

Example C5

A reaction was run in the same condition as in Example C1 except that the compound as the starting material was altered to the precursor compound C5. Each raw material was supplied in the same number of mols as in Example C1 (compound C5)

Compound C5

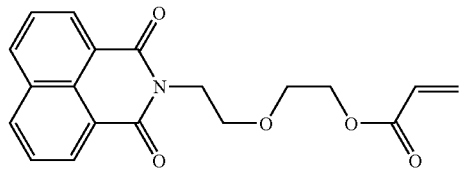

Example C6

A reaction was run in the same condition as in Example C1 except that the compound as the starting material was altered to the precursor compound C6. Each raw material was supplied in the same number of mols as in Example C1 (compound C6).

Compound C6

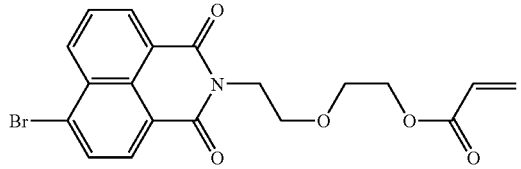

Example C7

A reaction was run in the same condition as in Example C1 except that the compound as the starting material was altered to the precursor compound C7. Each raw material was supplied in the same number of mols as in Example C1 (compound C7).

Compound C7

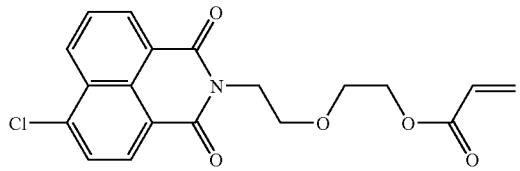

Example C8

A reaction was run in the same condition as in Example C1 except that the compound as the starting material was altered to the precursor compound C8. Each raw material was supplied in the same number of mols as in Example C1 (compound C8).

Compound C8

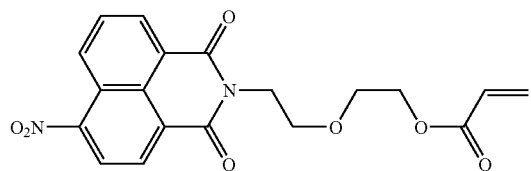

Example C9

A reaction was run in the same condition as in Example C1 except that the compound as the starting material was altered to the precursor compound C9. Each raw material was supplied in the same number of mols as in Example C1 (compound C9).

Compound C9

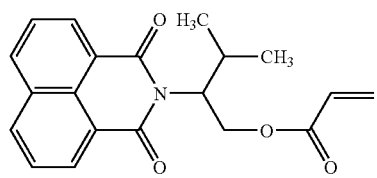

Example C10

A reaction was run in the same condition as in Example C1 except that the compound as the starting material was altered to the precursor compound C10. Each raw material was supplied in the same number of mols as in Example C1 (compound C10).

Compound C10

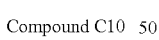

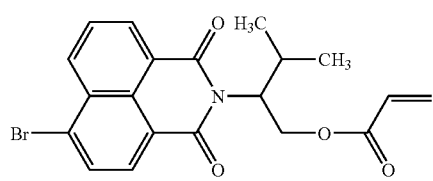

Example C11

A reaction was run in the same condition as in Example C1 except that the compound as the starting material was altered to the precursor compound C11. Each raw material was supplied in the same number of mols as in Example C1 (compound C11).

Compound C11

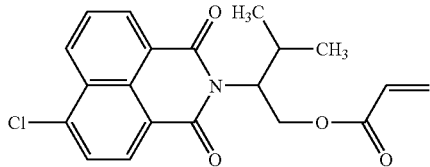

Example C12

A reaction was run in the same condition as in Example C1 except that the compound as the starting material was altered to the precursor compound C12. Each raw material was supplied in the same number of mols as in Example C1 (compound C12).

Compound C12

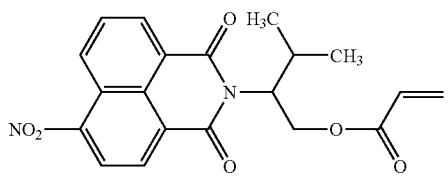

Example C13

3.3 g (10 mmol) of the compound C3 was poured into a 1 L three-neck flask and dissolved in 500 mL of dry isopropyl alcohol, followed by stirring at ambient temperature. An isopropyl alcohol solution of sodium isopropoxide obtained by reacting 1 g of metal sodium with 200 mL of dry isopropyl alcohol was gradually added dropwise to there to trace the process of the reaction by TLC (thin layer chromatography). The dropwise addition was continued until the spot of the compound C3 which was the starting material disappeared, and the reaction was finished when the spot of the compound C3 disappeared. The reaction solution was poured into 5 L of pure water. The precipitate was dried and then purified by column chromatography to obtain a compound C13.

Compound C13

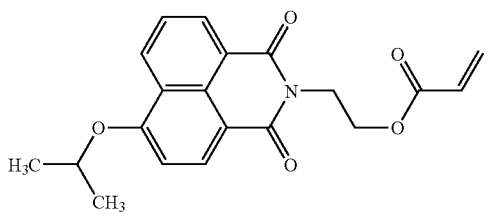

Example C14

A reaction was run in the same condition as in Example C13 except that the starting material was altered to the compound C7, to obtain a compound C14. Each raw material was supplied in the same number of mols as in Example C13.

Compound C14

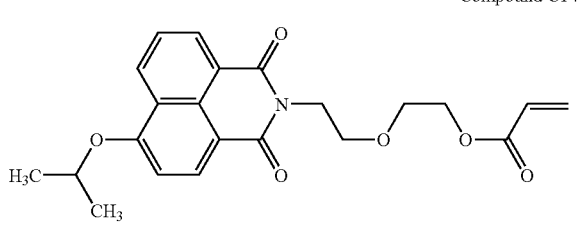

Example C15

A reaction was run in the same condition as in Example C13 except that the starting material was altered to the compound C11, to obtain a compound C15. Each raw material was supplied in the same number of mols as in Example C13.

Compound C15

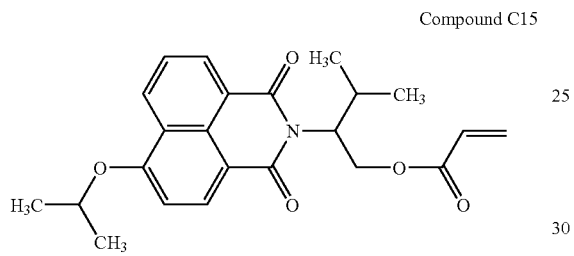

Example C16

8.9 g (0.03 mol) of the compound C1 obtained in Example C1 and 2.6 g (0.03 mol) of methylacrylate were dissolved in 50 mL of tetrahydrofuran, followed by stirring. 200 mg of AIBN (2,2'-azobisisobutyronitrile) was poured into there with replacing the atmosphere with nitrogen flowed at a rate of 100 mL/min, followed by stirring at 40° C. for 5 hours to obtain a solution of a copolymer of the compound C1 and methylacrylate. It was then re-precipitated from hexane to purify. (Compound C16)

Compound C16

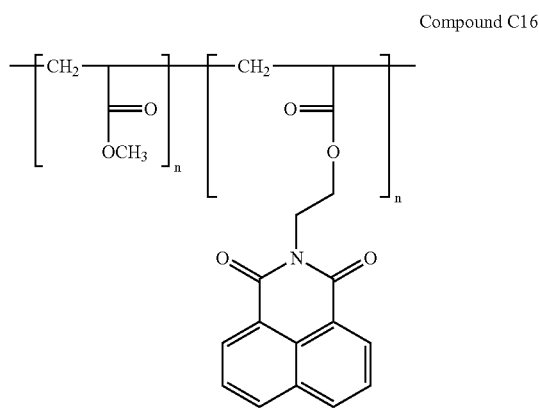

Example C17

3.0 g (10 mmol) of the compound C1 and 3.0 g (30 mmol) of methylmethacrylate were dissolved in 50 mL of chloroform, followed by stirring. 200 mg of AIBN (2,2'-azobisbutyronitrile) was poured into there with flowing nitrogen at a rate of 100 mL/min in a reaction vessel, followed by stirring at 50° C. for 14 hours and the solution was reprecipitated from n-hexane to obtain 5.2 g of a copolymer of the compound C1 and methylmethacrylate. (Compound C17)

The weight average molecular weight based on polystyrene by gel permeation chromatography was 39000 and the copolymerization ratio by NMR was as follows: compound C1: methylmethacrylate=1:3.2.

Compound C17

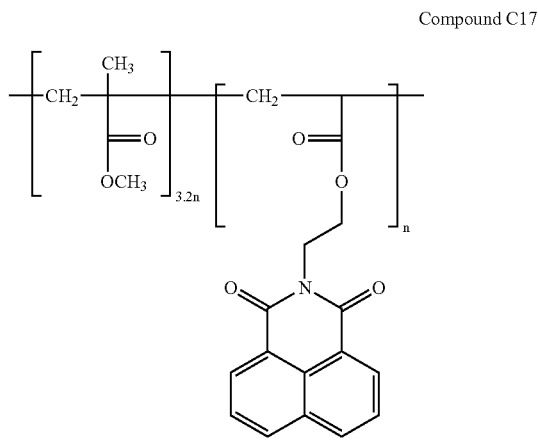

Comparative Example C1

Using the precursor compound C13, a comparative compound C1 having a tetrahydrophthalimide skeleton and an acryloyl group was obtained by using the method in Example C1.

Comparative compound C1

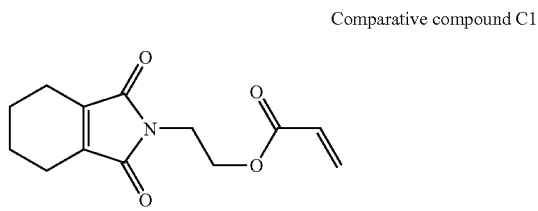

C3. Preparation of a Photosensitive Resin Composition

Examples C18 to C21, Comparative Examples C2 to C4

Each of the compounds C1, C5 and C17 obtained in Examples C1, C5 and C17, the comparative compounds C1 obtained in Comparative Example C1, a commercially available self-cleavage type photoradical generator Irgacure 907 (trademark: Irg 907, manufactured by Ciba Specialty Chemicals) and benzophenone (manufactured by Tokyo Kasei Kogyo Co., Ltd.) was mixed with a trifunctional acrylate (trademark: M-305, manufactured by Toagosei Co., Ltd.) such that the mol ratio of the photoradical-generating part of each compound to the ethylenic double bond of the trifunctional acrylate, namely (photoradical-generating part/ethylenic double bond) was 1/100. Then, it was dissolved in chloroform to produce photosensitive resin compositions C1 to C3 of Examples C18 to C20 and the comparative compositions 1 to 3 of Comparative Examples C2 to C4.

Also, the compound C17 and M305 were mixed in a ratio by weight of 1:1 to produce a photosensitive resin composition C4 of Example C21.

Example C22

Triethanolamine as a hydrogen donor was added to the photosensitive resin compositions obtained in Example C18 in an amount by mol equivalent to that of the photoradical-generating part to produce a photosensitive resin composition C5 of Example C22.

C4. Test of evaluation (1) Evaluation of Thermal Resistance

Using a differential type differential thermal balance (TG8120, manufactured by Rigaku Corporation), the 90% heat decomposition temperature of each of the compounds C1 to C15, the comparative compound C1 and the photoradical generator (trademark: Irgacure 907, manufactured by Ciba Specialty Chemicals) was measured at a temperature rise rate of 10° C./min in a nitrogen atmosphere. The results of measurement are shown in Table C1. It is understood from these results, each heat decomposition temperature of the compounds C1 to C15 is higher than those of the comparative compound C1 and Irg 907, showing that these compounds C1 to C15 have high heat resistance.

TABLE C1

| | 90% Heat Decomposition Temperature (° C.) |
|---|---|
| Compound C1 | 261 |
| Compound C2 | 272 |
| Compound C3 | 271 |
| Compound C4 | 264 |
| Compound C5 | 281 |
| Compound C6 | 286 |
| Compound C7 | 284 |
| Compound C8 | 272 |
| Compound C9 | 235 |
| Compound C10 | 258 |
| Compound C11 | 242 |
| Compound C12 | 243 |
| Compound C13 | 283 |
| Compound C14 | 291 |
| Compound C15 | 255 |
| Comparative Compound C1 | 198 |
| Irg907 | 220 |

(2) Evaluation of Ultraviolet Absorption

Using an acetonitrile solution containing $1.0 \times 10^{-5}$ mol/L of each of the compounds C1, C2, C3 and C13, each ultraviolet absorption spectrum was measured to compare a change depending on a difference by the substituent to be introduced into the naphthalimide aromatic ring. It is to be noted that the compound C4 substituted with a nitro group had poor solubility and the $1.0 \times 10^{-5}$ mol/L solution could not be prepared.

Table C2 shows the maximum wavelength, the molar extinction coefficient (maximum molar extinction coefficient) at its wavelength and the molar extinction coefficient at a wavelength of 365 nm.

TABLE C2

| Compound No. | Substituent on Part of Naphthalimide | $\lambda_{max}$ (nm) | Maximum Molar Extinction Coefficient | Molar Extinction Coefficient at 365 nm |
|---|---|---|---|---|
| C1 | — | 330 | 12500 | 300 |
| C2 | Br | 340 | 14700 | 4300 |
| C3 | Cl | 340 | 12000 | 2200 |
| C13 | iPrO | 365 | 12200 | 12200 |

From these results, the compound C1 having no substituent have a maximum at 330 nm in a solution. It is inferred from the molar extinction coefficient at this wavelength that it is put in an excited state by $\pi$-$\pi$* transition.

It can be estimated from the molar extinction coefficient that what transition state the absorption corresponds to. Generally, with increased molar extinction coefficient, light is more absorbed, namely, a photosensitive compound is excited more easily, radicals are generated more easily and a crosslinking reaction proceeds more easily. As a consequence, a molecule having a large molar extinction coefficient at exposure wavelength is better from the viewpoint of sensitivity.

Also, in the case of the compound C2 into which bromine is introduced and the compound C3 into which chlorine is introduced, at the fourth position of the naphthalimide group, these compounds respectively have the maximum wavelength shifted by about 10 nm to a longer wavelength side as compared with the unsubstituted compounds and have a strong absorption at a wavelength of 365 nm which is the emitting wavelength of a high pressure mercury lamp. Also, the compound C13 into which an isopropyl ether group is introduced as a substituent has a maximum absorption at 365 nm, to find that it has a very strong absorption at 365 nm which is the emission wavelength of a high pressure mercury lamp.

The generation of radicals by naphthalimide is considered to be due to hydrogen-drawing. In general, the generation of radicals due to hydrogen-drawing is said to be caused by the triplet excited state of a carbonyl group.

It is considered that when the ratio of the absorbed energy to be consumed for fluorescent emission and thermal deactivation is large, the efficiency of generation of radicals drops even if a compound is excited.

When the ratio of such a deactivation process other than hydrogen-drawing is small, the stronger the absorption at the exposure wavelength is, the more easily the photosensitive compound is excited. Therefore the efficiency of generation of radicals is considered to be improved, it is expected that the compounds C2, C3 and C13 are more improved than the compound C1 in sensitivity to a wavelength of 365 nm.

(3) Evaluation 1 of Curability

Using, as polyfunctional monomers, a hydroxyl group-containing pentafunctional acrylate (trademark: Sartomer SR399, manufactured by Nippon Kayaku Co., Ltd.) and hexafunctional acrylate (trademark: M400, manufactured by Toagosei Co., Ltd.), each of the compounds C1 to C17 was mixed with each polyfunctional monomer in a ratio by mol of 1/20 to the double bond of the polyfunctional polymer to produce a solution, which was then applied to a glass substrate by spin coating. For comparison, the compound of the example was replaced with photoradical generators Irgacure 369 and Irgacure 907 (trademark) (manufactured by Ciba Specialty Chemicals) and benzophenone (manufactured by Tokyo Kasei Kogyo Co., Ltd.) to form a coating layer and also a coating layer to which non initiator was added was produced.

The above coating layer was irradiated with light at an intensity of 2000 mJ/cm$^2$ based on h-rays by using a hand-operated exposure apparatus (MA-1200, manufactured by Dainippon Screen Mfg. Co., Ltd.), and then, whether the coating layer was cured or not was confirmed. The degree of curing was determined by touching the exposed coating layer with the fingers. The case where the surface of the coating layer was not sticky and became highly hard was defined as ○ and the case where the coating layer was liquid as it was even after exposed to light was defined as x.

Table C3 described below shows the results of evaluation. From the fact that like Irgacure 369 and 907, the compounds C1 to C17 can cure polyfunctional acrylates, it is found that naphthalimide functions as a radical generator. However, unlike self-cleavage type Irgacure 369 and 907, these were odorless.

TABLE C3

| Compound No. | SR-399 | M-400 | Odor |
|---|---|---|---|
| C1 | ○ | ○ | None |
| C2 | ○ | ○ | None |
| C3 | ○ | ○ | None |
| C4 | ○ | ○ | None |
| C5 | ○ | ○ | None |
| C6 | ○ | ○ | None |
| C7 | ○ | ○ | None |
| C8 | ○ | ○ | None |
| C9 | ○ | ○ | None |
| C10 | ○ | ○ | None |
| C11 | ○ | ○ | None |
| C12 | ○ | ○ | None |
| C13 | ○ | ○ | None |
| C14 | ○ | ○ | None |
| C15 | ○ | ○ | None |
| C16 | ○ | ○ | None |
| C17 | ○ | ○ | None |
| Irg369 | ○ | ○ | Slightly present |
| Irg907 | ○ | ○ | Present |
| Benzophenone | ○ | ○ | Slightly present |
| Non initiator | X | X | Present |

(4) Evaluation 2 of Curability

The photosensitive resin compositions C1 to C4 and the comparative compositions C1 to C3 were respectively applied by spin coating to a glass substrate on which chromium was sputtered to obtain coating layers.

A decrement of the peak at 810 cm$^{-1}$ was recorded with time by using an infrared spectrometer while exposing the above coating layer to ultraviolet rays, to confirm the degree of the disappearance of a double bond. The atmosphere around the sample during measurement was replaced with nitrogen. As the UV exposure apparatus, UV Spot Cure SP-III type (standard reflecting mirror type) manufactured by Ushio Inc. was used and as the UV lamp, USH-2 55BY manufactured by Ushio Inc. was used. Also, as the infrared spectrometer, FT S6000 manufactured by BIO RAD was used.

The compatibility with a trifunctional acrylate M305, a decrement of a double bond in relation to exposure amount (reaction rate) and coloring of the coating layer were observed. The results are shown in Table C4.

The compositions C1 to C4 respectively use a compound having a naphthalimide part, the compound being compatible with M305 which is an acryl monomer and highly reactive. This is inferred that the naphthalimide group-containing compound is solved mutually with M305 to progresses the diffusion of generated radicals, thereby running a reaction.

The comparative composition C1 uses the comparative compound C1 having a maleimide group, so that a reaction does not almost proceed though the comparative compound C1 is compatible with M305. The benzophenone which is the similar hydrogen-drawing type radical generator is the same.

Irg907 which is a commercially available photoradical generator has high reactivity and well proceeds with a reaction. However, since it is a self-cleavage type radical generator, impurities remain in the coating layer, causing coloring.

TABLE C4

| Photosensitive Composition | Compound No. | Compatibility with Trifunctional Acrylate M305 | Reaction Rate (%) Exposure amount (mJ/cm$^2$) | | | Coloring of Coating Layer |
|---|---|---|---|---|---|---|
| | | | 50 | 100 | 400 | |
| C1 | C1 | ○ | 2.7 | 5.5 | 19.2 | Transparent |
| C2 | C5 | ○ | 15.1 | 21.4 | 45.4 | Transparent |
| C3 | C17 | ○ | 3.0 | 6.4 | 22.2 | Transparent |
| C4 | C17 | ○ | 7.4 | 13.9 | 27.6 | Transparent |
| ComparativeC1 | Comparative 1 | ○ | 0.1 | 0.3 | 2.0 | Transparent |
| ComparativeC2 | Irg907 | ○ | 34.8 | 40.8 | 50.6 | Yellow |
| ComparativeC3 | Benzophenone | ○ | 1.0 | 1.8 | 4.7 | Transparent |

(5) Evaluation 3 of Curability

To confirm whether the naphthalimide part was a hydrogen-drawing type radical generator or not, the photosensitive resin composition C5 containing triethanolamine was used to observe the compatibility with trifunctional acrylate M305, a decrement (reaction rate) of a double bond in relation to exposure amount and coloring of the coating layer in the same procedures as in the evaluation 2 of curability. The results are shown in Table C5.

It was confirmed from the above results that the reaction rate of the compound C1 was improved by adding triethanolamine. Namely, the naphthalimide group is considered to be improved in sensitivity by exposing it to light in the presence of a hydrogen-donating group.

TABLE C5

| Photo-sensitive Composition | Compound No. | Compatability with Trifunctional Acrylate M305 | Reaction rate (%) Exposure Amount (mJ/cm$^2$) | | | Coloring of Coating Layer |
|---|---|---|---|---|---|---|
| | | | 50 | 100 | 400 | |
| C5 | C1 | ○ | 2.0 | 8.7 | 39.9 | Transparency |

(6) Solubility to Monomer Components

The saturated concentration of the compounds C1 and C5 having similar structures at 20° C. in trifunctional monomer M305 (trademark, manufactured by Toagosei Co., Ltd.) which was the matrix when the above evaluation of curability was carried out was found to confirm the relationship between the solubility in the matrix and the reaction rate in the case of photo-curing a (metha)acryloyl type polyfunctional monomer by naphthalimide. A saturated concentration of the compounds C1 and C5 at 20° C. in methylacrylate was also found to generalize the evaluation of solubility. The results are shown in Table C6.

TABLE C6

| Compound | Saturated Concentration (mol/L) | | Reaction Rate (%) | |
|---|---|---|---|---|
| | Methacrylate | M305 | 50 mJ/cm$^2$ | 100 mJ/cm$^2$ |
| C1 | 0.079 | 0.027 | 2.7 | 5.5 |
| C5 | 0.312 | 0.049 | 15.1 | 21.4 |

It is found from these results that a sample having better solubility has a higher reaction rate. Specifically, it is considered that when the naphthalimide part has the same structure, solubility in the matrix is changed corresponding to the structure of the side chain extended from the nitrogen atom of the imide bond and a high reaction rate is obtained despite a small exposure amount by improving this solubility.

(7) Evaluation of Out-Gas

Each of the photosensitive resin compositions C1 to C4 and comparative composition C2 was applied by spin coating to a glass substrate and heated on a 50° C. hot plate for one minute. Then, it was exposed to light from a high pressure mercury lamp at an intensity of 2000 mJ/cm$^2$ based on h-rays by using a hand-operated exposure apparatus (MA-1200, manufactured by Dainippon Screen Mfg. Co., Ltd.), to obtain a coating layer having a thickness of 25 μm.

The glass substrate provided with the coating layer formed thereon was cut into a size of 1 cm×1.5 cm which was then heated at 250° C. for one hour and the generated gas was analyzed using GC-MS (QP-5000, manufactured by Shimadzu Corporation).

Other measuring conditions are as follows.

Collector: Curie Point Purge and Trap (JHS-100A type) manufactured by Japan Analytical Industry Co., Ltd.

Heating condition: 250° C.×60 min.

Adsorbent: TENAX TA (2,6-Diphenyl-p-Phenylene Oxide), weak polarity

Collecting temperature: −40° C. (using liquid nitrogen for cooling)

Heat decomposition temperature: 255° C×30s.

Inlet temperature: 250° C.

Column: 5% Phenyl-95% dimethylsiloxane (PTE-5), weak polarity, inside diameter: 0.25 μm. length: 30 m Column temperature: 50° C.×5 min (kept)–10° C./min. (temperature-up)–320° C.×3 min.(kept)

Ionization method: Electron collision ionization method (EI method)

Detector: Quadrupole type detector

As a result, decomposed materials originated from the polyfunctional monomer M305 were detected in all samples. Moreover, several types of aromatic compound which were considered to be decomposed materials originated from other photoradical generators were detected in only the coating layer formed using the comparative composition C2. It becomes clarified from the above results that the naphthalimide compound of the present invention does not generate decomposed materials originated from the initiator as gas by heating.

The naphtalimide structure-containing group contained in the photosensitive compound according to the third aspect as aforementioned functions as a hydrogen-drawing type radical-generating part, and can cause a radical reaction when excited by applying light. The naphthalimide structure-containing group is a hydrogen-drawing type which is more stable than a self-cleavage type and also, has a naphthalene skeleton having high thermal resistance and therefore, the photosensitive compound of the present invention has high thermal resistance, stability and preserving ability.

Also, the photosensitive compound according to the present invention can be reacted not only with an ethylenic unsaturated bond but also with various compounds such as aromatic rings, and enables a polymer to be crosslinked and can initiate a radical reaction even in the case of a resin composition having no ethylenic unsaturated bond. Therefore, the photosensitive compound according to the present invention is used as an usual photoradical polymerization initiator and also used as a crosslinking agent for a resin composition containing, for example, an aromatic polymer, to be able to improve solvent resistance of the cured coating layer.

Particularly, the compound (d) has an ethylenic unsaturated group which is a radical polymerizable part together with the naphthalimide structure-containing group and combines a function as a photoradical generator and a function as a radical polymerizable and curable reactive compound and it may be therefore preferably used as a curable reactive compound in a photosensitive resin composition. Also, the compound (d) is used as a raw monomer of the polymer (e).

On the other hand, when the polymer (e) has two or more naphtalimide structure-containing groups which are radical generating parts in one molecule, it combines a function as a radical generator and a function as a crosslinking agent and, it may be therefore preferably used as a radical generator and/or a crosslinking agent for a photosensitive resin composition.

Also, the polymer (e) can be provided with a function as a macro molecular weight binder component by controlling its molecular weight.

Also, in the case where the photosensitive compound is the compound (d), the naphthalimide structure-containing group generates radicals and is directly bonded to a reaction product such as a polymer or, even if the naphthalimide structure-containing group is not radicalized and remains unreacted, the ethylenic unsaturated group present in the same molecule is bonded to a reaction product such as a polymer by a radical reaction, whereby the unreacted naphthalimide structure-containing group also constitutes a part of the chemical structure of the reaction product such as a polymer.

On the other hand, in the case where the photosensitive compound is the polymer (e), if any one among the plural naphthalimide structure-containing groups (radical-generating part) contained in one molecule of the photosensitive compound generates radicals and forms a bond with a reaction product such as a polymer, all of the unreacted radical-generating parts contained in the molecule also constitute a part of the chemical structure of the reaction product such as a polymer.

Therefore, the photosensitive compound comprising the compound (d) or the polymer (e) does not remain in a free state in a reaction product such as a polymer and do not volatilize during post-baking even if the radical-generating part remains unreacted. Also, even if the radical-generating part remains unreacted, it does not produces a volatile decomposition material in the cured coating layer since it is a hydrogen-drawing type and also has a naphthalimide structure having high thermal resistance.

As aforementioned, the radical-generating part of the photosensitive compound of the present invention is bonded to a matrix in the cured coating layer of the photosensitive resin composition when radicalized, or constitutes a part of the chemical structure of a matrix in the cured coating layer even if it is left unreacted. In any case, it exists in the cured coating layer in a chemically stable state, so that it does not impair thermal resistance, weather resistance and stability. Therefore, the photosensitive compound scarcely causes the coating layer to be denatured.

As a consequence, a problem concerning operational safety, problems concerning a decline in the reliability of a final product such as deteriorated light resistance, coloring, fading and peeling and cracks of a coating layer, a problem as to short life of a chemical solution and a problem concerning the generation of odors can be all solved.

Furthermore, a reaction for forming a maleimide structure does not proceed without acceleration of a dehydration condensation reaction, for example, by heating or by using a catalyst. For this, there are various synthesis problems. In the reaction for forming a naphthalimide structure, a dehydration condensation reaction easily proceeds and therefore the synthesis of the naphthalimide structure is very simpler than that of a maleimide structure. Because the solubility in a solvent is also good, which is advantageous from the viewpoint of synthesis. Productivity including yield, reaction rate, control aspect and cost aspect is raised.

The photosensitive resin composition according to the present invention contains a hydrogen-drawing type radical-generating group and therefore has high thermal resistance, stability and preserving stability. Also, in the photosensitive resin composition, the radicals generated by the naphthalimide structure-containing group of the photosensitive compound can react not only with an ethylenic unsaturated bond but also with various compounds such as aromatic rings, and therefore can crosslink a polymer and run a radical reaction even if the photosensitive resin composition has no ethylenic unsaturated bond, thereby causing curing and a change in solubility.

Further, the naphthalimide structure-containing group of the photosensitive compound generates radicals and is then bonded to the matrix structure to constitute the chemical structure of the resin composition. Also, even if the naphthalimide structure-containing group of the photosensitive compound is left unreacted, the ethylenic unsaturated group in the same molecule is bonded to the matrix structure in the case of the compound (d), and other naphthalimide structure-containing group in the same molecule is radicalized and is bonded to the matrix structure in the case of the polymer (e), whereby constituting a part of the chemical structure of the resin composition. Therefore, the radical generator and its decomposition product are not left in a free state in the resin composition. As a consequence, a problem concerning a reduction in the reliability of a final product is solved.

When the photosensitive resin composition according to the present invention is used as a pattern forming material (resist), paint or printing ink or formation materials for a color filter, electronic parts, layer insulation film, wire cover film, optical material, optical circuit, optical circuit parts, antireflection film, hologram or building material, there is such an effect that the product or film has high thermal resistance and high stability. Also, it is free from the generation of odors during exposure, which improves the operational circumstance.

A printed product, color filter, electronic parts, layer insulation film, wire cover film, optical material, optical circuit, optical circuit parts, antireflection film, hologram or building material according to the present invention has such a merit that each product has high thermal resistance and high stability as products and films and high productive yield is therefore obtained since at least a part thereof is formed of a cured product of the photosensitive resin composition having high thermal resistance and high stability.

What is claimed is:

1. A photoradical polymerization initiator comprising a compound (a) having only one naphthalimide structure-containing group represented by the following formula (2) in one molecule:

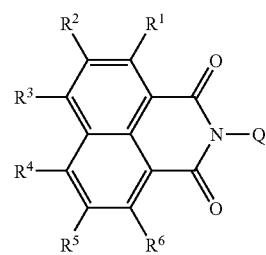

Formula (2)

wherein $R^1$, $R^2$, $R^3$, $R^4$, $R^5$ and $R^6$ respectively represent a hydrogen atom or a substituent and may be bonded to each other to form a cyclic structure; the chemical structure Q is a hydrocarbon group selected from a straight-chain and/or branched and/or cyclic saturated or unsaturated alkyl group, aryl group and allyl group; and the hydrocarbon group Q may contain an atom other than carbon or hydrogen provided that he hydrocarbon group is directly bonded to nitrogen (N) via a carbon atom, wherein any one or more of $R^1$, $R^2$, $R^3$, $R^4$, $R^5$ and $R^6$ are not azo groups, and wherein the hydrocarbon group Q contains no cationic groups.

2. A photoradical polymerization initiator according to claim 1, wherein $R^1$, $R^2$, $R^3$, $R^4$, $R^5$ and $R^6$ in the formula (1) respectively represent a hydrogen atom, a halogen atom, a hydroxyl group, a mercapto group, an amino group, a cyano group, a silyl group, a silanol group, an alkoxy group, a nitro group, a carboxyl group, an acetyl group, an acetoxy group, a sulfone group or an organic group which may have a substituent or may be bonded to each other to form a cyclic structure.

3. A photoradical polymerization initiator according to claim 1, wherein the molar extinction coefficient of the compound (a) at any of the emission wavelengths of an exposure light source is 0.1 or more.

4. A photoradical polymerization initiator according to claim 1, wherein the maximum molar extinction coefficient epsilon of the compound (a) is 2000 or more.

5. A photoradical polymerization initiator according to claim 1, wherein the compound (a) has an absorption for at least one of wavelengths 157 nm, 193 nm, 248 mm, 365 nm, 405 nm and 436 nm.

6. A photoradical polymerization initiator according to claim 1, wherein the compound (a) has a 90% heat decomposition temperature of 50° C. or more.

7. A photoradical polymerization initiator according to claim 1, wherein the solubility of the compound (a) at 20° C. in methylacrylate is 0.01 mol/L or more.

8. A photosensitive resin composition comprising a compound (a) having only one naphthalimide structure-containing group represented by the following formula (2) in one molecule and a compound (b) having an ethylenic unsaturated bond:

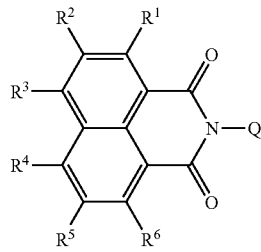

Formula (2)

wherein $R^1$, $R^2$, $R^3$, $R^4$, $R^5$ and $R^6$ respectively represent a hydrogen atom or a substituent and may be bonded to each other to form a cyclic structure; the chemical structure Q is a hydrocarbon group selected from a straight-chain and/or branched and/or cyclic saturated or unsaturated alkyl group, aryl group and allyl group; and the hydrocarbon group Q may contain an atom other than carbon or hydrogen provided that he hydrocarbon group is directly bonded to nitrogen (N) via a carbon atom, wherein any one or more of $R^1$, $R^2$, $R^3$, $R^4$, $R^5$ and $R^6$ are not azo groups, and wherein the hydrocarbon group Q contains no cationic groups.

9. A photosensitive resin composition according to claim 8, further comprising a hydrogen donor.

10. A photosensitive resin composition according to claim 8, wherein the compound (a) is contained in a proportion of 0.1% by weight or more based on the whole solid of the photosensitive resin composition.

11. A photosensitive resin composition according to claim 8, wherein components contained in the photosensitive resin composition and excluding the compound (a) have a transmittance of 20% or more in a wavelength range where the emission wavelength of an irradiation light source and the absorption wavelength of the compound (a) are overlapped on each other.

12. The method of using the photosensitive resin composition of claim 8 as a pattern formation material comprising the steps of:
coating said photosensitive resin composition; then
irradiating said coating; and
curing said coating.

13. The method of forming a product selected from the group consisting of a color filter, electronic parts, a layer insulation film, a wire cover film, an optical material, an optical circuit, optical circuit parts, an antireflection film and a hologram, the method comprising the steps of:
applying a coating of the photosensitive resin composition of claim 8 to a substrate,
irradiating the coating of the photosensitive resin composition; and
curing the coating.

* * * * *